United States Patent
Arai

(10) Patent No.: US 8,932,682 B2
(45) Date of Patent: *Jan. 13, 2015

(54) METHOD FOR MANUFACTURING A LIGHT EMITTING DEVICE

(75) Inventor: Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1103 days.

This patent is subject to a terminal disclaimer.

(21) Appl. No.: 11/545,344

(22) Filed: Oct. 10, 2006

(65) Prior Publication Data

US 2007/0087130 A1    Apr. 19, 2007

(30) Foreign Application Priority Data

Oct. 13, 2005    (JP) ................................. 2005-298879

(51) Int. Cl.
*B01J 19/08*    (2006.01)
*C23C 16/00*    (2006.01)
(Continued)

(52) U.S. Cl.
CPC ................. *C23C 14/12* (2013.01); *C23C 14/04* (2013.01); *C23C 14/243* (2013.01); *C23C 14/246* (2013.01); *H01L 51/56* (2013.01)
USPC ...... 427/457; 219/121.15; 392/419; 118/726; 118/727

(58) Field of Classification Search
CPC .... C23C 14/243; H01L 51/56; H01L 51/5012
USPC .......................... 118/724, 726, 727; 427/457; 219/121.15; 392/419
See application file for complete search history.

(56) References Cited

U.S. PATENT DOCUMENTS 5,945,163 A  *  8/1999  Powell et al. ............ 427/255.25
6,049,167 A      4/2000  Onitsuka et al.
(Continued)

FOREIGN PATENT DOCUMENTS

CN    1480984    *  3/2004
EP    0 859 539 A2    8/1998
(Continued)

OTHER PUBLICATIONS

Murakami, M. et al, "Scanning Evaporation System with Multi Evaporation Sources for Manufacturing Large Size Full-Color OLED Displays," SID 05 Digest: SID International Symposium Digest of Technical Papers, 2005, pp. 1890-1893.
(Continued)

*Primary Examiner* — Sylvia R MacArthur
(74) *Attorney, Agent, or Firm* — Husch Blackwell LLP

(57) ABSTRACT

It is an object of the present invention to provide a deposition device that can selectively form a thin film without using a shadow mask with respect to a substrate having a large size. In the deposition device, an evaporation source is provided with a cylinder cell, a heater for heating a lower part of the cylinder cell, and a heater for heating an upper part of the cylinder cell. A hot plate can control a temperature by a heater provided inside thereof. The hot plate heats an evaporation material supplied into the cylinder cell from a material supply portion that is connected to the cylinder cell, and vaporizes the evaporation material by evaporation or sublimation. A rotating mechanism for rotating the hot plate in the cylinder cell may be provided to achieve uniformity of a temperature. A heater for heating the material supply potion may be provided to raise a temperature of the evaporation material supplied into the cylinder cell. By such an evaporation source, deposition can be uniformly and continuously performed with respect to a substrate having a large size.

8 Claims, 37 Drawing Sheets

(51) Int. Cl.
*C23C 14/12* (2006.01)
*C23C 14/04* (2006.01)
*C23C 14/24* (2006.01)
*H01L 51/56* (2006.01)

(56) References Cited

U.S. PATENT DOCUMENTS

| | | | |
|---|---|---|---|
| 6,641,674 B2 * | 11/2003 | Peng | 118/727 |
| 6,696,096 B2 | 2/2004 | Tsubaki et al. | |
| 2001/0006827 A1 | 7/2001 | Yamazaki et al. | |
| 2002/0009538 A1 | 1/2002 | Arai | |
| 2003/0162314 A1 | 8/2003 | Yamazaki et al. | |
| 2003/0194484 A1 | 10/2003 | Yamazaki et al. | |
| 2003/0221620 A1 | 12/2003 | Yamazaki | |
| 2004/0031442 A1 | 2/2004 | Yamazaki et al. | |
| 2004/0035360 A1 | 2/2004 | Yamazaki et al. | |
| 2004/0040504 A1 | 3/2004 | Yamazaki et al. | |
| 2004/0123804 A1 | 7/2004 | Yamazaki et al. | |
| 2004/0139914 A1 | 7/2004 | Yamazaki et al. | |
| 2004/0216673 A1 | 11/2004 | Sakata et al. | |
| 2005/0005848 A1 | 1/2005 | Yamazaki et al. | |
| 2005/0022743 A1 | 2/2005 | Sakata et al. | |
| 2005/0034671 A1 | 2/2005 | Ohara | |
| 2005/0053720 A1 | 3/2005 | Yamazaki et al. | |
| 2005/0072361 A1 * | 4/2005 | Yang et al. | 118/726 |
| 2006/0011136 A1 | 1/2006 | Yamazaki et al. | |
| 2007/0054051 A1 * | 3/2007 | Arai et al. | 427/248.1 |
| 2010/0147220 A1 | 6/2010 | Sakata et al. | |

FOREIGN PATENT DOCUMENTS

| | | | |
|---|---|---|---|
| JP | 59-104472 | | 6/1984 |
| JP | 10-241858 | | 9/1998 |
| JP | 2002-75641 | | 3/2002 |
| JP | 2002-80961 | | 3/2002 |
| JP | 2003-109755 | | 4/2003 |
| JP | 2003-197531 | | 7/2003 |
| JP | 2003231963 | A * | 8/2003 |
| JP | 2003-321765 | | 11/2003 |
| JP | 2004-063454 | | 2/2004 |
| JP | 2004-176126 | | 6/2004 |
| JP | 2004-315898 | | 11/2004 |
| JP | 2005-105375 | | 4/2005 |
| JP | 4578872 | | 11/2010 |

OTHER PUBLICATIONS

Office Action re Korean application No. KR10-2006-0099774, dated Feb. 26, 2013 (with English translation).

* cited by examiner

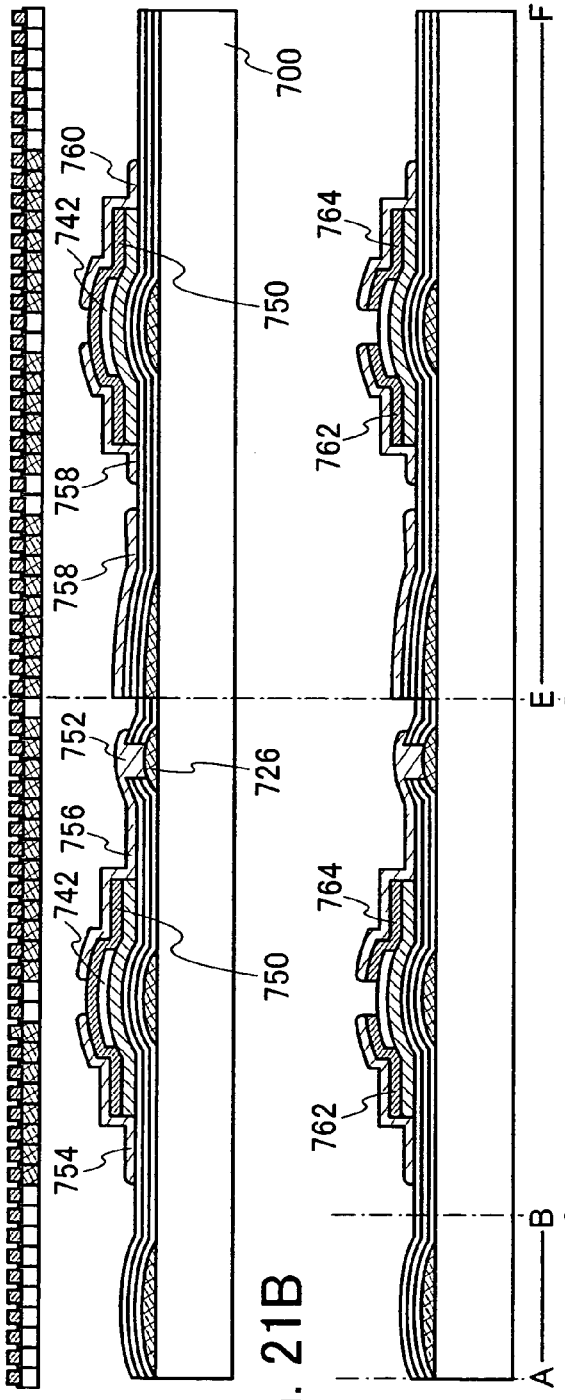
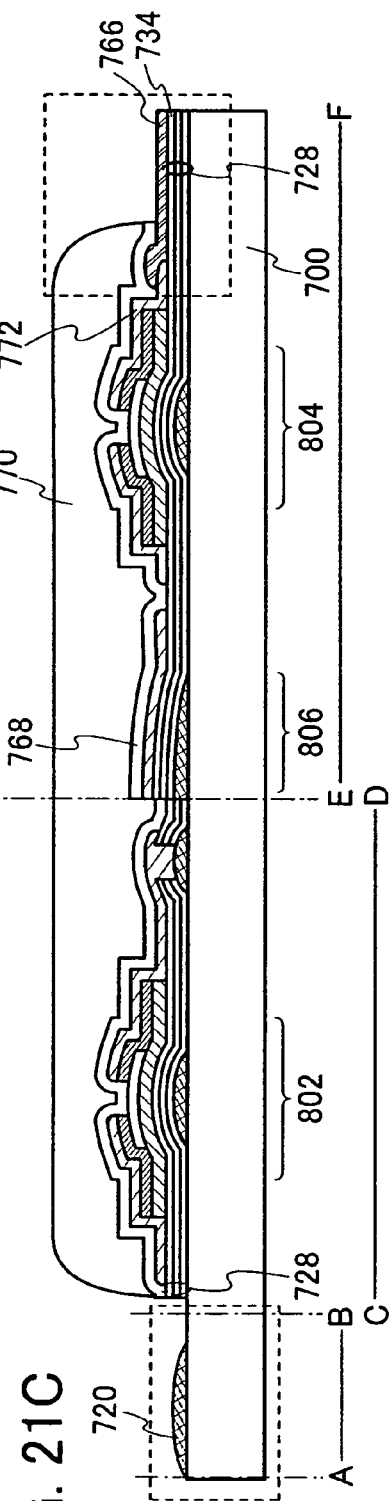
FIG. 21A
FIG. 21B
FIG. 21C

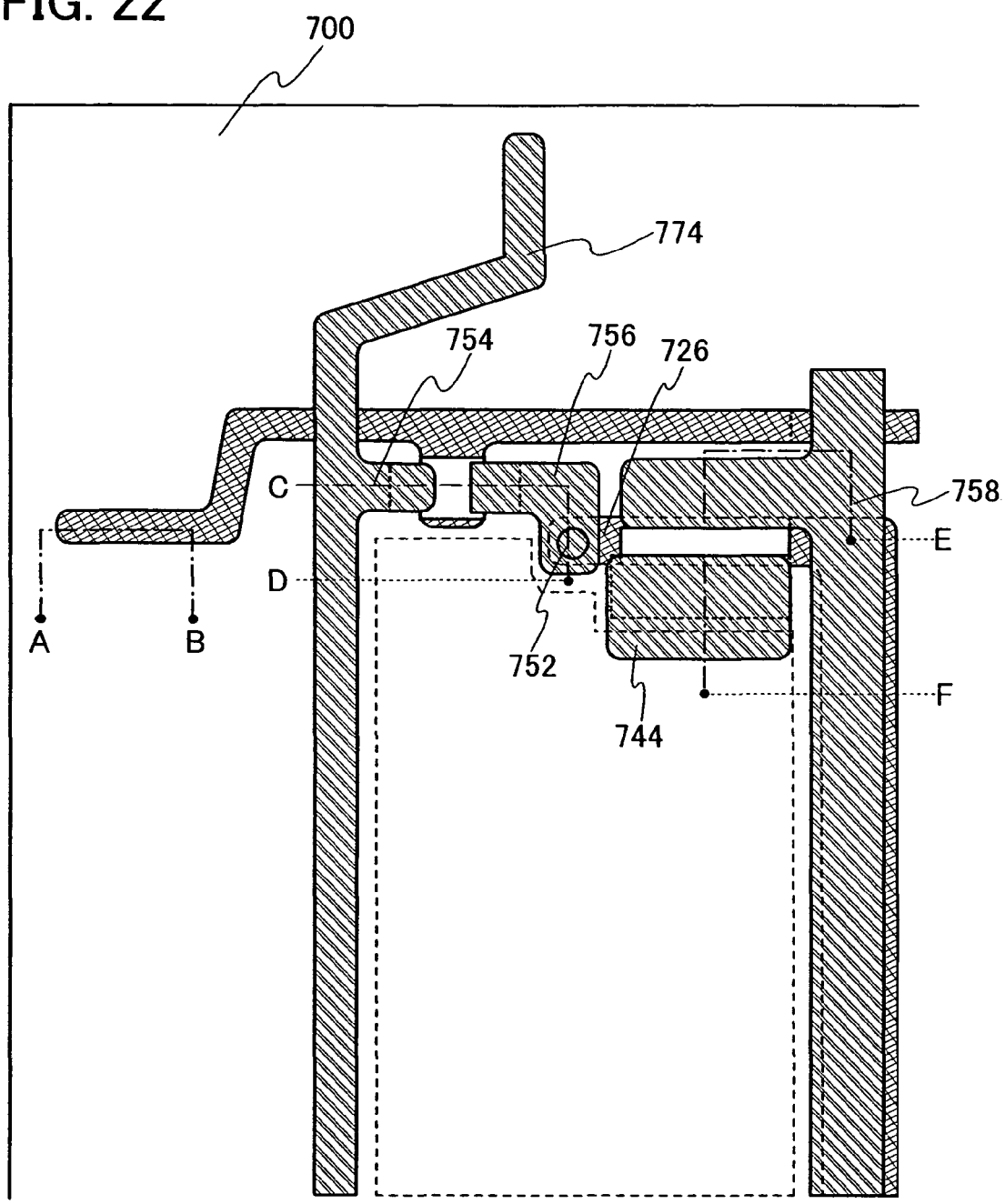

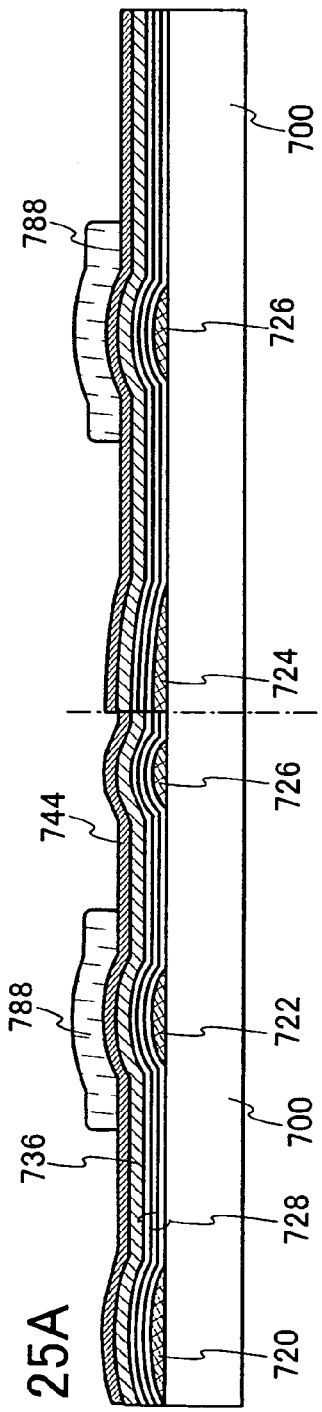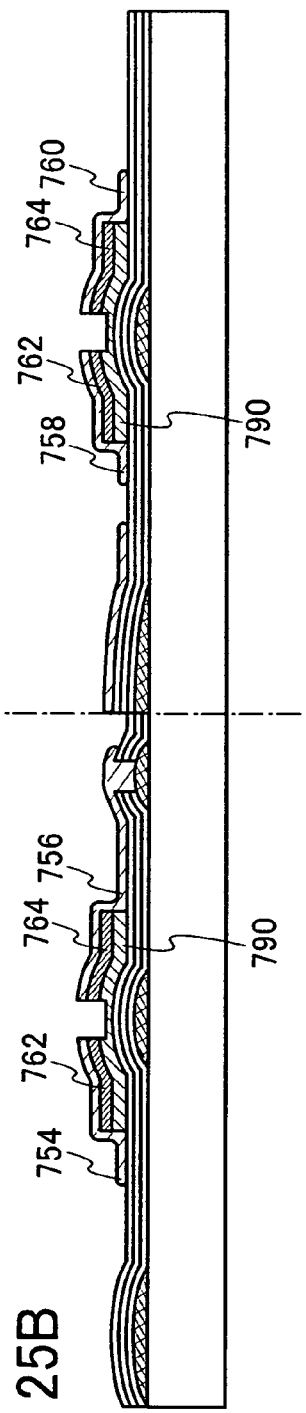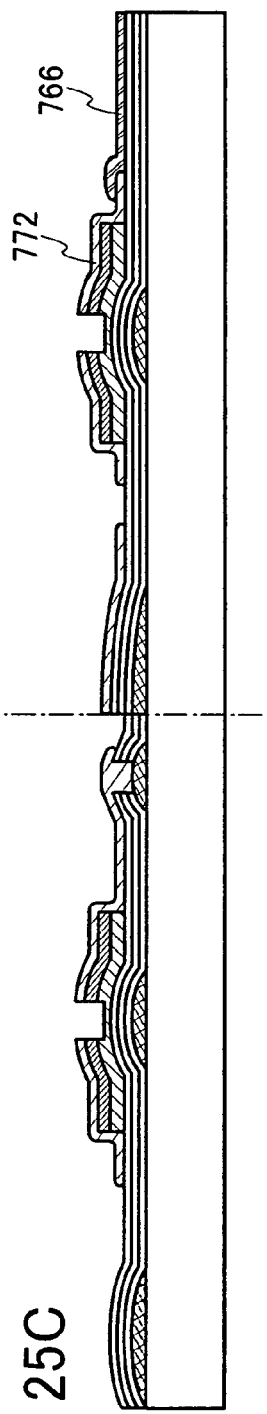

METHOD FOR MANUFACTURING A LIGHT EMITTING DEVICE

BACKGROUND OF THE INVENTION

1. Field of the Invention

The present invention relates to a deposition device for forming a film by evaporation. In particular, the present invention relates to a deposition device that can be used for manufacturing a display device utilizing electroluminescence.

2. Description of the Related Art

As a typical method for forming a thin film, an evaporation method is known. An evaporation method is known as a technique in which a material to be evaporated in vacuums is heated and vaporized, and then, the material is attached to a surface of the object as a thin film. An evaporation method is used in various fields as a technique for forming a thin film. For example, the evaporation method is applied to manufacture an electroluminescence element (hereinafter, also referred to as an "EL element") using an organic material. There are many structures of a device for evaporating a thin film. As a device used for manufacturing an organic EL element, there is a deposition device having a structure in which an organic EL stacked-layer structure can be continuously deposited while keeping a vacuum atmosphere in individual vacuum chambers (for example, refer to Patent Document 1: Japanese Published Patent Application No. H10-241858 (Pages. 6 and 7, FIG. 4)).

Other than the above, an evaporation device is disclosed, in which deposition is performed by placing a substrate and an evaporation mask over a substrate holding means, narrowing a distance between an evaporation source and the substrate to 30 cm or less, and moving the evaporation source in a X direction or a Y direction (for example, refer to Patent Document 2: Japanese Published Patent Application No. 2004-063454 (Pages. 5 to 7, FIG. 1)).

In these deposition devices, deposition of an EL layer in an EL element is performed by a resistance heating method. A resistance heating method is a method in which an evaporation source formed of a metal or ceramic is filled with an evaporation material, and is evaporated or sublimated by heating under a reduced pressure to form a film. Since the evaporation source can not instantaneously raise and lower a temperature. Therefore, evaporation can not be stopped easily once it is started, and attachment of the evaporation material to a substrate is needed to be controlled by opening and shutting a shutter.

SUMMARY OF THE INVENTION

A glass substrate that is used in manufacturing an electroluminescence display device has been promoted to have a large size. For example, it is predetermined that a glass substrate having a size of 1500 mm×1800 mm in the sixth generation, a glass substrate having a size of 1870 mm×2200 mm in the seventh generation, and a glass substrate having a size of 2160 mm×2400 mm in the eighth generation are introduced to a manufacturing line.

However, the amount of evaporation materials with which an evaporation source can be filled is limited in depositing an EL layer. Therefore, continuous treatment of a plurality of substrates having a large size becomes increasingly difficult. That is, the large amount of evaporation materials is needed to evaporate the EL layer continuously to a glass substrate having a large size; however, there is a problem that a crucible as an evaporation source has a limitation on a size and the evaporation source can not be filled with the sufficient amount of evaporation materials. Therefore, a problem occurs, in which evaporation operation is needed to be interrupted to refill the evaporation source with the evaporation material in each time. In evaporation, a predetermined time is needed to stabilize a temperature of the evaporation source, and a material that evaporates in the meantime becomes waste. Accordingly, a yield of the material is lowered, and degradation of throughput is caused.

In view of the foregoing problem, it is an object of the present invention to provide a deposition device that can form a thin film easily with respect to a substrate having a large size.

A deposition device according to the present invention is provided with a material supply portion for continuously or intermittently supplying an air current containing an evaporation material in powder form or an aerosolized raw material solution in which an evaporation material is dissolved or dispersed in a solvent, and a heating portion for heating the air current or the aerosolized raw material solution to be vaporized. In other words, an evaporation source in which an evaporation material in powder form or an aerosolized evaporation material is heated to be vaporized is provided in a treatment chamber for performing deposition.

The evaporation source is provided with a heating portion for heating an evaporation material. A material that is hardly reacted with the evaporation material is selected for the heating portion for heating an evaporation material, and a shape thereof can be formed arbitrarily. For example, the heating portion is preferably formed into a plate-like shape. An air current containing the evaporation material in powder form or an aerosolized raw material solution in which the evaporation material is dissolved or dispersed in a solvent is continuously or intermittently supplied to the heating portion for heating an evaporation method, for example, a hot plate, and the air current or the aerosolized raw material is vaporized.

A cylinder cell contains a heating portion for heating an evaporation material, for example, a hot plate. In the cylinder cell, a means for heating the cylinder cell itself may be provided so as not to dispose the evaporation material in an inner wall. As the heating means, various methods can be applied, for example, a method for generating heat by a current flowing into the cylinder cell, a method for heating by radiation heat, a method for heating by resistance heating, a method for heating by induced exothermic reaction, or the like.

A hot plate for heating an evaporation material to be vaporized is provided inside the cylinder cell, whereby the vaporized evaporation material can be prevented from diffusing on the periphery. The cylinder cell is heated and a temperature of a surface of the inner wall is kept at a temperature at which the evaporation material is not attached (a high temperature), whereby waste of the evaporation material can be eliminated, and a yield can be improved.

This hot plate may be provided in the cylinder cell, and an injecting hole of the vaporized evaporation material can be narrowed down to have a slim shape. By making such a structure, a molecule of the vaporized evaporation material can be diffused with directionality. Thus, a film can be selectively formed in a narrow region over a substrate.

The evaporation source is held in a moving means that is capable of scanning one surface of a substrate over which a film is deposited. One or a plurality of the evaporation sources is held in a moving means. The evaporation source and a material supply means may be formed in an integrated manner. Alternatively, the material supply means may be fixed to the evaporation source that is set to be capable of moving. In a case of the latter, the evaporation source and the material supply means are connected to each other with a material supply tube having an internal diameter through which an evaporation material in a predetermined state can pass.

By separating the material supply portion and the material supply source from each other and connecting with the material supply tube, lightweight of the evaporation source that is held to be capable of scanning can be achieved. Accordingly, a burden of the moving means that scans the evaporation source is reduced, and lightweight and downsizing of a mechanical component can be achieved. Further, capacity of the material supply source for storing the evaporation material can be enlarged. Thus, a frequency for filling the evaporation source with the evaporation material can be reduced.

A deposition device according to the present invention includes an evaporation source for depositing an evaporation material over a substrate, a moving means for moving the evaporation source to scan along a main surface of the substrate, and a material supply portion for intermittently supplying an evaporation material to the evaporation source.

A deposition device according to the present invention includes a material supply portion for aerosolizing a raw material solution in which an evaporation material is dissolved or dispersed in a solvent and intermittently discharging the solvent in the aerosol, an evaporation source for evaporating or sublimating the solvent, which is connected to the material supply portion, and a moving means for moving the evaporation source to scan along a main surface of a substrate.

A deposition device according to the present invention includes a material supply portion for intermittently discharging an evaporation material in powder form with a carrier gas, an evaporation source for evaporating or sublimating the evaporation material, which is connected to the material supply portion, and a moving means for moving the evaporation source to scan along a main surface of a substrate.

In the present invention, the term "a material supply portion intermittently supplies an evaporation material to the evaporation source" means that the supply of the evaporation material is arbitrarily stopped and restarted according to the design of the thin film pattern. In other words, the material supply portion selectively supplies the evaporation material to the evaporation source. For example, the evaporation material is selectively discharged from the material supply portion to a hot plate included in the evaporation source. Among this selective discharging, the not plate may not be cooled down and re-heated up, and may be remained at a constant temperature. According to this, the stopping and the restarting of the depositing becomes quick.

In accordance with the present invention, even in a case of using a display panel having a large screen, deposition can be performed uniformly and continuously. Further, an evaporation material is not needed to be supplied to an evaporation source every time the evaporation material runs out; therefore, throughput can be improved.

By intermittently supplying a material for deposition to a hot plate, a film can be selectively formed over a surface to be deposited. By intermittently evaporating or sublimating an evaporation material from an evaporation source, a shadow mask can be omitted, which is needed in film formation by evaporation.

BRIEF DESCRIPTION OF DRAWINGS

FIG. 1 shows a view for explaining a structure of a deposition device according to Embodiment Mode 1;

FIG. 2 shows a view for explaining an internal structure of a deposition device according to Embodiment Mode 1;

FIG. 3 shows a view for explaining an internal structure of a deposition device according to Embodiment Mode 2;

FIG. 4 shows a view for showing an example of an evaporation source and a material supply portion provided in a deposition treatment chamber of a deposition device according to Embodiment Mode 4;

FIG. 5 shows a view for showing an example of an evaporation source and a material supply portion provided in a deposition treatment chamber of a deposition device according to Embodiment Mode 4;

FIG. 6 shows a view for showing an example of an evaporation source and a material supply portion provided in a deposition treatment chamber of a deposition device according to Embodiment Mode 4;

FIG. 7 shows a view for showing an example of an evaporation source and a material supply portion provided in a deposition treatment chamber of a deposition device according to Embodiment Mode 5;

FIG. 8 shows a view for showing an example of an evaporation source and a material supply portion provided in a deposition treatment chamber of a deposition device according to Embodiment Mode 6;

FIG. 9 shows a view for explaining an internal structure of a deposition device according to Embodiment Mode 3;

FIG. 10 shows a view for explaining a structure of an EL element according to Embodiment Mode 7;

FIG. 11 shows a view for explaining a structure of a light emitting device according to Embodiment Mode 8;

FIGS. 12A and 12B show diagrams for explaining a structure of a light emitting device according to Embodiment Mode 8;

FIG. 13 shows a diagram for explaining a structure of a light emitting device according to Embodiment Mode 8;

FIGS. 14A and 14B show views for explaining a structure of a light emitting device according to Embodiment Mode 9;

FIG. 15 shows a view for explaining a structure of a light emitting device according to Embodiment Mode 10;

FIG. 16 shows a view for explaining a structure of a light emitting device according to Embodiment Mode 10;

FIGS. 17A and 17B show cross-sectional views for explaining a manufacturing step of a light emitting device according to Embodiment Mode 10;

FIG. 18 shows a top view for explaining a manufacturing step of a light emitting device according to Embodiment Mode 10 (corresponding to FIG. 17A);

FIGS. 19A to 19C show cross-sectional views for explaining a manufacturing step of a light emitting device according to Embodiment Mode 10;

FIG. 20 shows a top view for explaining a manufacturing step of a light emitting device according to Embodiment Mode 10 (corresponding to FIG. 19B);

FIGS. 21A to 21C show cross-sectional views for explaining a manufacturing step of a light emitting device according to Embodiment Mode 10;

FIG. 22 shows a top view for explaining a manufacturing step of a light emitting device according to Embodiment Mode 10 (corresponding to FIG. 21A);

FIG. 23 shows a top view for explaining a manufacturing step of a light emitting device according to Embodiment Mode 10 (corresponding to FIG. 21C);

FIG. 24 shows a cross-sectional view for explaining a manufacturing step of a light emitting device according to Embodiment Mode 10;

FIGS. 25A to 25C show cross-sectional views for explaining a manufacturing step of a light emitting device according to Embodiment Mode 11;

FIG. 26 shows a cross-sectional view for explaining a manufacturing step of a light emitting device according to Embodiment Mode 11;

DETAILED DESCRIPTION OF THE INVENTION

Figure 1:
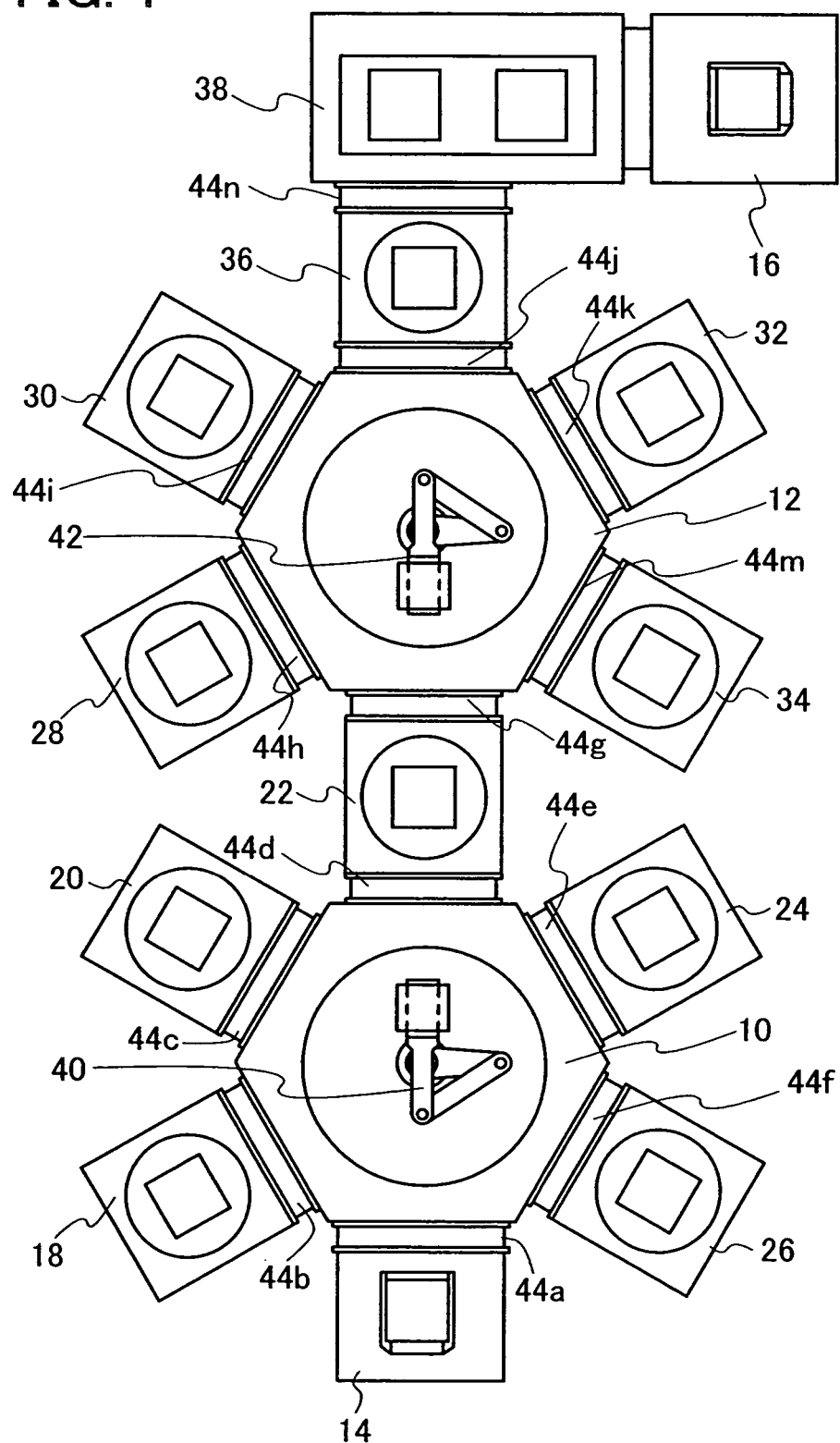

Embodiment Modes of the present invention will be described in detailed with reference to drawings. However, the present invention is not limited to the explanation below and it is to be easily understood that various changes and modifications will be apparent to those skilled in the art, unless such changes and modifications depart from the content and the scope of the invention. Therefore, the present invention is not construed as being limited to the description of the following Embodiment Modes. It is to be noted that the same portion or a portion having the same function is denoted by the same reference numeral in all the drawings, and the repetitive explanation thereof is omitted.

Embodiment Mode 1

In this embodiment mode, a structure of a deposition device having a deposition treatment chamber that includes an evaporation source provided with a means for supplying a material for evaporation to a heating portion, will be explained with reference to FIG. 1 and FIG. 2.

FIG. 1 shows a structure of a deposition device for forming an EL layer over a substrate. The EL layer is a main part of an EL element utilizing EL. A diode-type EL element has a structure in which an EL layer is interposed between a pair of electrodes. In this element, the EL layer is formed of one layer or a plurality of layers each having a different function. In this case, the EL layer can be formed by combining layers each having a different function, which are also referred to as a hole injecting and transporting layer, a light emitting layer, an electron injecting and transporting layer, and the like. It is to be noted that the EL layer indicates a layer containing a material that develops electroluminescence (electroluminescence indicates a phenomenon in which light is emitted by applying an electric field to a fluorescence substance or a phosphorescence substance) at least in one part.

In a deposition device shown in FIG. 1, a plurality of deposition treatment chambers is connected around a transfer chamber 10 and a transfer chamber 12. The transfer chamber 10 and the transfer chamber 12 are provided for moving a substrate that is carried in the deposition device to each deposition chamber. The deposition treatment chambers are connected to the transfer chamber 10 and the transfer chamber 12, whereby treatment can be continuously performed without exposing the substrate to an atmospheric air. A load chamber 14 is connected to the transfer chamber 10, and the substrate is carried from the load chamber 14 into the deposition device. In addition, deposition treatment chambers 20, 22, and 24 are connected to the transfer chamber 10. Further, a heat treatment chamber 18 and a plasma treatment chamber 26 are connected to the transfer chamber 10; however, these treatment chambers may be appropriately provided. Deposition treatment chambers 28, 30, and 32 and a deposition treatment chamber 34 for forming a conductive film as one of electrodes of an EL element are connected to the transfer chamber 12. Gate valves 44a to 44k, 44m, and 44n are provided between the transfer chamber 10 and each deposition treatment chamber and between the transfer chamber 12 and each deposition treatment chamber. A pressure of each treatment chamber can be independently controlled by these gate valves, and mutual contamination between treatment chambers is prevented.

It is to be noted that an exhausting means for keeping a chamber under a reduced pressure is provided in each treatment chamber. As the exhausting means, various vacuum pumps such as a dry pump, a turbo molecular pump, and a diffusion pump can be used.

The substrate introduced to the transfer chamber 10 from the load chamber 14 is carried to the predetermined treatment chamber by an arm-type transfer means 40 capable of rotating. The substrate is transferred from one treatment chamber to another treatment chamber by the transfer means 40. The transfer chamber 10 and the transfer chamber 12 are connected with the deposition treatment chamber 22, and the substrate is transferred and received in this connected portion by the transfer means 40 and a transfer means 42.

Each treatment chamber connected to the transfer chamber 10 and the transfer chamber 12 is blocked from an atmospheric air. An inside thereof is kept under a reduced pressure condition with an inert gas such as helium, argon, or nitrogen, or a vacuum evacuation pump. In this deposition device, deposition treatment of an EL layer can be continuously performed without exposing the substrate to an atmospheric air. After deposition treatment of an EL layer, the substrate may be deteriorated due to moisture vapor. Therefore, in this deposition device, a sealing treatment chamber 38 in which the EL layer is subjected to sealing treatment before exposing the substrate after deposition to an atmospheric air, is connected to the transfer chamber 12. The sealing treatment chamber 38 is under an atmospheric pressure or under a pressure close to the atmospheric pressure. An intermediate chamber 36 is provided between the transfer chamber 12 and the sealing treatment chamber 38. The intermediate chamber 36 is provided for transferring and receiving the substrate and reducing a pressure between chambers. The substrate after sealing treatment is taken out from an unload chamber 16 that is connected to the sealing treatment chamber 38.

In the deposition device of FIG. 1, the number of treatment chambers connected to the transfer chamber 10 and the transfer chamber 12 and a structure thereof can be appropriately combined depending on a stacked-layer structure of an EL element. Hereinafter, an example of combining treatment chambers is shown.

In the heat treatment chamber 18, the substrate over which a lower electrode, an insulating partition, and the like are formed is heated first to perform degassing treatment. In the plasma treatment chamber 26, a surface of a base electrode is subjected to rare gas or oxygen plasma treatment. This plasma treatment is performed in order to clean the surface and stabilize a surface state (physical or chemical stabilization of the surface).

The deposition treatment chamber 20 can be made as a treatment chamber for forming an electrode buffer layer in contact with one of electrodes of the EL element. The electrode buffer layer is a layer that has a carrier injecting property (a hole injecting property or an electron injecting property) and suppresses generation of a short-circuit or a dark spot defect of the EL element. Typically, the electrode buffer layer is made of an organic and inorganic mixture material of which resistivity is $5 \times 10^4$ to $1 \times 10^6$ Ωcm. This buffer layer can be formed by co-evaporation using a plurality of evaporation sources. Further, the deposition treatment chamber 24 is a treatment chamber for depositing a hole transporting layer.

A structure of a light emitting layer in the EL element differs in a case of emitting light with a single color and in a case of emitting light with a white color. Therefore, it is preferable to arrange a deposition treatment chamber in a deposition device in consideration of the emission color. For example, in a case of forming three kinds of EL elements each of which emits light with a different color in a display panel, light emitting layers corresponding to each light emission color is needed to be deposited. In this case, the deposition treatment chamber 22 can be used for deposition of a first light emitting layer, the deposition treatment chamber 28 can be used for deposition of a second light emitting layer, and the deposition treatment chamber 30 can be used for deposition of a third light emitting layer. By separately providing a deposition treatment chamber for each light emitting layer, mutual contamination due to different light emitting materials can be prevented and throughput of deposition treatment can be improved.

Alternatively, three kinds of EL materials each of which emits light with a different color may be sequentially evaporated in the deposition treatment chamber 22, the deposition treatment chamber 28, and the deposition treatment chamber 30. For example, light emitting layers with light emission colors corresponding to red (R), green (G), and blue (B) are formed in each pixel. In this case, a shadow mask is used to perform evaporation by shifting the mask depending on a region to be evaporated.

An EL element emitting light with a white color is formed by stacking light emitting layers emitting light with different colors. In such a case, an element substrate is sequentially moved in each deposition treatment chamber, and then, deposition cam be performed for each light emitting layer. Further, different light emitting layers can be continuously deposited in the same deposition treatment chamber.

An electrode is formed over an EL layer in the deposition treatment chamber 34. Although an electron beam evaporation method and a sputtering method can be applied to form the electrode, a resistance heat evaporation method is preferably used.

The element substrate where treatment up to formation of the electrode is completed is carried to the sealing treatment chamber 38 through the intermediate chamber 36. The sealing treatment chamber 38 is filled with an inert gas such as helium, argon, neon, or nitrogen against an EL material, an alkali metal, and the like. A sealing substrate is attached to a side where the EL layer of the element substrate is formed under the inert gas atmosphere. In a condition of sealing the EL element with the sealing substrate, a space between the element substrate and the sealing substrate may be filled with an inert gas or a resin material. By being filled with an inert gas or a resin material, the EL element can be prevented from being exposed to an atmospheric air or a corrosive gas to be deteriorated. The sealing treatment chamber 38 is provided with a dispenser for drawing a sealing material, a mechanical component such as an arm or a fastening stage for fastening a sealing substrate to face an element substrate, a dispenser for filling the space with a resin material or a spin coater, and the like.

Figure 2:
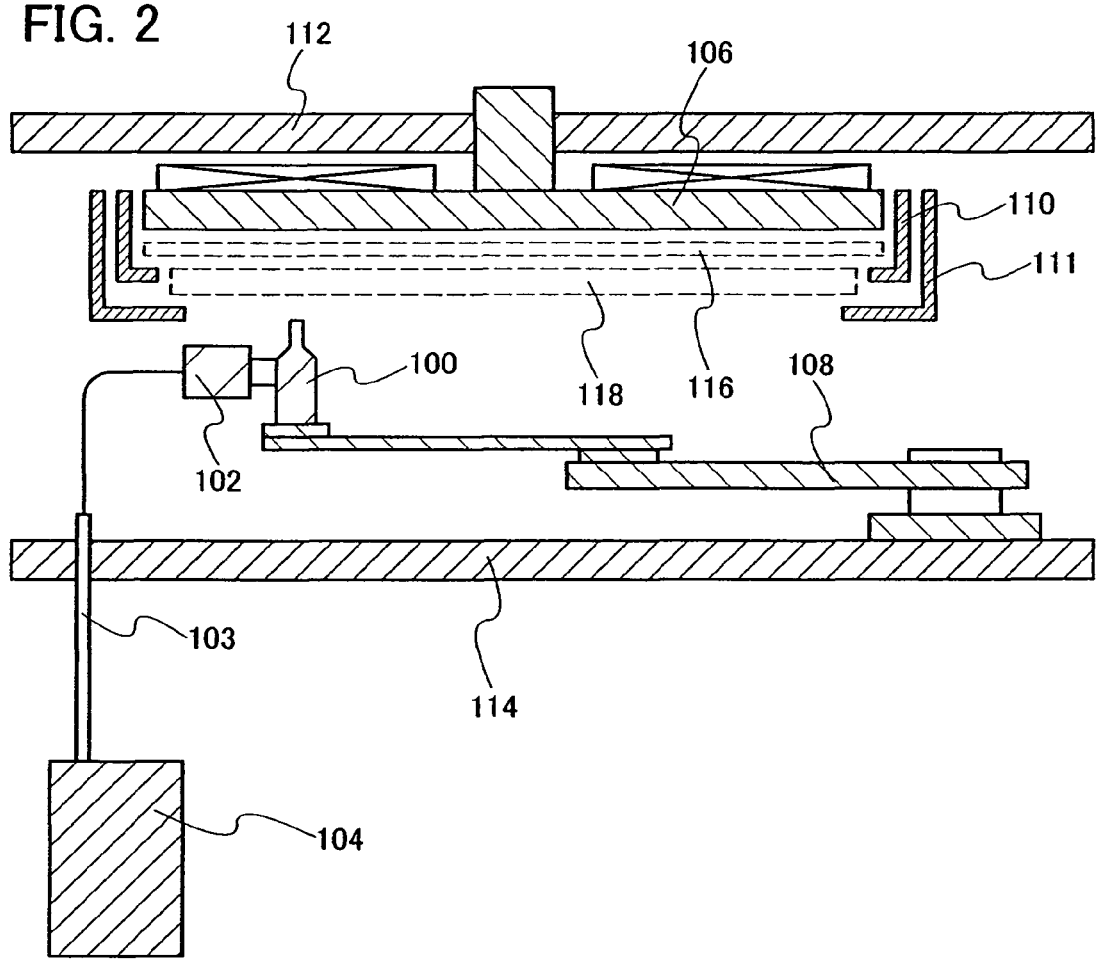

FIG. 2 shows an example of an internal structure of a deposition treatment chamber. The deposition treatment chamber is kept under a reduced pressure, and in FIG. 2, an interior side interposed between a top plate 112 and a bottom plate 114 is an inside of the deposition treatment chamber.

In the deposition treatment chamber, an evaporation source 100 is provided. In a case where a plurality of layers each having a different composition is deposited, or a case where different materials are co-evaporated, a plurality of evaporation sources can be provided. The evaporation source 100 is provided with a heating means for evaporating or sublimating a material to be deposited to be vaporized. The evaporation source 100 is formed using a material such as ceramic or metal, which is not easily reacted with an evaporation material. Preferably, the evaporation source 100 is formed using a ceramic material such as aluminum nitride or boron nitride. The ceramic material is not easily reacted with an evaporation material containing an organic material and discharges the small amount of gas as an impurity; therefore, an EL layer having high purity can be formed.

A material supply portion 102 for supplying an evaporation material is attached to the evaporation source 100. The material supply portion 102 is connected with a pipe arrangement so that a material to be deposited is supplied from a material supply source 104. The material supply source 104 can be arranged inside or outside the deposition treatment chamber and stores the large amount of evaporation materials that can not be finished to be stored in the evaporation source 100. In other words, the evaporation material can be continuously supplied to the evaporation source 100 by providing the material supply source 104.

As a method for supplying the evaporation material to the evaporation source 100, an air current transfer method in which an evaporation material in powder form is transferred together with a carrier gas; an aerosols method in which a raw material solution in which an evaporation material is dissolved or dispersed in a solvent is transferred to be aerosolized by an atomizer, and the solvent in aerosols is vaporized; a method in which an evaporation material is contained in a fluid to be supplied; or the like can be applied.

In a case of applying an air current transfer method or an aerosol method, a carrier gas is supplied to an inside of a treatment chamber together with an evaporation material. In each treatment chamber, an exhaust fan or a vacuum evacuation pomp is connected, whereby each treatment chamber is kept under an atmospheric pressure or a pressure less than the atmospheric pressure, preferably, a pressure of 133 to 13300 Pa. A pressure can be adjusted while the deposition treatment chamber is filled with an inert gas such as helium, argon, neon, krypton, xenon, or nitrogen; or the gas is supplied (and concurrently exhausted). In addition, a deposition chamber for forming an oxide film may be under an oxidative atmosphere by introducing a gas such as oxygen or nitrous oxide. Further, a deposition treatment chamber for evaporating an organic material may be under a reduction atmosphere by introducing a gas such as hydrogen. By making a reduction atmosphere, an organic material and an inorganic material that are easily oxidized are prevented from being oxidized to change in quality.

The evaporation source 100 is provided so as to be capable of scanning freely along a surface of a substrate 116 that is set in the treatment chamber by a multijoint arm 108. The substrate 116 is fixed to a substrate stage 106 with a substrate chuck 110. A heater may be incorporated in the substrate stage 106 to heat the substrate 116. The evaporation source 100 is made to be close to the substrate 116 and scan by the multijoint arm 108, whereby a film can be formed over an entire surface of the substrate having a large size. In other words, a film can be formed over an entire surface of the substrate having a large size without separating the evaporation source from the substrate. Accordingly, downsizing of the deposition device can be achieved.

In a case where a shadow mask 118 is applied to the substrate 116, a mask chuck 111 is used. The shadow mask 118 in which openings are formed depending on a pattern for forming a film is used in a case where an evaporation film is needed to be selectively formed over the substrate. In a case where alignment of the shadow mask 118 is needed, a camera is set in the treatment chamber and a positioning means capable of micromotion in an X-Y-θ direction is provided in the mask chuck 111, whereby alignment can be performed.

When the evaporation source 100 is made to scan by the multijointed arm 108, a film can be selectively formed over the substrate 116 by intermittently supplying an evaporation material that is supplied from the material supply portion 102 attached to the evaporation source 100. In order to intermittently supply the evaporation material from the material supply portion 102, on-off control may be performed using a valve. In accordance with this structure, a shutter that is needed between the evaporation source 100 and the substrate 116 can be omitted.

A distance between the evaporation source 100 and the substrate 116 can be adjusted by changing a height of an axial direction of the multijoint arm 108 and/or the substrate stage 106. A material supply tube 103 that connects the material supply portion 102 attached to the evaporation source 100 and the material supply source 104 can be bent flexibly. The material supply tube 103 is formed of a stiff and narrow tube so as not to change its shape even under a reduced pressure. FIG. 2 shows a mode in which the material supply source 104 is arranged outside the deposition treatment chamber. However, instead of such an arrangement, the material supply source 104 may be arranged inside the deposition treatment chamber. Further, the material supply tube 103 can be omitted to be integrated with the material supply portion 102.

In accordance with the deposition device of this embodiment mode, deposition can be uniformly and continuously performed even in a case of using a display panel having a large screen. Further, the evaporation material is not needed to be supplied to the evaporation source every time the evaporation material runs out; therefore, throughput can be improved. Furthermore, the material for deposition is intermittently supplied from the evaporation source 100, whereby a film can be selectively formed over a film formation surface. Accordingly, a shadow mask and a shutter that are needed in deposition by evaporation can be omitted.

Embodiment Mode 2

In this embodiment mode, a structure of a deposition treatment chamber in which an evaporation source is fixed and a substrate is moved to perform evaporation will be explained with reference to FIG. 3.

Figure 3:
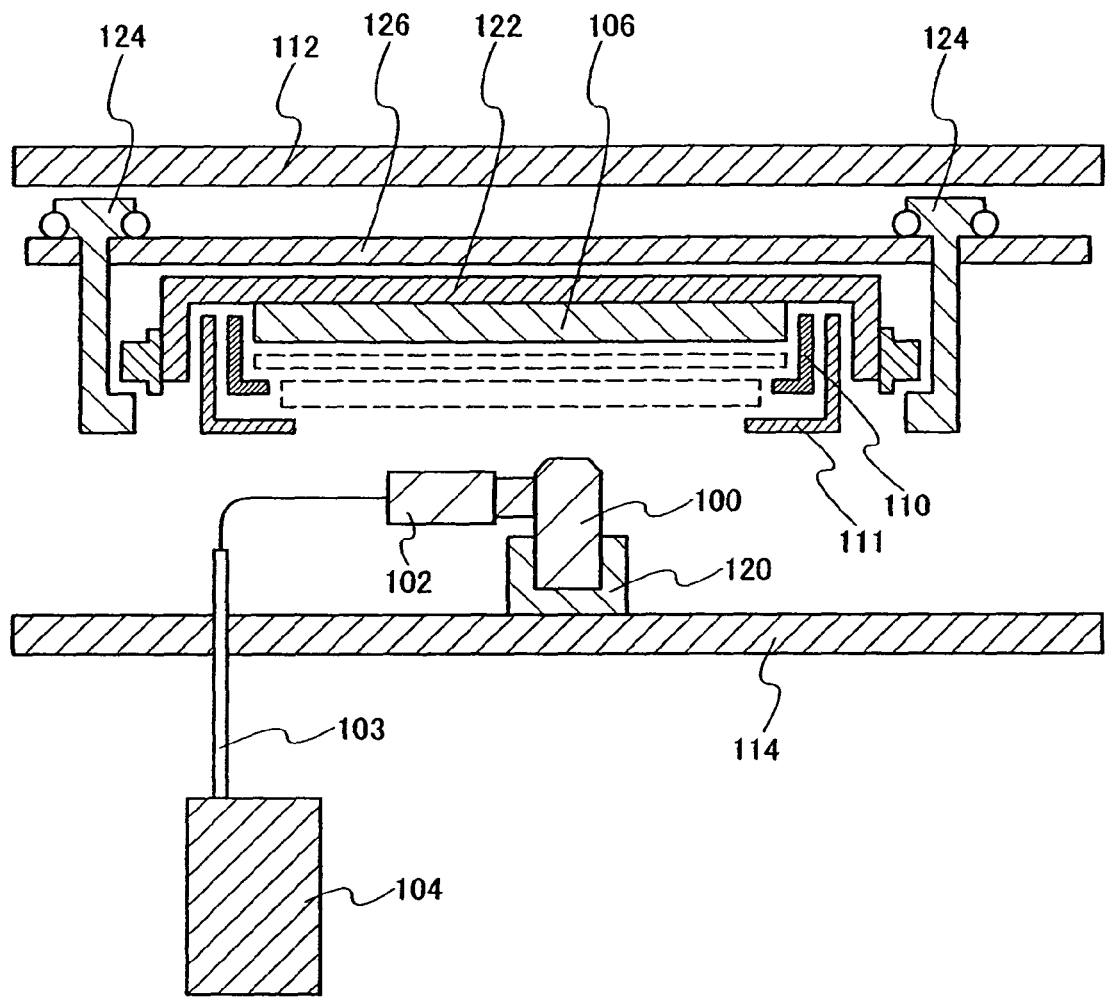

FIG. 3 shows an internal structure of a deposition treatment chamber. The deposition treatment chamber is kept under a reduced pressure. In the deposition treatment chamber, an evaporation source, a jig for fixing a substrate, and the like are arranged to be interposed between a top plate 112 and a bottom plate 114.

An evaporation source 100, a material supply portion 102, a material supply tube 103, and a material supply source 104, which are provided in the deposition treatment chamber, have the same structure as that of Embodiment Mode 1. In a case of depositing a plurality of layers each having a different composition or in a case of co-evaporating different materials, a plurality of the evaporation sources can be provided. The evaporation source 100 is mounted on an evaporation source holder 120 provided on a bottom plate 114 side. In a case where a position of the evaporation source 100 is fixed, a movement mechanism that moves the evaporation source holder 120 up and down may be provided so that a distance between the evaporation source 100 and a substrate 116 can be adjusted. By adjusting the distance between the evaporation source 100 and the substrate 116, a deposition rate and film thickness distribution can be adjusted.

The substrate 116 over which a film is deposited can be fixed to a substrate stage 106 with a substrate chuck 110. In this case, a heater may be incorporated in the substrate stage 106 to heat the substrate 116. By adjusting a substrate temperature in deposition, quality of a film can be controlled.

A movement mechanism 122 including a pulley or a gear is provided at an edge of the substrate stage 106, which is arranged to be movable over a first guide rail 124. A movement mechanism such as a pulley or a gear is provided in an upper portion of the first guide rail 124, which is arranged to be movable over a second guide rail 126. In such a manner, by making the substrate movable, a film can be formed over an entire surface of a substrate having a large size. In other words, a film can be formed over the entire surface of the substrate having a large size without separating the evaporation source from the substrate. In a case of using a shadow mask 118 in depositing a film, the shadow mask 118 may be fixed to the substrate stage 106 together with the substrate 116 with the use of a mask chuck 111.

In accordance with the deposition device of this embodiment mode, a film can be uniformly and continuously deposited even in a case of using a display panel having a large screen. In this case, when an external dimension of the substrate becomes larger, a distance for which the substrate is moved becomes longer, and accordingly, the deposition treatment chamber is needed to become larger. In such a case, a plurality of fixed evaporation sources is provided in the deposition treatment chamber to be arbitrarily arranged in a central part and a peripheral part, whereby a moving distance of the substrate, which is needed for evaporating an entire surface of the substrate, can be shortened. Further, the evaporation material is not needed to be supplied to the evaporation source every time the evaporation material runs out; therefore, throughput can be improved. Furthermore, by intermittently supplying the material for deposition from the evaporation source 100, a film can be selectively formed over a surface to be deposited. Accordingly, a shadow mask and a shutter that are needed in deposition by evaporation can be omitted.

Embodiment Mode 3

In this embodiment mode, a structure of a deposition treatment chamber in which both an evaporation source and a substrate are moved to perform evaporation will be explained with reference to FIG. 9.

Figure 9:
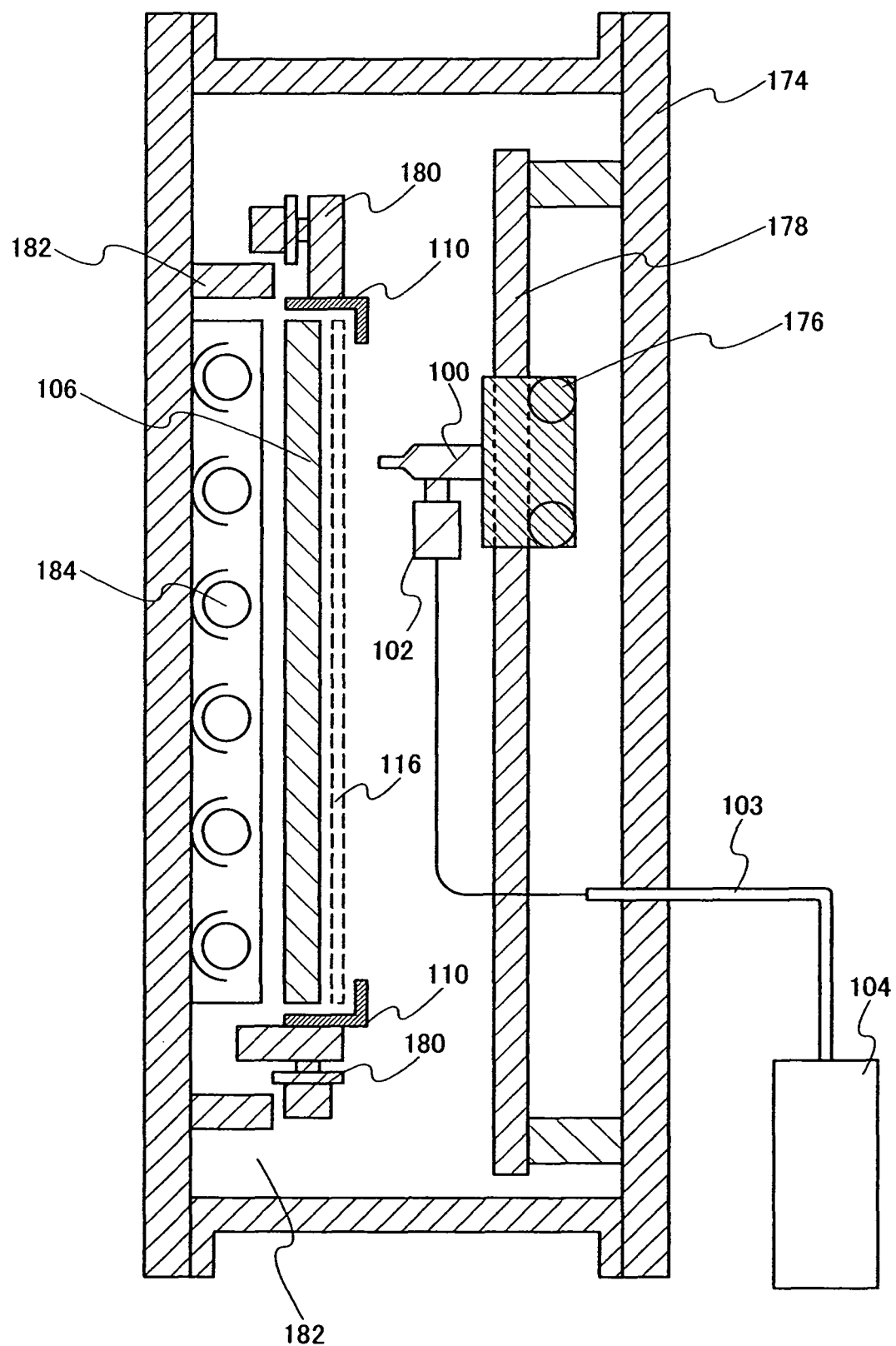

In an internal structure of a treatment chamber shown in FIG. 9, an evaporation source 100 provided in a deposition treatment chamber 174 has the same structure as that of Embodiment Mode 1. One or a plurality of the evaporation sources 100 can be provided. The evaporation source 100 is provided over a movement mechanism 176 including a pulley or a gear so as to be capable of moving up and down by a second guide rail 178. Transfer speed of a substrate transferring mechanism 180 that moves over a first guide rail 182 and moving speed of the evaporation source 100 that moves up and down by the second guide rail 178 are appropriately adjusted, whereby a deposition rate and film thickness distribution can be adjusted.

In addition, a heater 184 may be provided over a surface where a substrate 116 is transferred, which is an inner wall of the deposition treatment chamber 174. As the heater 184, a lamp heater, a sheathed heater, or the like can be used. By providing the heater 184, the substrate 116 can be heated, and accordingly, a substrate temperature in deposition can be controlled.

The evaporation source 100 is connected to a material supply portion 102 for continuously supplying an evaporation material to the evaporation source. The material supply portion has a material supply source 104 that is arranged to be separated from the material supply portion 102 and a material supply tube 103 that connects the material supply portion 102 and the material supply source 104. Details thereof are the same as those of Embodiment Mode 2.

In accordance with the deposition device of this embodiment mode, by moving the substrate and the evaporation source mutually, deposition can uniformly and continuously performed even in a case of using a display panel having a large screen. In this case, even in a case of a substrate having a large size in which one side is more than one meter, the substrate can be stably held by being held in a perpendicular state or a state in which the substrate is inclined at approximately 1 to 30 degree from the perpendicular state, and accordingly, transferring trouble can be suppressed. Further, the evaporation material is not needed to be supplied to the evaporation source every time the evaporation material runs out; therefore, throughput can be improved.

Embodiment Mode 4

Figure 4:
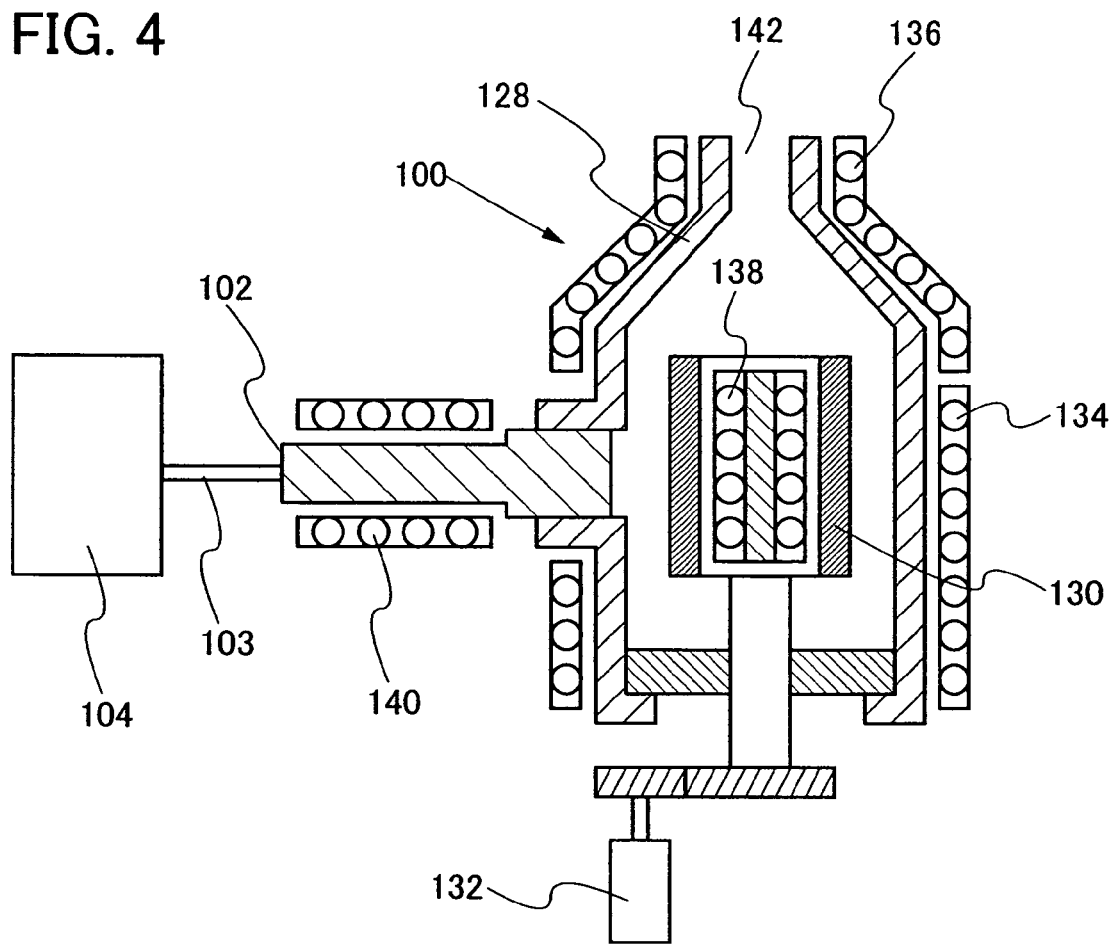

In this embodiment mode, an example of an evaporation source and a material supply portion provided in a deposition treatment chamber of a deposition device will be explained with reference to FIG. 4, FIG. 5, and FIG. 6. FIG. 4 shows a state in which an evaporation source 100, a material supply portion 102, a material supply tube 103, and a material supply source 104 are combined.

The evaporation source 100 is provided with a cylinder cell 128 and a heater for heating the cylinder 128. As the heater, a method thereof such as resistance heating, high-frequency heating, or radiation heating is not limited, and any method may be employed as long as the cylinder cell 128 can be heated. FIG. 4 shows an example in which a heater for heating the cylinder cell 128 is divided into a plurality. In other words, a heater 134 for heating a lower part of the cylinder cell 128 and a heater 136 for heating an upper part thereof are provided. By dividing the heater into a plurality as described above, temperature distribution of the cylinder cell 128 can be controlled.

A hot plate 130 is provided inside the cylinder cell 128. The hot plate 130 can control a temperature by a heater 138 provided inside the hot plate 130. The hot plate 130 is heated also by radiant heat of the cylinder cell 128 that is heated by the heater 134 and the heater 136. The hot plate 130 heats an evaporation material that is supplied into the cylinder cell 128 from the material supply portion 102 that is connected to the cylinder cell, and vaporizes the evaporation material by evaporation or sublimation. In the hot plate 130, a temperature of a portion where the evaporation material is sprayed first is lowered. By providing a rotating mechanism 132 that rotates the hot plate 130 inside the cylinder cell 128, uniformity of a temperature of the hot plate 130 can be achieved. In addition, a heater 140 for heating the material supply portion 102 may be provided to raise a temperature of the evaporation material that is supplied into the cylinder cell 128.

The cylinder cell 128 of the evaporation source 100 is formed so as to narrow down a part of an injection hole 142 of a vaporized evaporation material as compared to a lower part or a central part where the hot plate 130 is provided. In such a structure, a molecule of the vaporized evaporation material can be diffused with directionality. By having directionality in a diffusion direction of the evaporation material, a film can be selectively formed in a narrow region over the substrate. At this time, by making the evaporation source 100 scan as explained in Embodiment Mode 1, a film can be selectively formed by drawing in an arbitral region over the substrate surface.

In the cylinder cell 128, an upper part in which the injection hole 142 is provided, where a temperature is easily lowered, is controlled independently to be heated by the heater 136 for heating an upper part, whereby the injection hole 142 is prevented from being clogged by attaching the evaporation material. It is preferable to control a temperature of an inner wall of the cylinder cell 128 by the heaters 134 and 136 so as to be higher than an evaporation or sublimation temperature of the evaporation material. Accordingly, the evaporation material can be prevented from being deposited inside the cylinder cell 128 without vaporizing the evaporation material supplied from the material supply portion 102.

Figure 5:
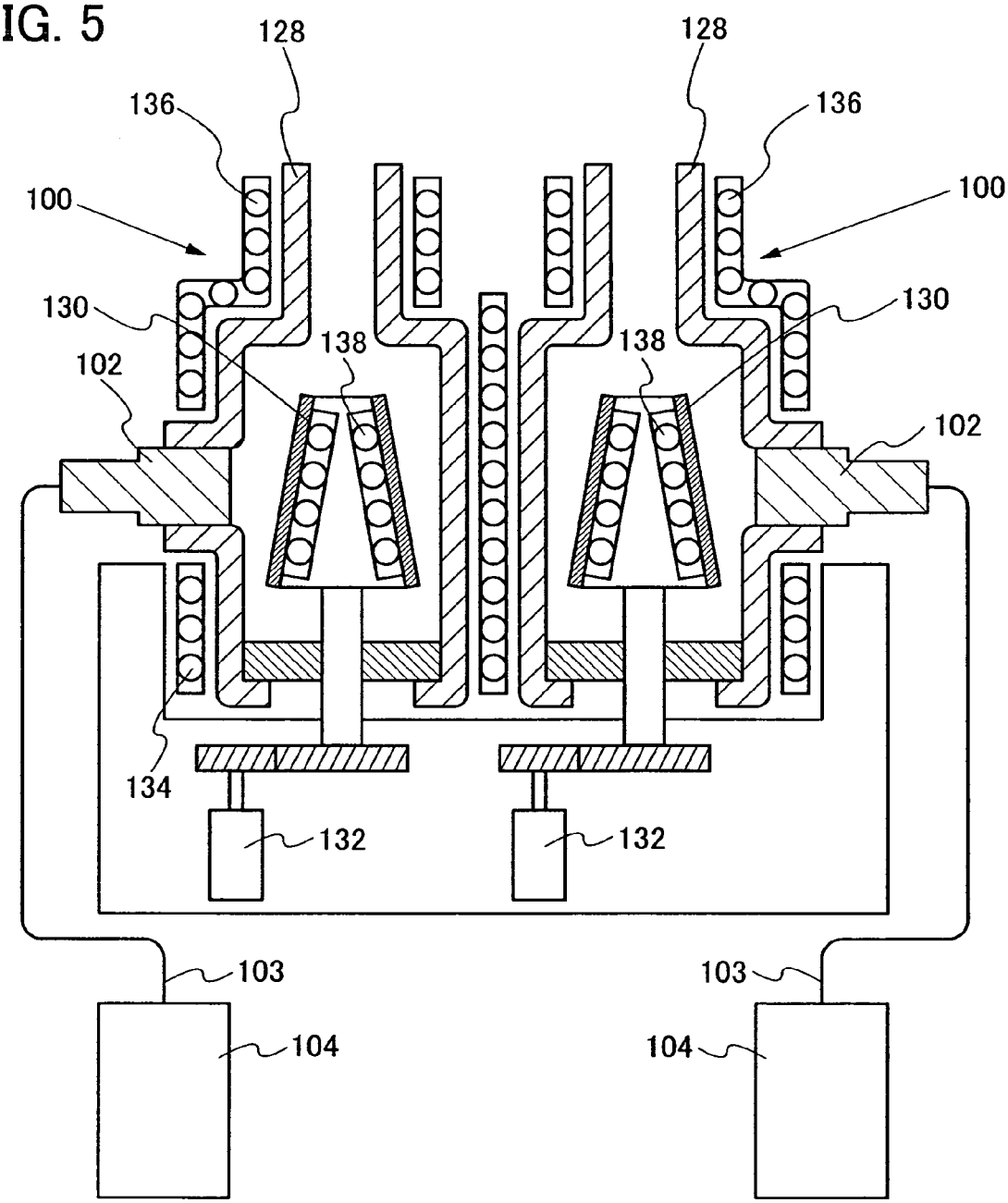

FIG. 5 shows an example in which a plurality of evaporation sources that have the same structure as the evaporation source 100 in FIG. 4, is combined. Hot plates 130 inside cylinder cells 128 and heaters 138 for heating the hot plates 130 can independently control cell temperatures thereof in each cylinder. Accordingly, even in a case of co-evaporating evaporation materials each having a different temperature of evaporation or sublimation, a film can be formed by heating the evaporation materials at suitable temperatures for each evaporation material and controlling a deposition rate.

In addition, in FIG. 5, the hot plate 130 is provided with an inclined angle so as to narrow the upper side thereof in the cylinder cell 128. In such a structure, a vaporized evaporation material can be efficiently introduced to the upper part of the cylinder cell 128. In this case, by rotating the hot plate 130 by a rotating mechanism 132, a constant temperature of the hot plate 130 can be kept and the evaporation material can be efficiently vaporized.

Figure 6:
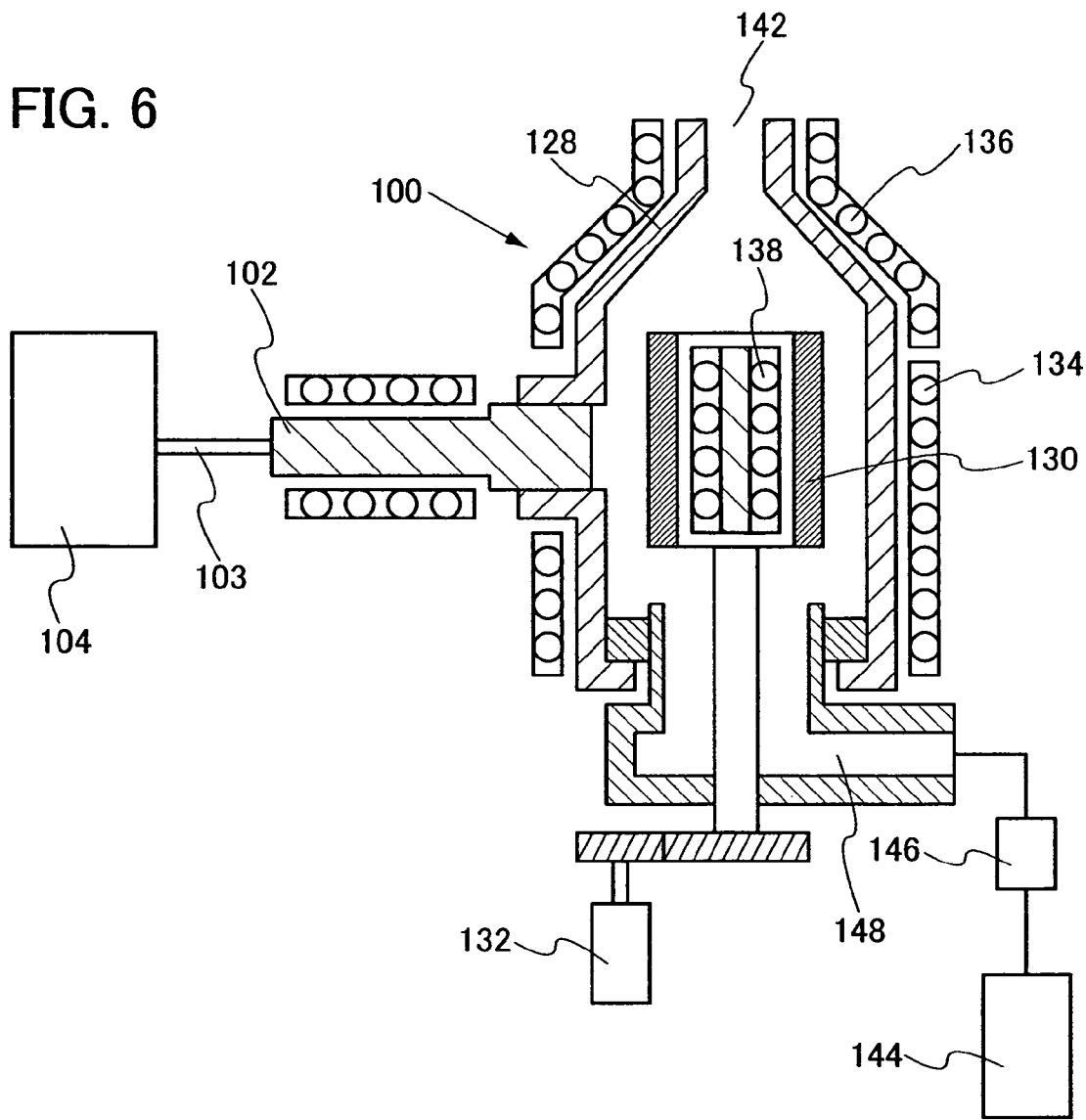

FIG. 6 shows a structure in which a carrier gas flows from a lower part of a cylinder cell 128 and an evaporation material vaporized by a hot plate 130 is diffused from an injection hole 142. By controlling the carrier gas mass flow, a molecule of the vaporized evaporation material can be diffused with directionality, and a film can be selectively formed. The carrier gas supplied from a gas supply source 144 is introduced from a gas introduction hole 148 that is placed in the lower part of the cylinder cell 128. As the carrier gas, an inert gas such as helium, argon, krypton, or neon is preferably used. In this case, nitrogen also can be used. Further, an oxidizing gas or reducing gas that is reacted with the evaporation material may be introduced to perform reactive evaporation. In any case, in order not to lower a temperature of an inside of the cylinder cell 128 due to the carrier gas introduced inside thereof, it is preferable to provide a gas heating heater 146 before the gas introduction opening 148 and to heat the carrier gas.

When the evaporation source of this embodiment mode is applied to the deposition device shown in Embodiment Modes 1 to 3, deposition can be uniformly and continuously performed even in a case of using a substrate having a large size. Further, the evaporation material is not needed to be supplied to the evaporation source every time the evaporation material runs out, and deposition can be continuously performed over a plurality of substrates; therefore, throughput can be improved. Furthermore, by intermittently supplying the material for deposition from the evaporation source 100, a film can be selectively formed over a surface to be deposited. In such a structure, a shadow mask and a shutter that is required in deposition by evaporation can be omitted.

Embodiment Mode 5

Figure 7:
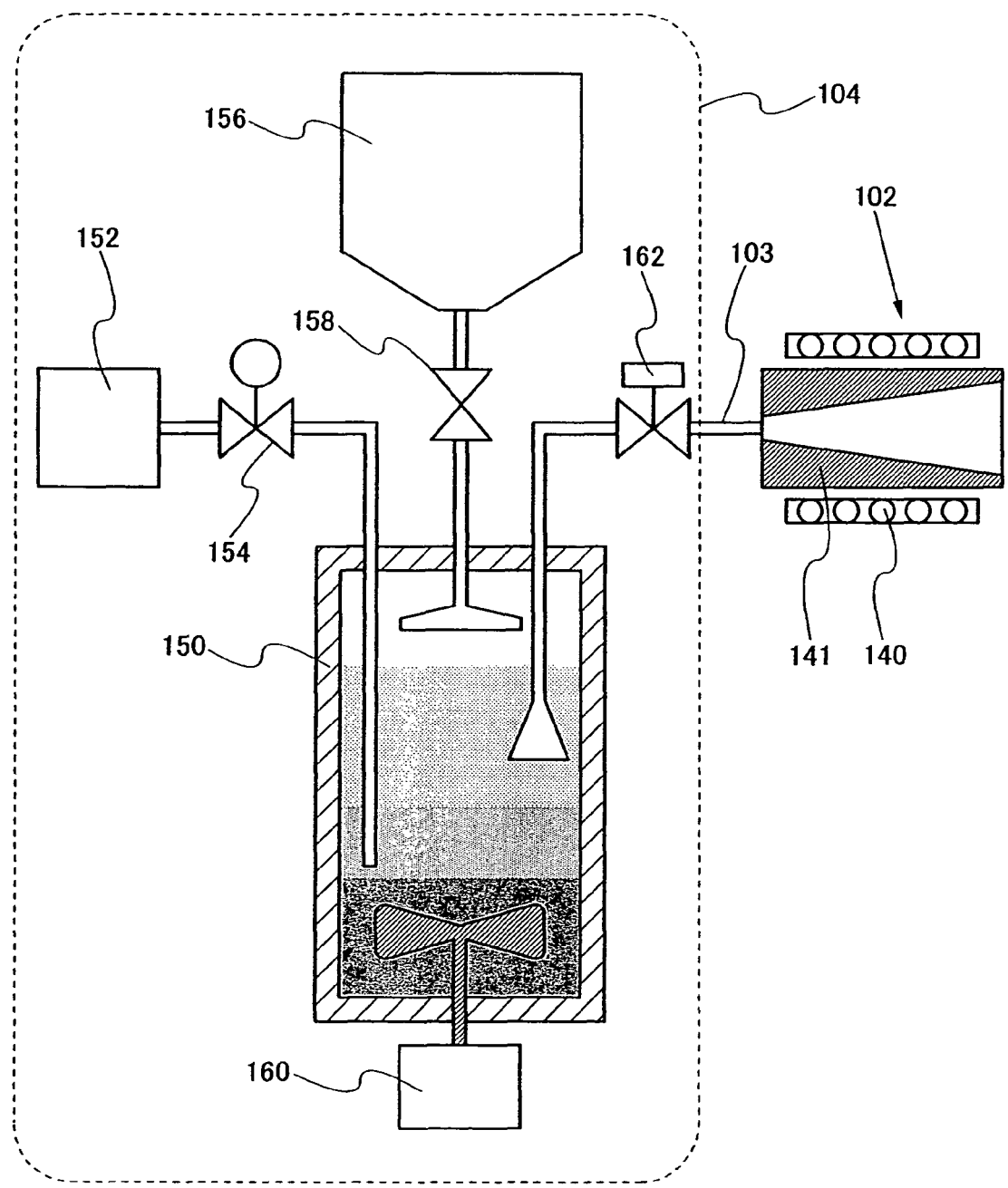

In this embodiment mode, an example of a material supply portion and a material supply source provided in a deposition treatment chamber of a deposition device will be explained with reference to FIG. 7. In this embodiment mode, in order to continuously evaporate an evaporation material to a substrate having a large size by enhancing use efficiency thereof, a structure in which an evaporation material in powder form is supplied by air current is shown.

A material supply portion 102 and a material supply source 104 are connected to each other with a material supply tube 103. In the material supply portion 104, a gas supply source 152 for supplying a carrier gas and a surge tank 156 for supplying an evaporation material are connected to a powder stirring chamber 150. A carrier gas supplied from the carrier gas supply source 152, of which flow volume is adjusted by a flow volume control valve 154, flows into the powder stirring chamber 150. The evaporation material in powder form, of which the supply amount is adjusted by a stop valve 158, is diffused from the surge tank 156 to the powder stirring chamber 150. If the powder stirring chamber 150 is provided with a stirring rotor 160 with a wing, the evaporation material in powder form is easily diffused, and the carrier gas including the powder can be efficiently supplied to the material supply portion 102. If the material supply tube 103 is provided with a stop valve 162, the carrier gas including powder of the evaporation material can be intermittently supplied to the material supply portion 102.

As the carrier gas, one or plural kinds of combination selected from an inert gas such as helium, argon, krypton, or xenon, a nitrogen gas, or a hydrogen gas can be used.

In a cylinder body 141 of the material supply portion 102, an internal diameter differs from an entrance to exit so that a flow rate and a pressure of the carrier gas including the evaporation material in powder form may be controlled. In other words, it is preferable to lower a flow rate of the carrier gas including the evaporation material in powder form, and to adjust the carrier gas to be supplied to a cylinder cell of the evaporation source. This is because a temperature of a hot plate 130 easily becomes unstable in a case where a flow rate of the carrier gas is fast. Further, this cylinder body 141 is heated by a heater 140, and the carrier gas including the evaporation material in powder form may be preheated.

The material supply portion 102 and the material supply source 104 of this embodiment mode can be applied to Embodiment Mode 4. Accordingly, the same operation effect as Embodiment Mode 4 can be obtained.

Embodiment Mode 6

Figure 8:
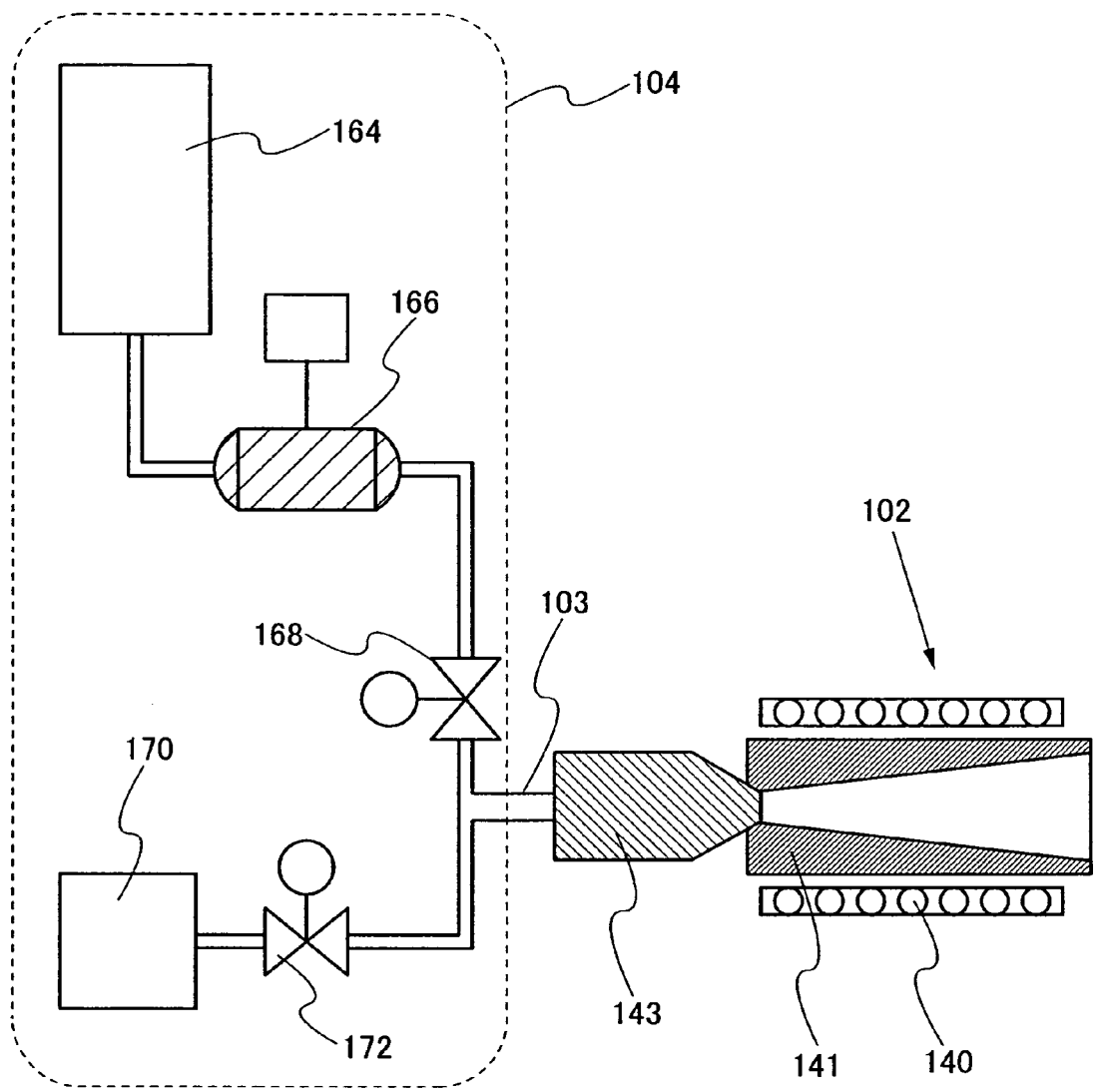

In this embodiment mode, an example of a material supply portion and a material supply source provided in a deposition treatment chamber of a deposition device will be explained with reference to FIG. 8. In this embodiment mode, in order to continuously evaporate an evaporation material over a substrate having a large size by enhancing use efficiency of the evaporation material, a structure is shown, in which a raw material solution in which the evaporation material is dissolved or dispersed in a solvent is transferred and aerosolized by an atomizer to perform evaporation while the solvent in the aerosol is vaporized.

A material supply source 104 has a structure in which a raw material solution in which an evaporation material is dissolved or dispersed in a solvent is dispersed in a carrier gas as a liquid particle (a particle of approximately 1 to 1000 nm) and supplied to a material supply portion 102. The material supply portion 102 has a structure in which the solvent in the liquid particle containing the evaporation material is vaporized, and further, the evaporation material is heated to be vaporized.

The material supply source 104 includes a raw material solution supply portion constituted by a surge tank 164 for storing a raw material solution in which an evaporation material is dissolved or dispersed in a solvent, a pump 166 for transferring a raw material solution, a flow volume adjustment valve 168, and the like; a gas supply source 170 for supplying a carrier gas; and a flow rate adjustment valve 172. As the solvent, an organic solvent such as tetrahydrofuran, chloroform, dimethylformamide, or dimeryl suloxide can be used, for example. As the carrier gas, one or plural kinds of combination selected from an inert gas such as helium, argon, krypton, or xenon, a nitrogen gas, or a hydrogen gas can be used.

Each of the raw material solution and the carrier gas is supplied to an aerosol formation device 143 of the material supply portion 102 by a material supply tube 103. The aerosol formation device 143 is preferably constituted by an atomizer in which the raw material solution and the carrier gas are mixed to be sprayed at high speed. In addition, the raw material solution and the carrier gas may be into the form of a fine mist using an ultrasonic transducer. It is preferable to keep the aerosol sprayed from the aerosol formation device 143 so as not to attach the solvent in the cylinder body 141 that is heated by a heater 140.

The aerosol discharged from the cylinder body 141 is vaporized by a hot plate of the evaporation source to be discharged together with the carrier gas from an opening portion of the cylinder cell. A temperature of the cylinder cell is set to be a temperature at which the evaporation material in the aerosol can be evaporated or sublimated. In this case, a minute particle such as the aerosol can make the solvent vaporized at a lower temperature than a boiling point in an atmospheric air because of a large superficial area. Further, a temperature may be set so as to become higher from a connecting portion of the aerosol formation device 143 toward the opening portion of the cylinder body 141 (an opening where vapor is discharged). An inside of the cylinder body 141 has a structure in which a flow rate and a pressure are controlled without interrupting a flow of the aerosol.

The material supply portion 102 and the material supply source 104 of this embodiment mode can be applied to Embodiment Mode 4. Accordingly, the same operation effect as Embodiment Mode 4 can be obtained.

Embodiment Mode 7

In this embodiment mode, an example of an EL element manufactured by a deposition device having the structure of any of Embodiment Modes 1 to 6 will be explained. In this embodiment mode, an EL element having an EL layer between a pair of electrodes will be explained.

Figure 10:
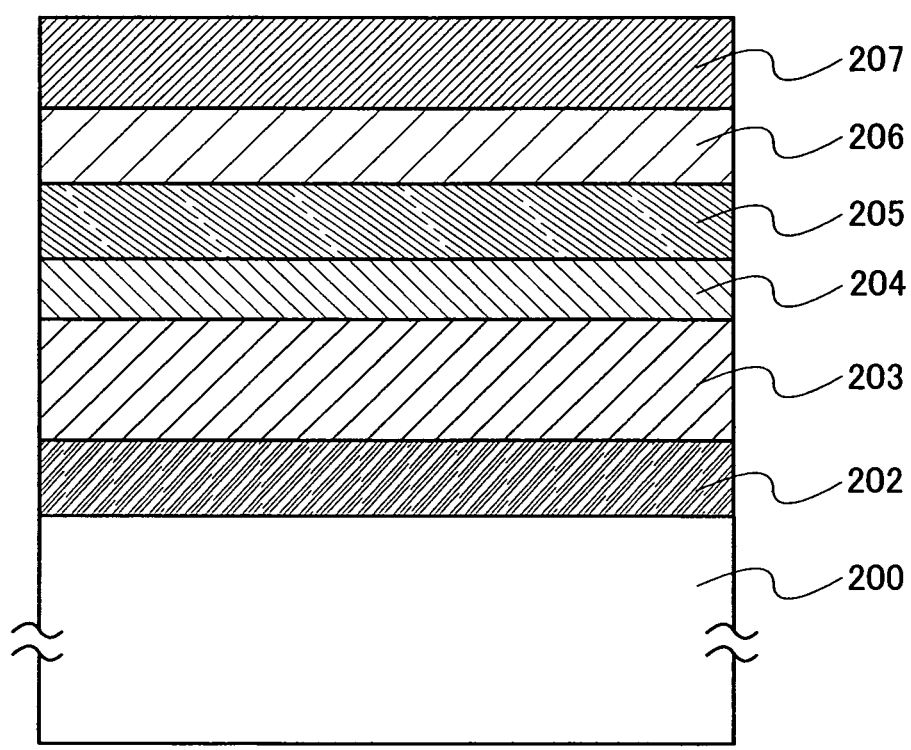

FIG. 10 shows a cross-sectional stacked structure of an EL element. In this EL element, an EL layer 206 is formed between a first electrode 202 and a second electrode 204. The EL layer 206 can be formed by a deposition device provided with the evaporation source described in any one of Embodiment Modes 4 to 7. In the EL element, a substrate 200 may be used as a support body. As the substrate 200, glass, plastic, or the like can be used. It is to be noted that a substrate other than the above may be employed as long as it serves as a support body in a manufacturing step of the EL element. Hereinafter, an EL element is explained, which emits light by injecting holes from the first electrode 202 (hereinafter, also referred to an "anode") and injecting electrons from the second electrode 204 (hereinafter, also referred to a "cathode").

As for the first electrode 202, various metals, alloys, and electric conductive compounds, and mixture thereof can be used. For example, indium tin oxide (ITO), indium tin oxide containing silicon, zinc oxide (ZnO), indium zinc oxide in which zinc oxide is mixed into indium oxide, or the like can be used. In addition, gold (Au), platinum (Pt), nickel (Ni), tungsten (W), chromium (Cr), molybdenum (Mo), iron (Fe), cobalt (Co), titanium (Ti), copper (Cu), palladium (Pd), aluminum (Al), aluminum-silicon (Al—Si), aluminum-titanium (Al—Ti), aluminum-silicon-copper (Al—Si—Cu), a nitride of a metal material, or the like can be used. When the first electrode 202 is used as an anode, it is preferable to use, among those materials, indium tin oxide having a high work function (work function of 4.0 eV or higher), or the like.

The EL layer 206 sequentially includes a first layer 208, a second layer 210, a third layer 212, and a fourth layer 214 from a first electrode 202 side.

The first layer 208 is a carrier injecting and transporting layer and preferably formed using a composite material containing metal oxide and an organic compound. As the metal oxide, metal oxide belonging to Groups 4 to 8 of the periodic table can be used. Specifically, vanadium oxide, niobium oxide, tantalum oxide, chromium oxide, molybdenum oxide, tungsten oxide, manganese oxide, and rhenium oxide are preferable because of high electron accepting property. Above all, molybdenum oxide is particularly preferable because it is stable in an atmospheric air and easy to be handled.

As a combination of metal oxide and an organic compound, a composite material in which the organic compound is easy to be oxidized by the metal oxide is preferable. In other words, a composite material in which a radical cation of the organic compound is easily generated in the metal oxide is preferable. As an organic compound used for a composite material, for example, an aromatic amine compound, a carbazole derivative, an aromatic hydrocarbon, a metal complex, an organic metal complex, a high molecular compound (such as oligomer, dendrimer, or polymer), or the like can be used. Accordingly, conductivity of the composite material can be improved as compared to a case of using only an organic compound, and an effect that a carrier injecting property (particularly, a hole injecting property) to the organic compound can be enhanced can be obtained. In addition, an electric barrier with various metals can be relieved to reduce contact resistance.

The second layer 210 is made of a substance having a high hole transporting property, for example, an aromatic amine-based (in other words, a compound having a bond of a benzene ring-nitrogen) compound such as 4,4'-bis[N-(1-naphtyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4"-tris(N,N-diphenylamino)triphenylamine (abbreviation: TDATA), or 4,4',4"-tris[N-(3-methylphenyl)-N-phenylamino]triphenylamine (abbreviation: MTDATA). The substances described here mainly have hole mobility of $10^{-6}$ cm$^2$/Vsec or more. It is to be noted that a substance other than the above may be used as long as it has a higher hole transporting property than an electron transporting property. The second layer 210 may be not only a single layer but also a stacked layer of two or more layers made of the above substance.

The third layer 212 is a layer containing a light emitting material. As a light emitting material, it is preferable to combine a substance having a high light emitting property such as N,N'-dimethylquinacridone (abbreviation: DMQd), or 3-(2-benzothiazoyl)-7-diethylaminocoumarin (abbreviation: coumarin 6), and a substance having a high carrier transporting property, which is hardly crystallized, such as tris(8-quinolinolato)aluminum (abbreviation: Alq) or 9,10-di(2-naphtyl)anthracene (abbreviation: DNA). In addition, since Alq and DNA have also a high light emitting property, the third layer 212 may have a structure in which these substances are independently used.

As for the fourth layer 214, a substance having a high electron transporting property can be applied. For example, a metal complex having a quinoline skeleton or a benzoquinoline skeleton such as tris(8-quinolinolato)aluminum (abbreviation: Alq), tris(5-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)-4-phenylphenolato-aluminum (abbreviation: BAlq), or the like can be used. In addition, a metal complex having an oxazole-based or thiazole-based ligand such as bis[2-(2-hydroxyphenyl)-benzoxazolato]zinc (abbreviation: Zn(BOX)$_2$) or bis[2-(2-hydroxyphenyl)-benzothiazolato]zinc (abbreviation.: Zn(BTZ)$_2$), or the like can be used. In addition to a metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP), or the like can be used. The substances described here have electron mobility of $10^{-6}$ cm$^2$/Vsec or more. It is to be noted that a substance other than the above can be used as long as it has a higher electron transporting property than a hole transporting property.

As for the second electrode 204, a metal, alloy, or electric conductive compound having a low work function (a low work function of 3.8 eV or less) or a mixture thereof can be used. For example, an element belonging to Group 1 or 2 of the periodic table, in other words, an alkali metal such as lithium (Li) or cesium (Cs), or an alkaline earth metal such as magnesium (Mg), calcium (Ca), or strontium (Sr); and an alloy containing these (Mg:Ag or Al:Li) can be used. Further, the second electrode 204 can be formed by combining a metal or metal oxide layer, and the EL layer 206 with an electron injecting layer. As the electron injecting layer, a compound of alkali metal or alkaline earth metal such as lithium fluoride (LiF), cesium fluoride (CsF), or calcium fluoride (CaF$_2$) can be used. In addition, a layer made of a substance having an electron transporting property, which contains alkali metal or alkali earth metal, for example, a layer made of Alq containing magnesium (Mg) or the like can be used.

It is to be noted that a structure of the EL layer 206 is not limited to description of FIG. 10, and any structure in which light emission can be obtained by applying an electric field may be employed. In other words, a structure other than that shown in FIG. 10 may be employed as long as it has a region in which holes and electrons are recombined in a portion separated from the first electrode 202 and the second electrode 204 so as to suppress quenching that occurs by providing a light emission region close to metal.

In the EL layer 206, one or plural kinds of layers called a hole injecting layer, a hole transporting layer, a light emitting layer, an electron transporting layer, an electron injecting layer, and the like are included from the viewpoint of a carrier transporting property. It is to be noted that a boundary of each layer is not necessary to be clear, and there is a case in which the material forming each layer is partly mixed and an interface is unclear. For each layer, an organic-based material and an inorganic-based material can be used. As the organic-based material, any of a high molecular material, a medium molecular material, and a low molecular material can be used. Further, the electrode may have a function of applying an electric field to the EL layer. A conductive layer made of metal or metal oxide and a layer having a carrier transporting or carrier injecting property, which is in contact with the conductive layer, may be included in the electrode.

The EL element having such a structure as described above can obtain light emission (luminescence) by applying a voltage between the first electrode 202 and the second electrode 204 and flowing a current in the EL layer 206. In the structure of FIG. 10, a light emitting region is formed in the third layer 212. However, the entire third layer 212 is not necessary to serve as a light emitting region, and for example, a light emitting region may be formed only on a second layer 210 side or a fourth layer 214 side in the third layer 212.

When either the first electrode 202 or the second electrode 204 has a light transmitting property and the other electrode has a light reflecting property, light from the EL layer 206 can be emitted from a light transmitting electrode side. When both the first electrode 202 and the second electrode 204 have a light transmitting property, an EL element in which light from the EL layer 206 can be emitted from both electrodes can be obtained.

As explained in Embodiment Mode 1, such an EL element can be formed by the deposition device provided with a plurality of deposition treatment chambers shown in FIG. 1. For example, the substrate 200 over which an indium tin oxide film is formed as the first electrode 202 is put in the load chamber 14 to perform vacuum evacuation.

Then, the substrate 200 is introduced into the heat treatment chamber 18 by the transfer means 40. In the heat treatment chamber 18, the substrate 200 is heated to perform degassing treatment. Further, the substrate 200 may be transferred into the plasma treatment chamber 26 to process a surface of the first electrode 202 by oxygen plasma treatment. The treatment in the heat treatment chamber 18 may be appropriately performed and can be omitted.

Over the substrate 200 that is introduced in the deposition treatment chamber 20, the first layer 208 is deposited over the first electrode 202. In order to deposit the first layer 208 formed of a composite material containing metal oxide and an organic compound, the deposition treatment chamber 20 is provided with an evaporation source of metal oxide and an evaporation source of an organic compound. Co-evaporation is performed using at least the evaporation sources of two kinds. As a structure of the evaporation source, a structure of the evaporation sources in any one of Embodiment Modes 4 to 7 can be applied. As a matter of course, two kinds of the evaporation sources are not necessary to have the same structure, and the evaporation sources having a different structure from each other may be combined. In a case where powder is transferred by an air current to evaporate metal oxide as Embodiment Mode 4, oxygen can be used as a carrier gas. By supplying oxygen into the deposition treatment chamber 20, a difference from a stoichiometric composition of metal oxide can be suppressed. Further, as an organic compound, a method for aerosolization can be applied as Embodiment Mode 5. In any case, the first layer 208 is a layer having a carrier injecting and transporting property, of which resistivity is $5\times10^4$ to $1\times10^6$ Ωcm, to be formed with a thickness of 30 to 300 nm.

Thereafter, the second layer 210 is deposited in the deposition treatment chamber 20. For the second layer 210, a substance having a high hole transporting property such as NPB is deposited. It is to be noted that the substrate 200 may be moved to another deposition treatment chamber to deposited the second layer 210.

Over the substrate 200 that is moved to the deposition treatment chamber 24, the third layer 212 is deposited. The third layer 212 is a layer containing a light emitting material, and an evaporation material depending on a light emission color is deposited as the third layer 212. As a structure of an evaporation source, a structure of the evaporation sources in any one of Embodiment Modes 4 to 7 can be applied. As a matter of course, the evaporation sources of two kinds as the above are not needed to have the same structure, and different structures from each other may be combined. In a case where a plurality of layers emitting light with different colors is deposited in each EL element or in one EL element, after depositing one layer, the substrate 200 is moved to the deposition treatment chambers 28 and 30 to deposit another layer. By depositing films in separate deposition treatment chambers, light emitting substances are not improperly mixed, and an element having high light emitting color purity can be manufactured.

Over the substrate 200 that is moved to the deposition treatment chamber 32, the fourth layer 214 is deposited. As the fourth layer 214, a film such as Alq is deposited as an electron transporting layer. In addition, the substrate 200 is moved to the deposition treatment chamber 34 to deposit the second electrode 204.

The substrate 200 over which the EL layer 206 and the second electrode 204 are formed is carried to the sealing treatment chamber 38 through the intermediate chamber 36. The sealing treatment chamber 38 is filled with an inert gas such as helium, argon, neon, or nitrogen. A sealing plate is attached to a side of the substrate 200 where the EL layer 206 is formed under the inert atmosphere to seal the EL layer 206. In a sealed state, a space between the substrate 200 and the sealing plate may be filled with an inert gas or a resign material.

In such a manner, an EL element can be obtained. In accordance with this embodiment mode, deposition can be uniformly and continuously performed even in a case of using a display panel having a large screen. Further, the evaporation material is not needed to be supplied to the evaporation source every time the evaporation material runs out; therefore, throughput can be improved.

Embodiment Mode 8

In this embodiment mode, an example of a light emitting device manufactured by the deposition device shown in Embodiment Modes 1 to 6 will be explained with reference to FIG. 11. It is to be noted that the light emitting device includes a device that displays characters, figures, symbols, signs, still images, moving images, and the like by arranging a plurality of display units that are also referred to as pixels. The pixels are arranged in various manners such as in a matrix form and in a segment form. In addition, the light emitting device includes a device as a whole for displaying information by changing lights and darks, a color tone, and the like. Further, the light emitting device includes a device as a whole, which is used as a light source or lighting.

Figure 11:
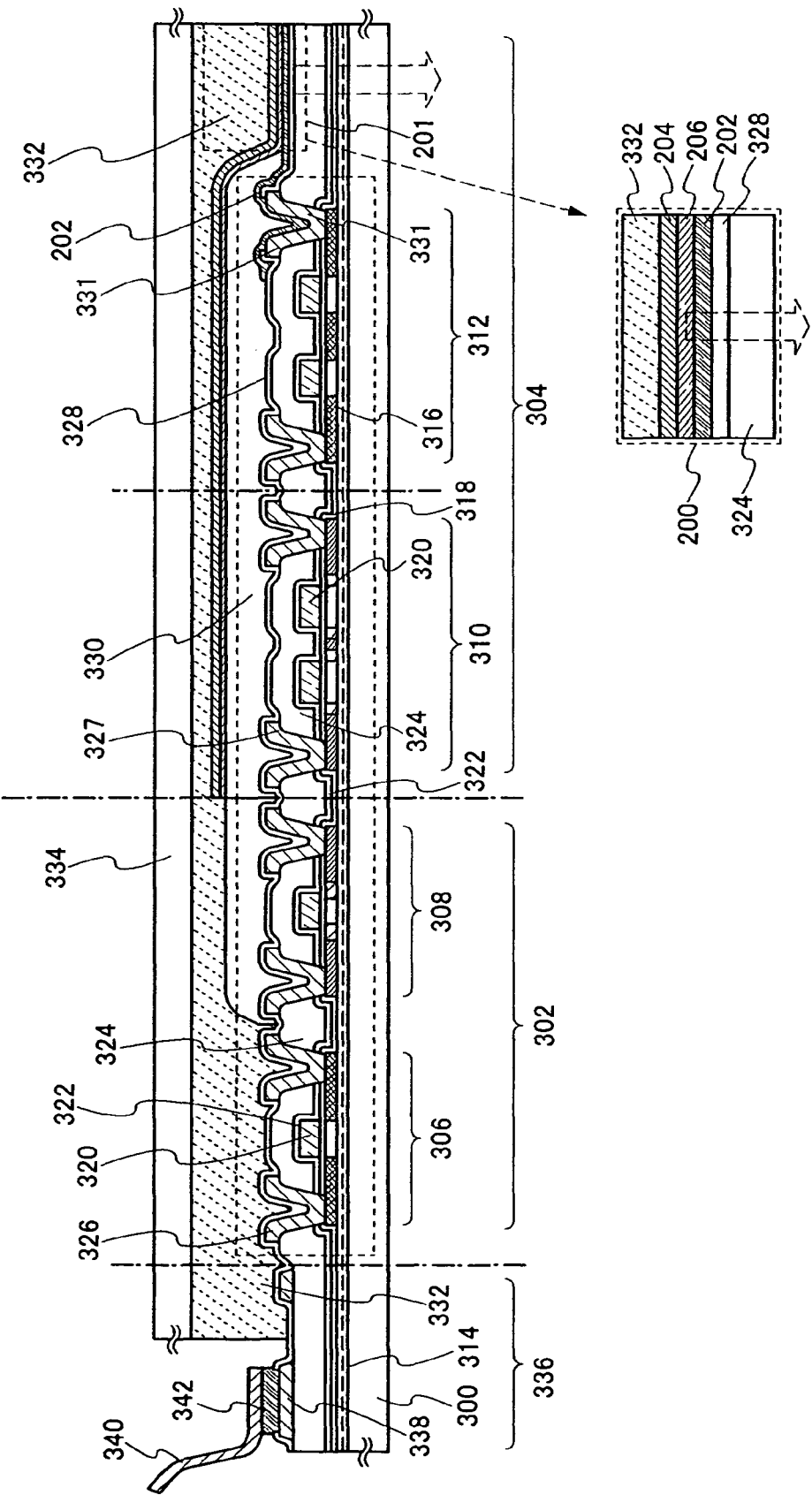

FIG. 11 shows a light emitting device in which a driver circuit 302 and a display portion 304 that are formed over an element substrate 300 are sealed by a sealing substrate 334.

In the driver circuit 302, a first p-channel transistor 306 and a second n-channel transistor 308 are shown as a typical example. The first transistor 306 includes a semiconductor layer 316, an insulating layer 318 serving as a gate insulating layer, and a gate electrode 320. Further, an insulating layer 314 as a blocking layer against a contamination impurity is formed in a lower layer of the semiconductor layer 316. As the semiconductor layer 316, single crystalline silicon, polycrystalline silicon, or amorphous silicon can be used.

The second transistor 308 has the same structure as the first transistor 306 and serves as a transistor by appropriately providing an impurity region such as a source region and a drain region that are formed in the semiconductor layer 316. In the transistor, a single drain structure in which a channel formation region is provided between a pair of a source region and a drain region, an LDD structure in which a low concentration drain (LDD) is provided between a channel formation region and a drain, a gate overlapped drain structure in which an LDD is overlapped with a gate electrode, and the like can be appropriately selected to be used. A shift register circuit, a latch circuit, a level shifter circuit, a switch circuit, and the like are formed by using these transistors to form the driver circuit 302.

Figure 12A:
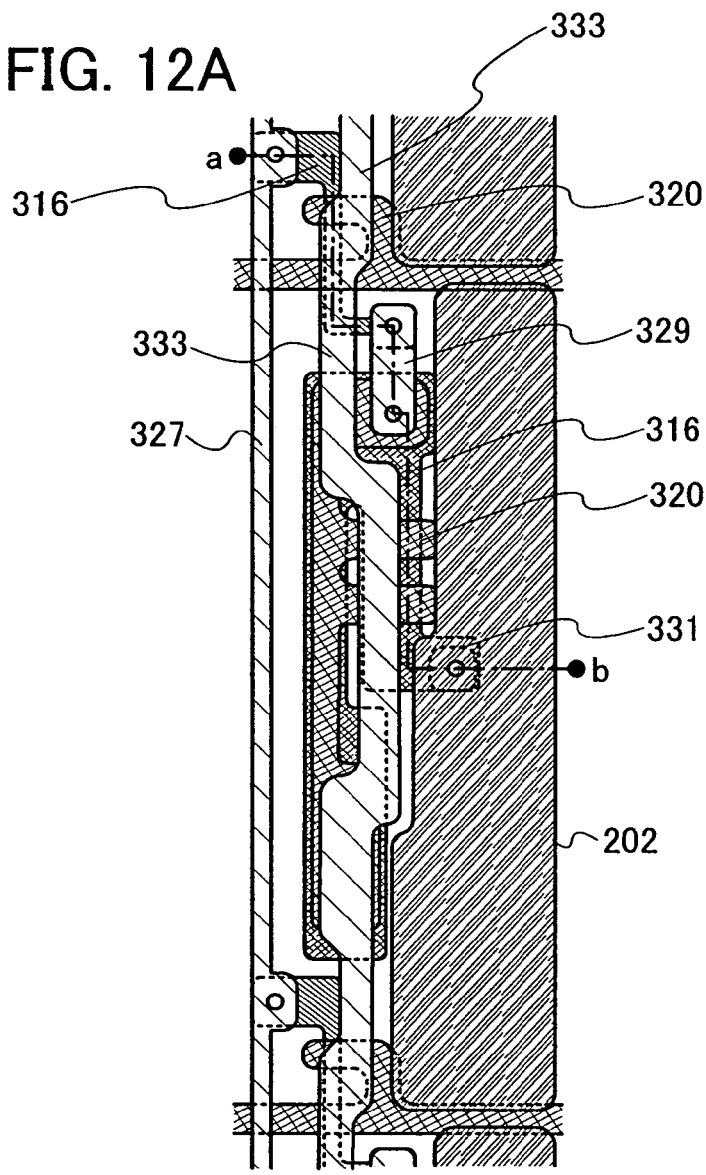
Figure 12B:
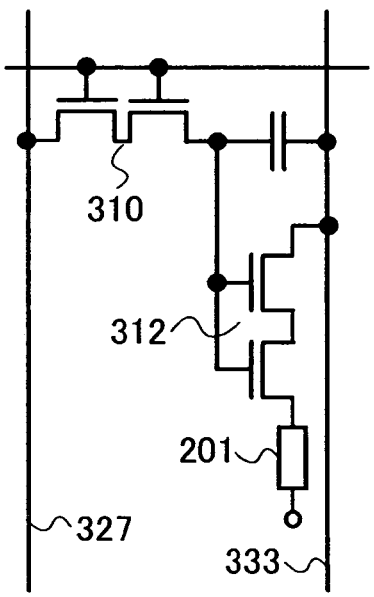

In the display portion 304, a third n-channel transistor 310 and a fourth p-channel transistor 312 that are included in one pixel are shown as a typical example. FIG. 12A shows a top view of this pixel, and a cross-sectional view corresponding to an a-b line is shown in FIG. 11. FIG. 12B shows an equivalent circuit of the pixel. The third transistor 310 and the fourth transistor 312 have a multi-gate structure in which a plurality of gate electrodes is interposed (a plurality of channel formation regions is serially arranged) between a pair of a source region and a drain region.

A passivation layer 322 and an interlayer insulating layer 324 are formed in an upper layer of the gate electrode 320, and a wiring 326 is formed thereover. In the display portion 304, a wiring 327 for supplying an image signal, a wiring 333 as a power supply line, and a wiring 329 for connecting the third transistor 310 and the fourth transistor 312 are formed. A partition layer 330 is formed over the wiring 329 with an insulating layer 328 interposed therebetween. An EL element 201 is arranged over the interlayer insulating layer 324. A first electrode 202 is extended over the interlayer insulating layer 324 (or over the insulating layer 328) to be connected to a wiring 311 of the fourth transistor 312. A peripheral edge portion of the first electrode 202 is covered with the partition layer 330, and an opening portion is formed. The EL element is constituted by the first electrode 202, an EL layer 206, and a second electrode 204, and the details thereof can employ the description in Embodiment Mode 8. As shown in FIG. 11, in a case where light emission from the EL layer 206 is emitted to a first electrode 202 side, the first electrode 202 is formed of a transparent conductive film, and the second electrode is formed of a metal electrode. Further, a sealing material 332 is interposed between the element substrate 300 and the sealing substrate 334.

It is to be noted that FIG. 11 shows a structure in which the insulating layer 328 is provided between the first electrode 202 of the EL element and the interlayer insulating layer 324. When a wiring layer is formed over the interlayer insulating layer 324 by etching treatment and an etching residue remains to promote a progressive detect (degradation with time and a defect for promoting a non-light emitting region) of the EL element, this insulating layer 328 efficiently functions to prevent the defect. Therefore, the insulating layer 328 can also be omitted.

Although FIG. 11 shows a top gate transistor structure in which the gate electrode 320 is formed after forming the semiconductor layer 316, a bottom gate structure in which a semiconductor layer is formed after forming a gate electrode may be employed. In particular, in a case of using amorphous silicon, the latter is preferably used.

In a terminal portion 336 of the element substrate 300, a terminal 338 is provided and electrically connected to a wiring board 340 that is connected to an external circuit. In a connecting portion, a conductive adhesive agent 342 is provided.

Figure 13:
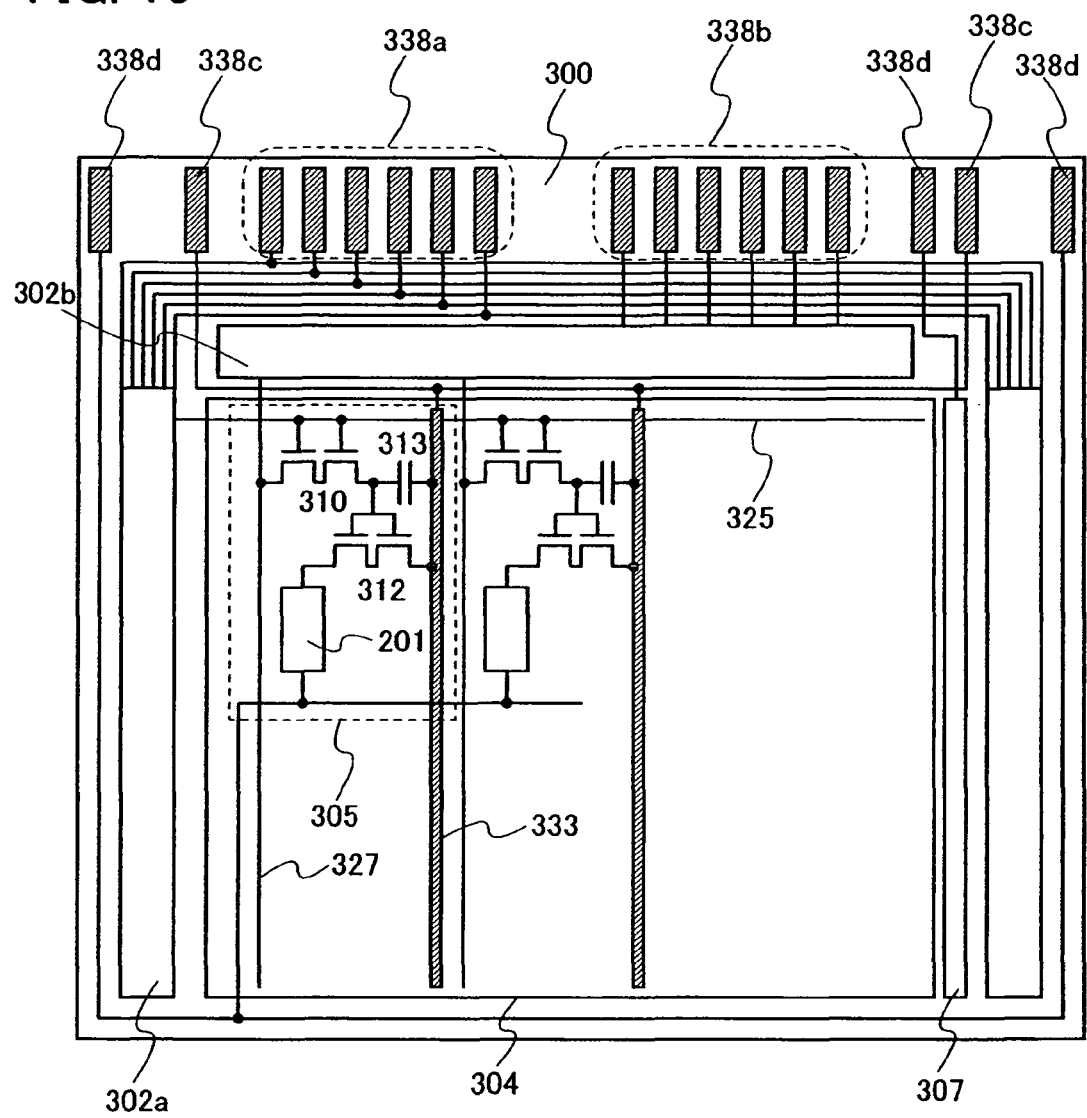

FIG. 13 shows a structure of the element substrate 300. The display portion 304 in which a plurality of pixels 305 is arranged is formed over the element substrate 300. In addition, a scanning line driver circuit 302a and a signal line driver circuit 302b are formed as the driver circuit. In the display portion 304, a wiring 325 extended from the scanning line driver circuit 302a, a wiring 327 extended from the signal line driver circuit 302b, and a wiring 333 as a power supply line are provided. Further, a monitor circuit 307 for compensating luminance change of the EL element 201 included in the pixel 305 may be provided. The EL element 201 and an EL element included in the monitor circuit 307 have the same structure.

On the periphery of the element substrate 300, a terminal 338a for inputting a signal from the external circuit to the scanning line driver circuit 302a, a terminal 338b for inputting a signal from the external circuit to the signal line driver circuit 302b, and a terminal 338c for inputting a signal to the monitor circuit 307 are provided. The pixel 305 includes the third transistor 310 that is connected to the wiring 327 to which an image signal is supplied, and the fourth transistor 312 that is serially inserted between and connected to the EL element 201 and the wiring 333 to which electric power is supplied. A gate of the third transistor 310 is connected to the wiring 325, and when the gate is selected by a scanning signal, a signal of the wiring 327 to which an image signal is supplied is inputted to the pixel 305. The inputted signal is supplied to a gate of the fourth transistor 312 to charge a storage capacitor portion 313. The wiring 333 and the EL element 201 are conducted to each other corresponding to this signal, and the EL element 201 emits light.

In order to make the EL element 201 provided in the pixel 305 emit light, electric power is needed to be supplied from the external circuit. A wiring 333 to which electric power is supplied is connected to the external circuit at the terminal 338c. Since resistance loss occurs in the wiring 333 depending on length of a wiring to be led, the terminals 338c are preferably provided in plural portions on the periphery of the element substrate 300. The terminals 338c are provided on both edges of the element substrate 300 so that luminance variations in the area of the display portion 304 do not become notable. In other words, it is prevented that one side of the screen becomes bright while the other side thereof becomes dark. In addition, in the EL element 201 having a pair of electrodes, an electrode opposite to the electrode connected to the wiring 333 to which electric power is supplied is formed as a common electrode shared by a plurality of the pixels 305. In order to reduce the resistance loss of this electrode, a plurality of terminals 338d is provided.

In such a light emitting device, an EL element can be formed by the deposition device provided with a plurality of deposition treatment chambers shown in FIG. 1 as explained in Embodiment Mode 1. For example, the element substrate 300 over which components up to the driver circuit 302, the first electrode 202 connected to each transistor of the display portion 304 and the fourth transistor 312, and the partition layer 330 are formed is carried to the load chamber 14 so that the EL layer 206 is deposited. Embodiment Mode 8 can be referred to as for the process.

In accordance with this embodiment mode, deposition can be continuously performed with in-plane uniformity of an evaporation film, even in a case of using a large-sized glass substrate having a side that is longer than 1000 mm. Further, the evaporation material is not needed to be supplied to the evaporation source every time the evaporation material runs out; therefore, throughput can be improved.

Embodiment Mode 9

In this embodiment mode, an example of a light emitting device that can be manufactured by the deposition device shown in Embodiment Modes 1 to 6 will be explained with reference to FIGS. 14A and 14B.

Figure 14A:
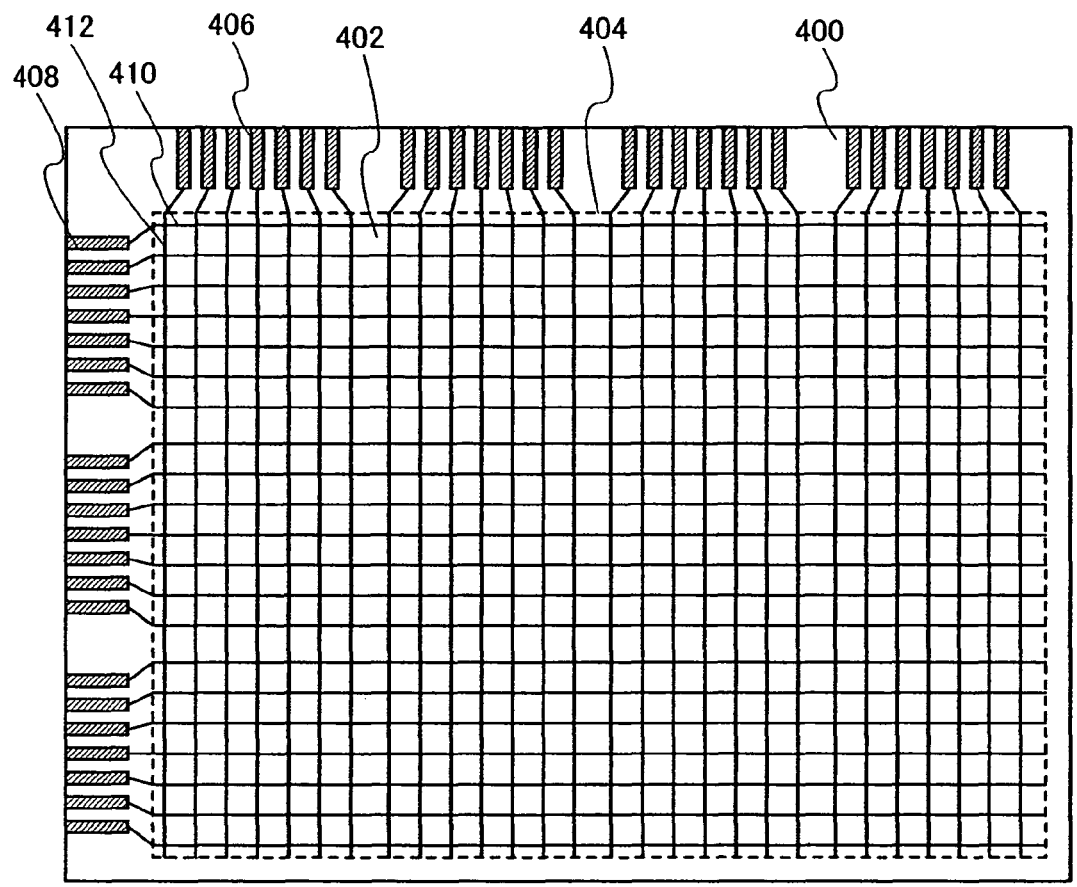
Figure 14B:
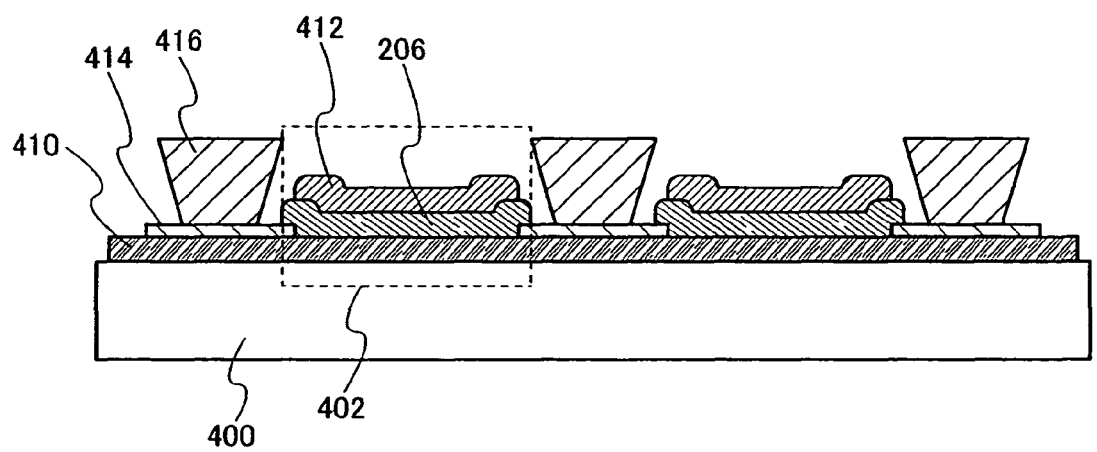

FIG. 14A is a top view of a light emitting device, which shows a display portion 404 formed by arranging a pixel 402 over a substrate 400. FIG. 14B shows a cross-sectional view of a structure of the pixel 402. The explanation below refers to these both views.

Over the substrate 400, wirings extending in one direction and wirings extending in another direction are formed so as to be intersected with each other. Here, one direction is referred to as an X direction and another direction is referred to as a Y direction for convenience.

A wiring 410 extending in the X direction and a wiring 412 extending in the Y direction are provided, and an EL layer 206 is formed at a portion where the both wirings are intersected. At this time, the EL layer 206 may be formed in a stripe form in the same direction as the wiring 412 extending in the Y direction. A partition wall 416 is formed in a stripe form in the same direction as such an EL layer 206 and the wiring 412 extending in the Y direction. The partition wall 416 has a function of separating the EL layer 206 and the wiring 412 extending in a stripe form from an adjacent set of the EL layer 206 and the wiring 412. The partition wall may have an inverse tapered cross-sectional shape as shown in FIG. 14B. In addition, an insulating layer 414 is provided between the partition wall 416 and the wiring 410 extending in the X direction so that the wiring 410 extending in the X direction from a scanning line input terminal 408 and the wiring 412 extending in the Y direction from a signal line input terminal 406 are not in contact with each other.

In such a light emitting device, as explained in Embodiment Mode 1, the EL layer 206 can be formed by the deposition device provided with a plurality of deposition treatment chambers shown in FIG. 1. For example, the substrate 400 over which the wiring 410 extending in the X direction in a stripe form, the insulating layer 414, and the partition wall 416 are formed, is carried to the load chamber 14, and the EL layer 206 is deposited. Embodiment Mode 8 can be referred to as for the process. In this case, an EL layer that is similar to the one in Embodiment Mode 8 can be applied for the EL layer 206. In addition, in a case of forming pixels each having a different light emission color such as red (R), green (G), or blue (B) in the display portion 404, the EL layer 206 may be made to have a different structure by using a shadow mask in evaporating. At this time, the partition wall 416 serves as a spacer so that the shadow mask is not directly in contact with the wiring 410 or the like.

In accordance with this embodiment mode, deposition can be continuously performed with in-plane uniformity of an evaporation film, even in a case of using a large-sized glass substrate having a side that is longer than 1000 mm. Further, the evaporation material is not needed to be supplied to the evaporation source every time the evaporation material runs out; therefore, throughput can be improved.

Embodiment Mode 10

In this embodiment, an example of a light emitting device that can be manufactured by the deposition device shown in Embodiment Modes 1 to 6 will be explained with reference to drawings. In this embodiment mode, a light emitting device of which a manufacturing process of an element substrate including a transistor includes a step of forming a predetermined pattern without using a photomask at least in part will be particularly explained with reference to drawings.

Figure 15:
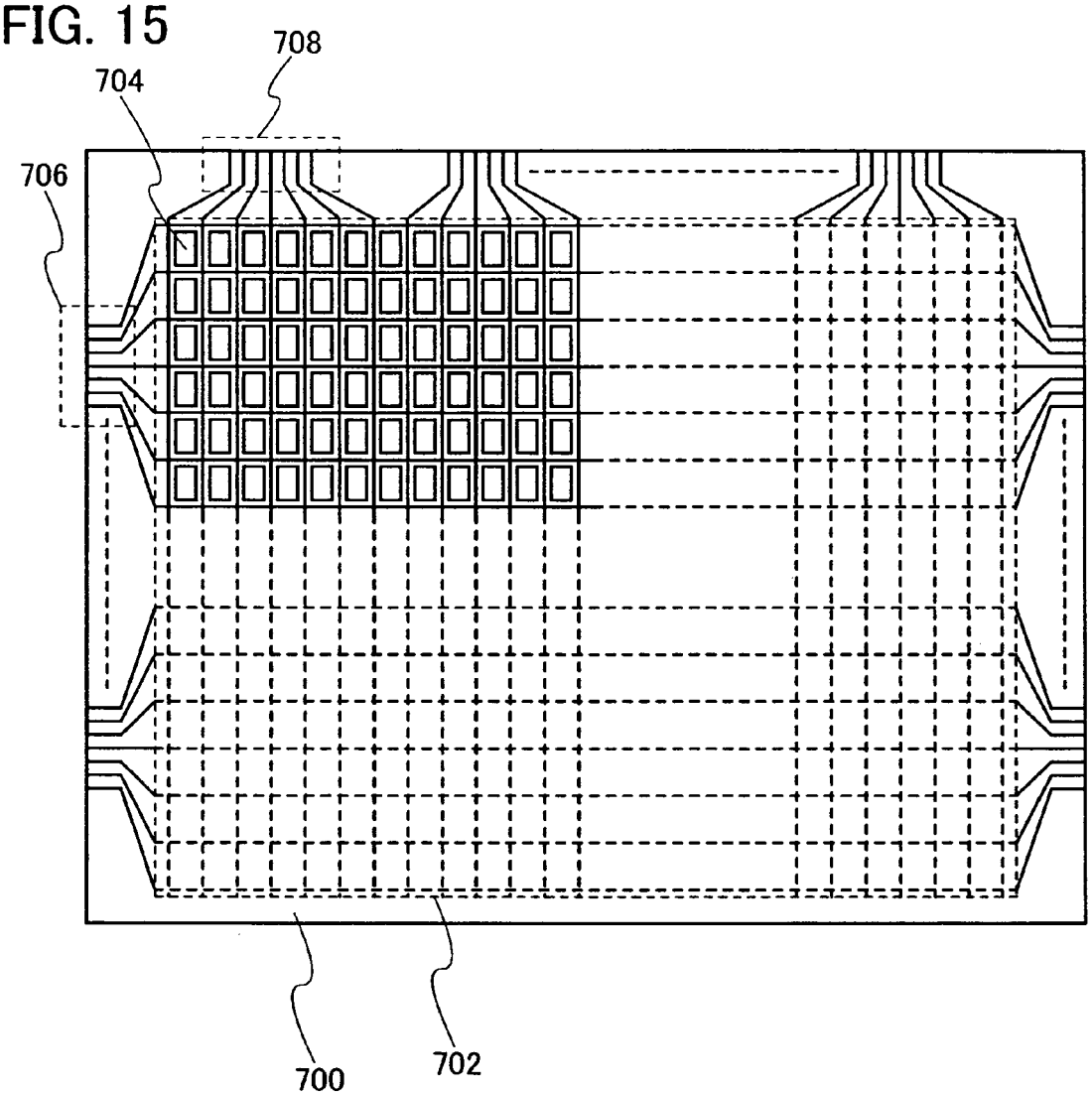

FIG. 15 is a top view showing a structure of a light emitting device relating to this embodiment mode, in which a pixel portion 702 includes pixels 704 arranged in a matrix form, a scanning line input terminal 706, and a signal line input terminal 708 are formed over a substrate 700 having an insulating surface. The number of pixels may be determined in accordance with various standards. In a case of XGA, the number of pixels may be 1024×768×3 (RGB), in a case of UXGA, the number of pixels may be 1600×1200×3 (RGB), and in a case of the use for a full spec high vision display, the number of pixels may be 1920×1080×3 (RGB).

Figure 16:
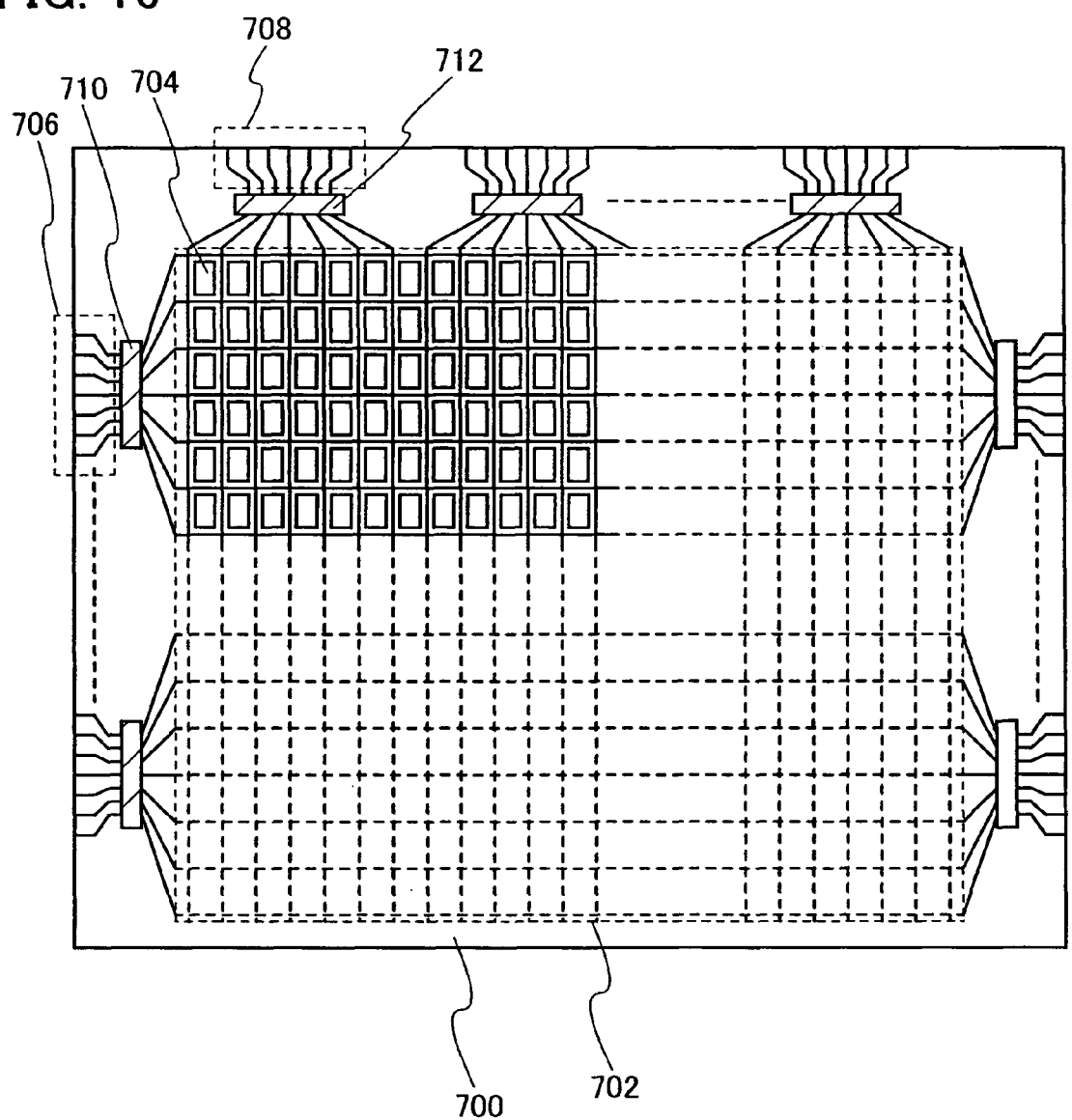

FIG. 15 shows a structure of a light emitting device that controls a signal inputted to a scanning line and a signal line by an external driver circuit. In addition, a driver IC may be mounted on the substrate 700 by COG (chip on glass) as shown in FIG. 16. FIG. 16 shows a mode in which a scanning line driver IC 710 and a signal line driver IC 712 are mounted on the substrate 700. The scanning line driver IC 710 is provided between the scanning line input terminal 706 and the pixel portion 702.

A scanning line extending from the input terminal 706 and a signal line extending from the input terminal 708 are intersected, and accordingly, pixels 704 are arranged in a matrix form. Each of the pixels 704 is provided with a transistor (hereinafter, also referred to as a "switching transistor" or a "switching TFT") for controlling a connection state of the signal line and a driving transistor and a transistor (hereinafter, also referred to as a "driving transistor" or a "driving TFT") for controlling a current flowing to an EL element, and the driving transistor is serially connected to the EL element.

The transistor is typically a field effect transistor, which includes a semiconductor layer, a gate insulating layer, and a gate electrode as its main component. A wiring connected to source and drain regions formed in the semiconductor layer is also provided. Although a top gate structure in which a semiconductor layer, a gate insulating layer, and a gate electrode are provided from the substrate side, and a bottom gate structure in which a gate electrode, a gate insulating layer, and a semiconductor layer are provided from the substrate side are typically known, any structure may be used in the present invention. As a material for forming the semiconductor layer, an amorphous semiconductor formed by a vapor growth method or a sputtering method using a semiconductor material gas typified by silane or germane; a polycrystalline semiconductor obtained by crystallizing the amorphous semiconductor by using light energy or thermal energy; a semiamorphous semiconductor; or the like can be used.

Next, a step in which such a light emitting device is realized with a channel protection transistor will be explained.

Figure 17A:
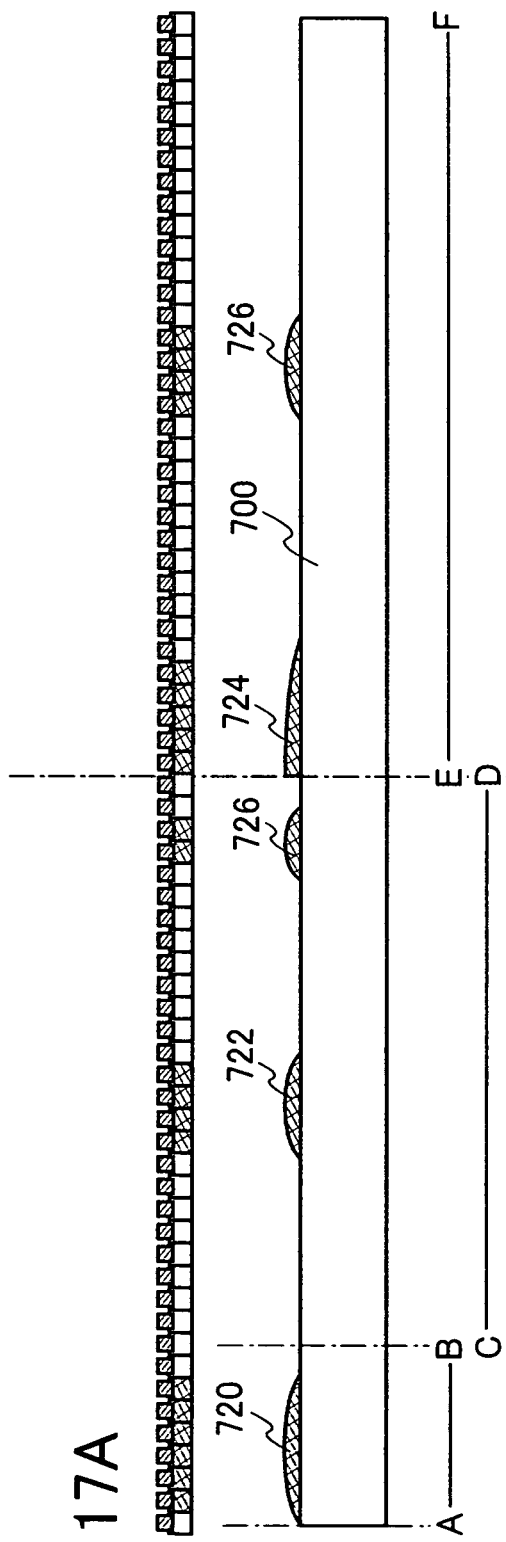
Figure 18:
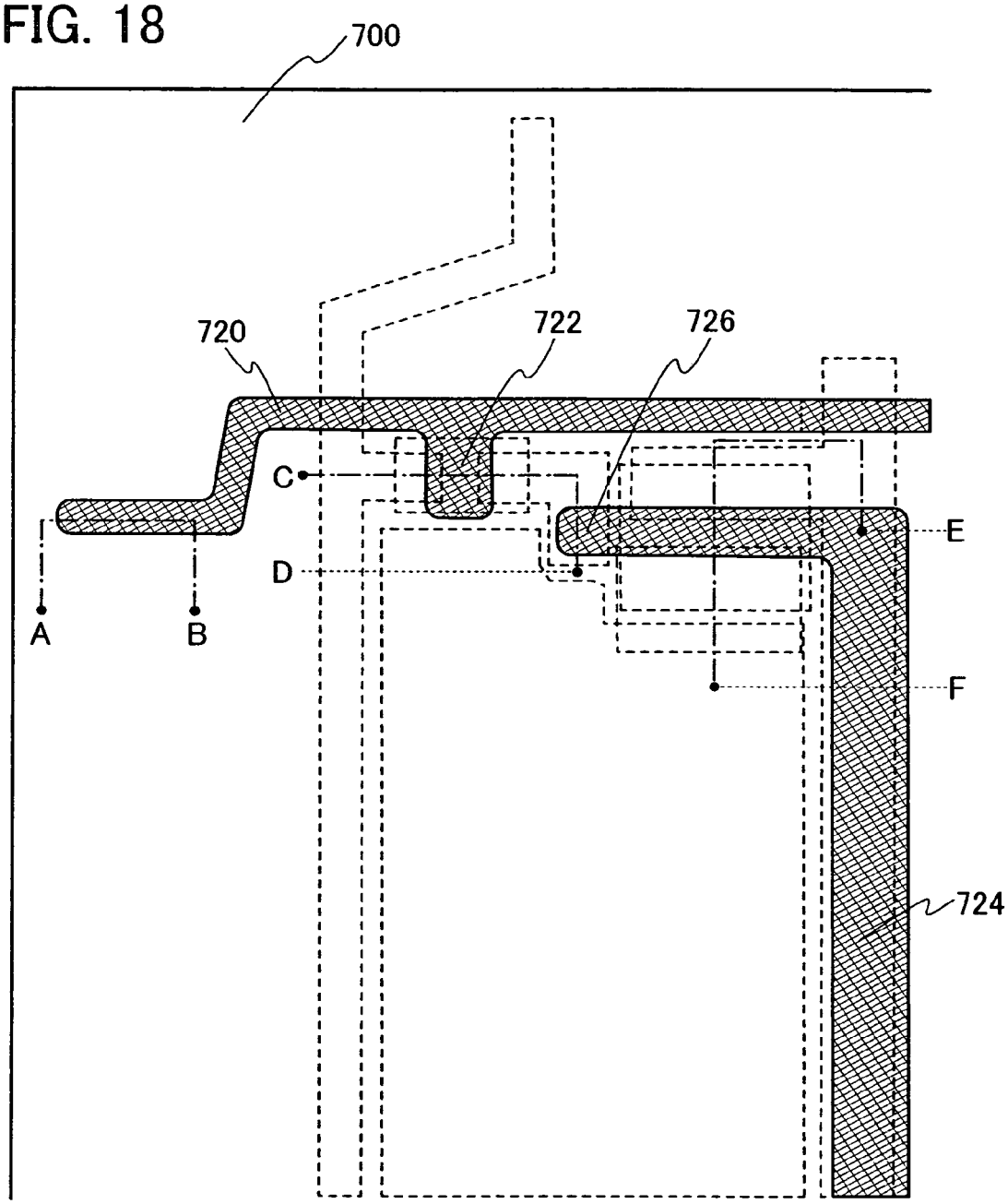

FIG. 17A shows a step in which a gate electrode, a gate wiring connected to the gate electrode, and a capacitor wiring are formed over a substrate 700 by a droplet discharging method. It is to be noted that FIG. 17A shows a vertical cross-sectional structure, and FIG. 18 shows a plane structure taken along lines A-B, C-D, and E-F.

The substrate 700 can be formed using a plastic substrate or the like having resistance to a processing temperature of this manufacturing process, in addition to a non-alkali glass substrate manufactured by a fusion method or floating method, such as barium borosilicate glass, alumino borosilicate glass, or aluminosilicate glass or a ceramic substrate. Moreover, a substrate in which an insulating layer is provided over a surface of a metal substrate such as a stainless steel alloy, may also be used.

A gate wiring 720, a gate electrode 722, a capacitor electrode 724, and a gate electrode 726 are formed over the substrate 700 by using a composition containing a conductive material by a printing method. As a conductive material forming these layers, a composition containing a metal particle as its main component, such as Ag (silver), Au (gold), Cu (copper), W (tungsten), or Al (aluminum) can be used. In particular, it is preferably to reduce resistance of the gate wiring; therefore, the gate wiring is preferably formed using a composition in which any of gold, silver and copper is dissolved or dispersed in a solvent, in consideration of a specific resistance value. More preferably, silver or copper having low resistance is used. The gate electrode is needed to be minutely formed; therefore, nano paste containing a particle having an average grain diameter of 5 to 10 nm is preferably used. The solvent corresponds to esters such as butyl acetate, alcohols such as isopropyl alcohol, an organic solvent such as acetone, and the like. The surface tension and viscosity are arbitrarily adjusted by adjusting a concentration of a solution or adding a surface active agent or the like.

A printing method applied in this embodiment mode includes a screen printing method, a droplet discharging method (also referred to as an ink jet method) discharging a microdot droplet, a dispenser method continuously supplying a small amount of droplet discharge while drawing a pattern, and the like. For example, a diameter of a nozzle used for a droplet discharging method is preferably set to be 0.02 to 100 µm (more preferably, 30 µm or less), and the amount of discharge of a composition discharged from the nozzle is preferably set to be 0.001 to 100 pl (more preferably, 10 pl or less). Although the droplet discharging method has two types that are an on-demand type and a continuous type, both types may be used. Furthermore, a nozzle used for a droplet discharging method has a piezoelectric method utilizing a property in which a piezoelectric substance is transformed by voltage application and a method by which a composition is boiled by a heater provided in the nozzle to be discharged, and both methods may be used. It is preferable that a distance between an object to be processed and a discharging opening of the nozzle be as short as possible in order to drop a droplet on a desired place. The distance is preferably set to be approximately 0.1 to 3 mm (more preferably 1 mm or less). One of the nozzle and the object to be processed moves while keeping the relative distance between the nozzle and the object to be processed to draw a desired pattern. Also, plasma treatment may be performed to a surface of the object to be processed before discharging the composition. This is because the surface of the object to be processed becomes hydrophilic or lyophobic by plasma treatment. For example, the surface of the object to be processed becomes hydrophilic to pure water and lyophobic to a paste in which alcohol is used as a solvent.

A step of discharging the composition may be performed under a reduced pressure because the solvent of the composition is volatilized while the composition is discharged and reaches the object to be processed, and thus, subsequent steps of drying and baking can be omitted or shortened. In addition, by positively using a gas in which 10 to 30% of oxygen in a partial pressure ratio is mixed in a baking step of a composition containing a conductive material, resistivity of a conductive film forming a gate electrode can be reduced, and the conductive film can be thinned and planarized.

After the composition is discharged, one or both of drying step and baking step are performed under a normal pressure or a reduced pressure by laser light irradiation, rapid thermal annealing, heating using a heating furnace, or the like. For example, both of drying and baking are heat treatment steps, and drying is performed at 100° C. for 3 minutes and baking is performed at 200 to 350° C. for 15 to 120 minutes. A substrate may be heated in advance in order to favorably perform drying and baking. Although a temperature at the time depends on a material of the substrate or the like, the temperature is set to be 100 to 800° C. (preferably, 200 to 350° C.). Through this step, fusion and welding are accelerated by hardening and shrinking a peripheral resin, after the solvent in the composition is volatilized or the dispersant is chemically removed. This step is performed under an oxygen atmosphere, a nitrogen atmosphere, or the air. However, an oxygen atmosphere in which a solvent in which a metal element is dissolved or dispersed is easily removed is preferable. A gas laser such as a continuous wave or pulsed gas laser, or a solid-state laser may be used for laser light irradiation. Rapid thermal annealing (RTA) is performed as follows: under an inert gas atmosphere, an infrared lamp, a halogen lamp, or the like is used, a temperature is rapidly increased, and heat is instantaneously applied within several micro seconds to several minutes. Since this treatment is instantaneously performed, only an outermost thin film can be substantially heated.

In this step, heat treatment may be performed by laser light irradiation or rapid thermal annealing in order to smooth surfaces of the formed gate wiring 720, gate electrode 722, capacitor electrode 724, and gate electrode 726, and especially in order to increase the fluidity of a superficial layer.

Nano paste has a conductive particle having a grain diameter of 5 to 10 nm dispersed or dissolved in an organic solvent, and dispersant and a thermal curing resin which is referred to as a binder are also included. A binder has a function of preventing crack or uneven baking during baking. By a drying step or a baking step, evaporation of the organic solvent, decomposition removal of dispersant, and hardening shrinking by the binder are concurrently proceed; accordingly, nano particles are fused and/or welded to each other to be cured. In this case, the nano particles grow to be several tens nm to hundred and several tens nm. Adjacent growing particles are fused and/or welded to each other to be linked, thereby forming a metal hormogone. On the other hand, most of remaining organic constituents (about 80 to 90%) are pushed out of the metal hormogone; consequently, a conductive film containing the metal hormogone and an organic constituent that covers an outer side thereof remain. The remaining organic constituent can be removed in baking a nano paste under an atmosphere containing nitrogen and oxygen by reaction of oxygen contained in the air and carbon, hydrogen or the like contained in a film formed of the organic constituent. In addition, in a case where oxygen is not contained in a baking atmosphere, the organic constituent can be removed by separately performing oxygen plasma treatment or the like. As described above, the remaining organic constituent is removed by baking the nano paste under an atmosphere containing nitrogen and oxygen or performing oxygen plasma treatment after drying; therefore, smoothing, thinning, and low resistance of a conductive film containing the remaining metal hormogone can be attempted. It is to be noted that, since a solvent in a composition is volatilized by discharging the composition containing a conductive material under a reduced pressure, time of subsequent heat treatment (drying or baking) can be shortened.

Figure 17B:
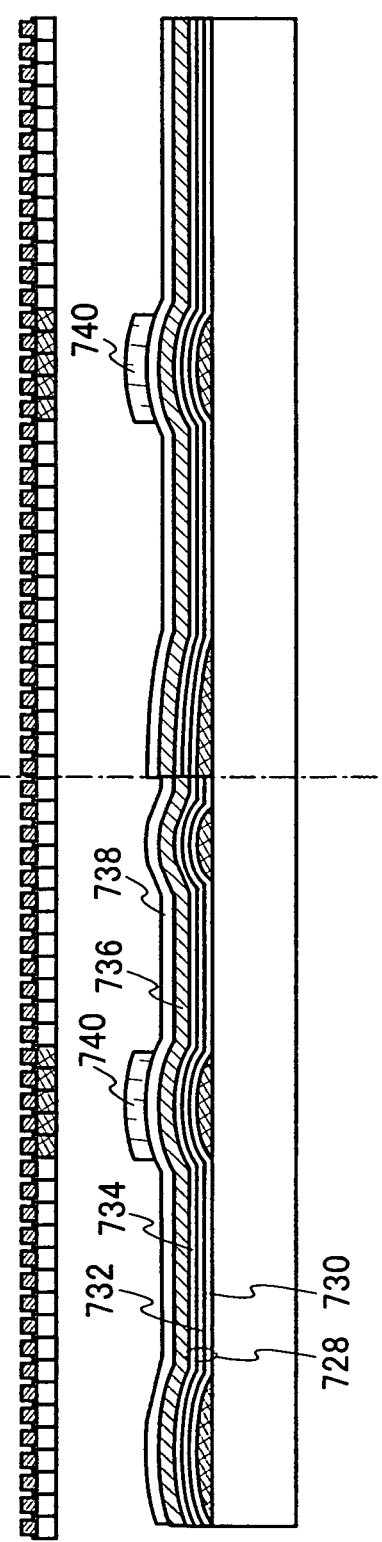

In FIG. 17B, a gate insulating layer 728 is formed of a single layer or a stacked layer by using a plasma CVD method or a sputtering method. As a preferable mode, three stacked layers including a first insulator layer 730 formed from silicon nitride, a second insulator layer 732 formed from silicon oxide, and a third insulator layer 734 formed from silicon nitride are formed as the gate insulating layer. It is to be noted that a rare gas element such as argon is contained in a reactive gas to be mixed into an insulating film that is formed, in order to form a dense insulating film with little gate leak current at a low deposition temperature. By forming the first insulator layer 730 that is in contact with the gate wiring 720, the gate electrode 722, the capacitor electrode 724, and the gate electrode 726 from silicon nitride or silicon nitride oxide, deterioration due to oxidation can be prevented.

Subsequently, a semiconductor layer 736 is formed. The semiconductor layer 736 is formed of a semiconductor that is manufactured by a vapor growth method or a sputtering method using a semiconductor material gas, typified by silane or germane. Typically, amorphous silicon or hydrogenated amorphous silicon can be used.

An insulator layer 738 is formed over the semiconductor layer 736 by a plasma CVD method or a sputtering method. This insulator layer 738 is left over the semiconductor layer 736 corresponding to the gate electrode 722 so as to be a channel protection layer, as shown in a subsequent step. It is preferable that the insulator layer 738 be formed of a dense film in order to prevent outside impurity such as metal or an organic substance and keep an interface between the insulator layer 738 and the semiconductor layer 736 clean. This insulator layer 738 is desirably formed at a low temperature. For example, a silicon nitride film that is formed by a plasma CVD method using silane or disilane, which is diluted with a rare gas such as argon by 100 to 500 times, can be formed of a dense film even at a deposition temperature of 100° C. or less, which is preferable.

In FIG. 17B, masks 740 are formed at positions which are over the insulator layer 738 and is opposed to the gate electrode 722 and the gate electrode 726, by selectively discharging a composition. The mask 740 is formed using a resin material such as an epoxy resin, an acrylic resin, a phenol resin, a novolac resin, a melamine resin, or urethane resin. In addition, the mask 740 is formed by a droplet discharging method using an organic material such as benzocyclobutene, parylene, or polyimide having a light transmitting property; a compound material made by polymerization of a siloxane-based polymer or the like; a composition material containing a water-soluble homopolymer and a water-soluble copolymer; or the like. Alternatively, a commercial resist material containing a photosensitizer may be used. For example, typically a positive type resist such as a novolac resin or a naphthoquinone diazide compound that is a photosensitizer, or a negative type resist such as a base resin, diphenylsilanediol, or an acid generator may be used. In using either material, the surface tension and the viscosity are appropriately controlled by performing dilution by a solution or adding a surface active agent or the like. Then, the insulator layer 738 is etched by using the mask 740 to form an insulator layer 742 serving as a channel protection layer.

Figure 19A:
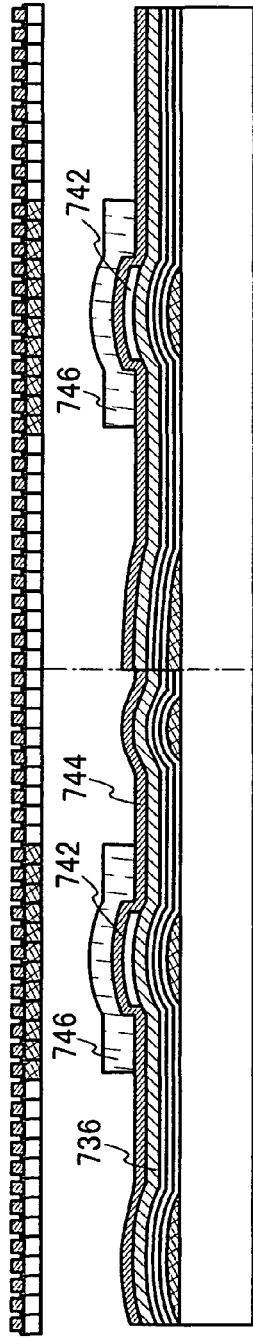
Figure 19B:
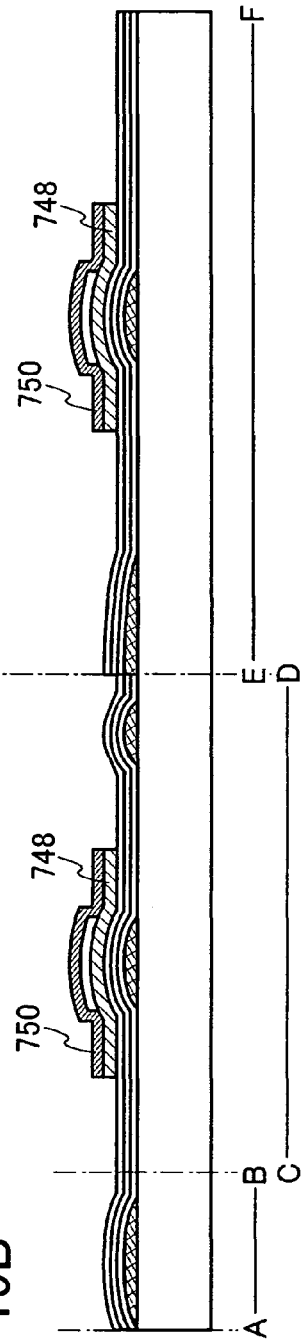
Figure 20:
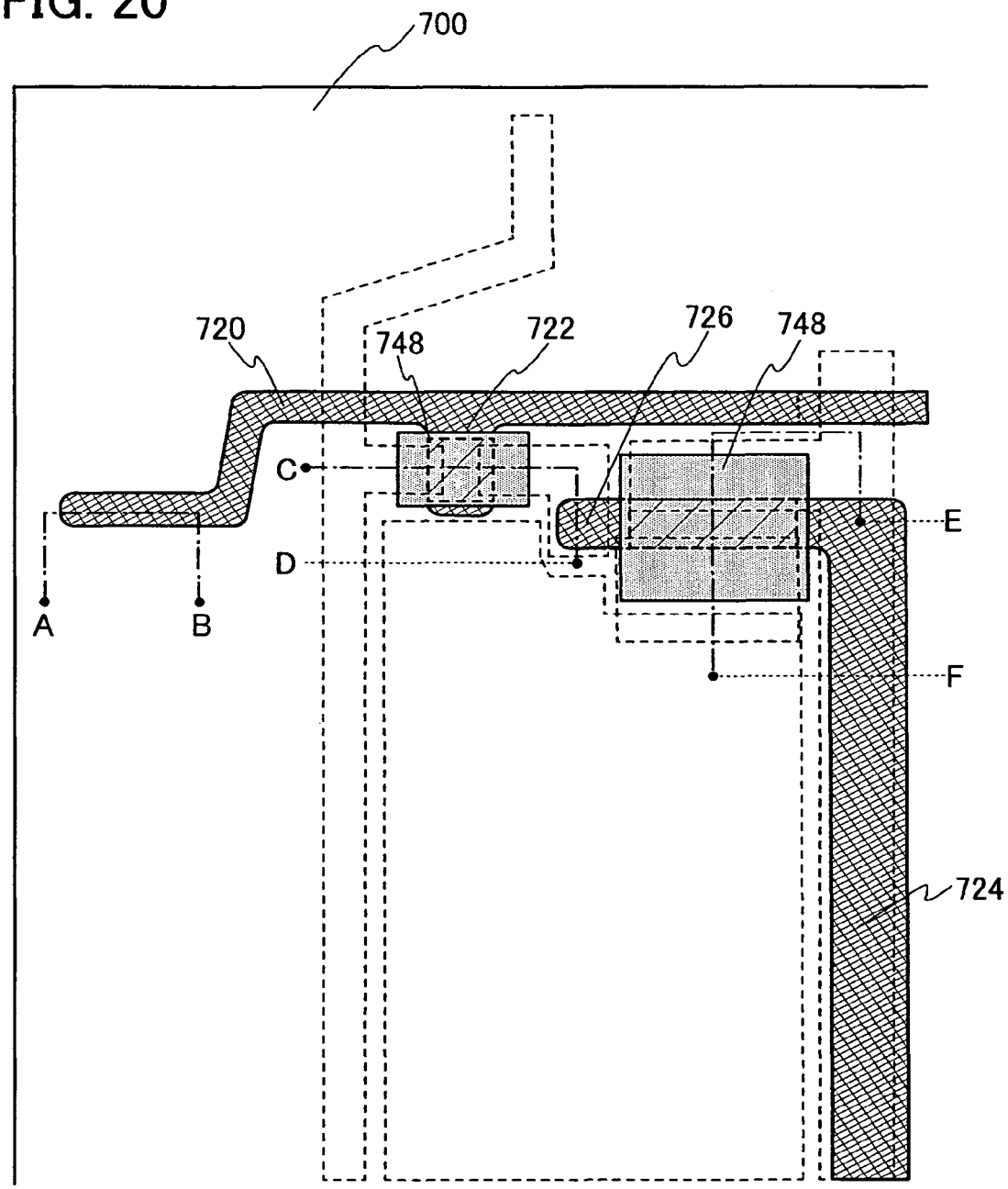

In FIG. 19A, the mask 740 is removed and an n-type semiconductor layer 744 is form over the semiconductor layer 736 and the insulator layer 742. In addition, masks 746 are formed over the n-type semiconductor layer 744 by a droplet discharging method. In FIG. 19B, the n-type semiconductor layer 744 and the semiconductor layer 736 are etched by using this mask 746 to form a semiconductor layer 748 and an n-type semiconductor layer 750. Further, a plane structure corresponding to lines A-B, C-D, and E-F in a vertical cross-sectional structure of FIG. 19B is shown in FIG. 20.

Further, as the semiconductor layer 748 formed in FIG. 19B, an organic semiconductor can be applied. As the organic semiconductor, a π-electron conjugated system high molecular material of which a skeleton is formed using a conjugated double bond is preferable used. Typically, a soluble high molecular material such as polythiophene, poly-fluorene, poly(3-alkylthiophene), a polythiophene derivative, or pentancene can be used. Such an organic semiconductor layer can be formed by a deposition device having the structure shown in Embodiment Modes 1 to 6. For example, in a case of using the evaporation source shown in FIGS. 4 to 6 in deposition by evaporation, the semiconductor layer 148 can be selectively formed from the beginning without using a shadow mask or the like.

Figure 19C:
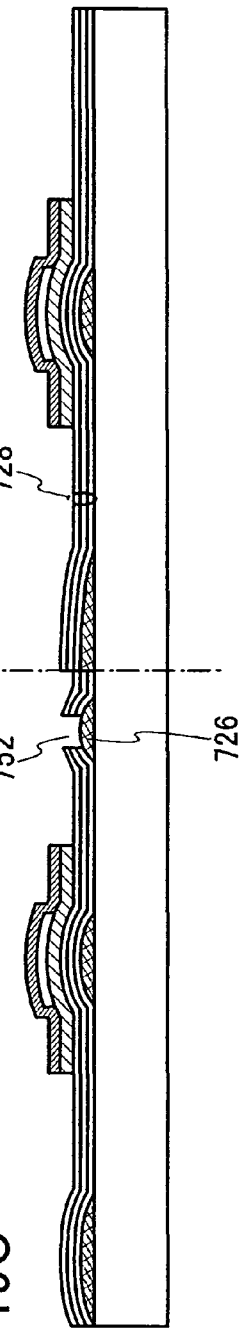

Subsequently, a through hole 752 is formed in the gate insulating layer 728 by an etching process as shown in FIG. 19C to expose part of the gate electrode 726 that is placed on a lower layer side of the gate insulating layer 728. The etching process may be performed using the same mask as the above-described mask by a droplet discharging method. Either plasma etching or wet etching may be employed for the etching process. Plasma etching is suitable for processing a large-sized substrate. As an etching gas, a fluorine-based gas or a chlorine-based gas such as $CF_4$, $NF_3$, $Cl_2$ or $BCl_3$ is used, to which He, Ar or the like may be appropriately added. Alternatively, electric discharge machining can be locally performed when the etching process is performed using atmospheric pressure discharge, where a mask is not needed to be formed over the entire surface of the substrate.

In FIG. 21A, a composition containing a conductive material is selectively discharged to form wirings 754, 756, 758, and 760 that are connected to a source region and a drain region, by a droplet discharging method. A plane structure taken along lines A-B and C-D in a vertical cross-sectional structure of FIG. 21A is shown in FIG. 22. As shown in FIG. 22, a wiring 774 extending from one end of a substrate 700 is concurrently formed. The wiring 774 is placed so as to be electrically connected to the wiring 754. In addition, as shown in FIG. 21A, in the through hole 752 formed in the gate insulating layer 728, the wiring 756 and the gate electrode 726 are electrically connected. As a conductive material for forming the wiring, a composition containing a metal particle such as Ag (silver), Au (gold), Cu (copper), W (tungsten), or Al (aluminum) as its main component can be used. Also, indium tin oxide (hereinafter, also referred to as "ITO") having a light transmitting property, indium tin oxide containing silicon oxide, organic indium, organotin, zinc oxide, titanium nitride, or the like may be combined.

In FIG. 21B, the n-type semiconductor layer 744 over the insulator layer 742 is etched using the wirings 754, 756, 758, and 760 as masks to form n-type semiconductor layers 762 and 764 that form a source region and a drain region.

Figure 23:
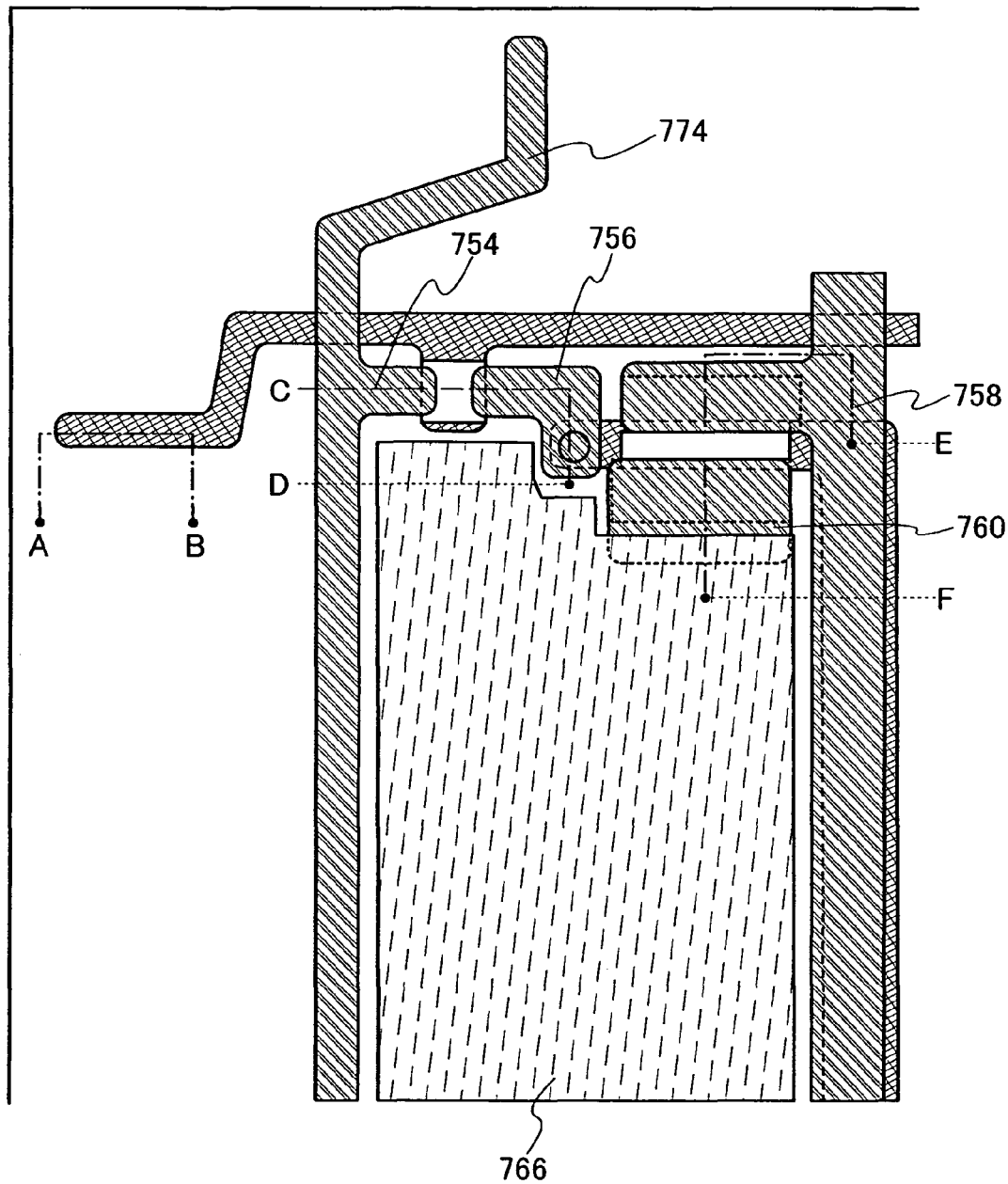

In FIG. 21C, a first electrode 766 corresponding to a pixel electrode is formed so as to be electrically connected to a wiring 772 by selectively discharging a composition containing a conductive material. Further, a plane structure corresponding to lines A-B, C-D, and E-F in a vertical cross-sectional structure of FIG. 21C is shown in FIG. 23.

The first electrode 766 is formed by a droplet discharging method. The first electrode 766 can be formed using a composition containing indium tin oxide (ITO), indium tin oxide containing silicon oxide, zinc oxide, tin oxide, or the like. Besides, a conductive film deposited by using a conductive oxide target in which indium oxide containing silicon oxide is mixed with 2 to 20% of zinc oxide may also be used. Then, a predetermined pattern is formed to form a pixel electrode by baking.

Moreover, the first electrode 766 may be formed using Ag (silver), Au (gold), Cu (copper), W (tungsten), Al (aluminum), or the like. In this case, light emitted from an EL layer is emitted in an opposite direction to the substrate 700.

Furthermore, a protection layer 768 formed from silicon nitride or silicon nitride oxide and an insulator layer 770 are formed over an entire surface. The insulator layer 770 is acceptable as long as it is an insulator that can be formed by a spin coating method, a dipping method, a printing method, or the like. The protection layer 768 and the insulator layer 770 are formed so as to cover an edge portion of the first electrode 766. A structure of the protection layer 768 and the insulator layer 770 shown in FIG. 21C can be formed by an etching process, and accordingly, a surface of the first electrode 766 is exposed. This etching is concurrently performed to the protection layer 768 and the gate insulating layer 728 that are below the insulator layer 770 so that the first electrode 766 and the gate wiring 720 are exposed.

The insulator layer 770 is formed to be provided with an opening of a through hole corresponding to a position where a pixel is formed corresponding to the first electrode 766. This insulator layer 770 can be formed using silicon oxide; silicon nitride; silicon oxynitride; aluminum oxide; aluminum nitride; aluminum oxynitride; or other inorganic insulating materials; acrylic acid; methacrylic acid; or a derivative thereof; a heat-resistant high molecular compound such as polyimide, aromatic polyamide, or polybenzimidazole; an inorganic siloxane based insulating material including a Si—O—Si bond among compounds containing silicon, oxygen, or hydrogen formed using a siloxane based material as a starting material; or an organic siloxane based insulating material in which hydrogen bonded to silicon is substituted by an organic group such as methyl or phenyl. When the insulator layer 770 is formed using a photosensitive or non-photosensitive material such as acrylic or polyimide, a side face of the insulator layer 770 has a shape in which a curvature radius changes continuously, and an upper layer thin film is formed without breaking, which is preferable.

By the above steps, an element substrate 800 for an EL display panel, over which a bottom gate type (also referred to as an inversely staggered type) TFT and the first electrode are connected to each other, is completed.

Figure 24:
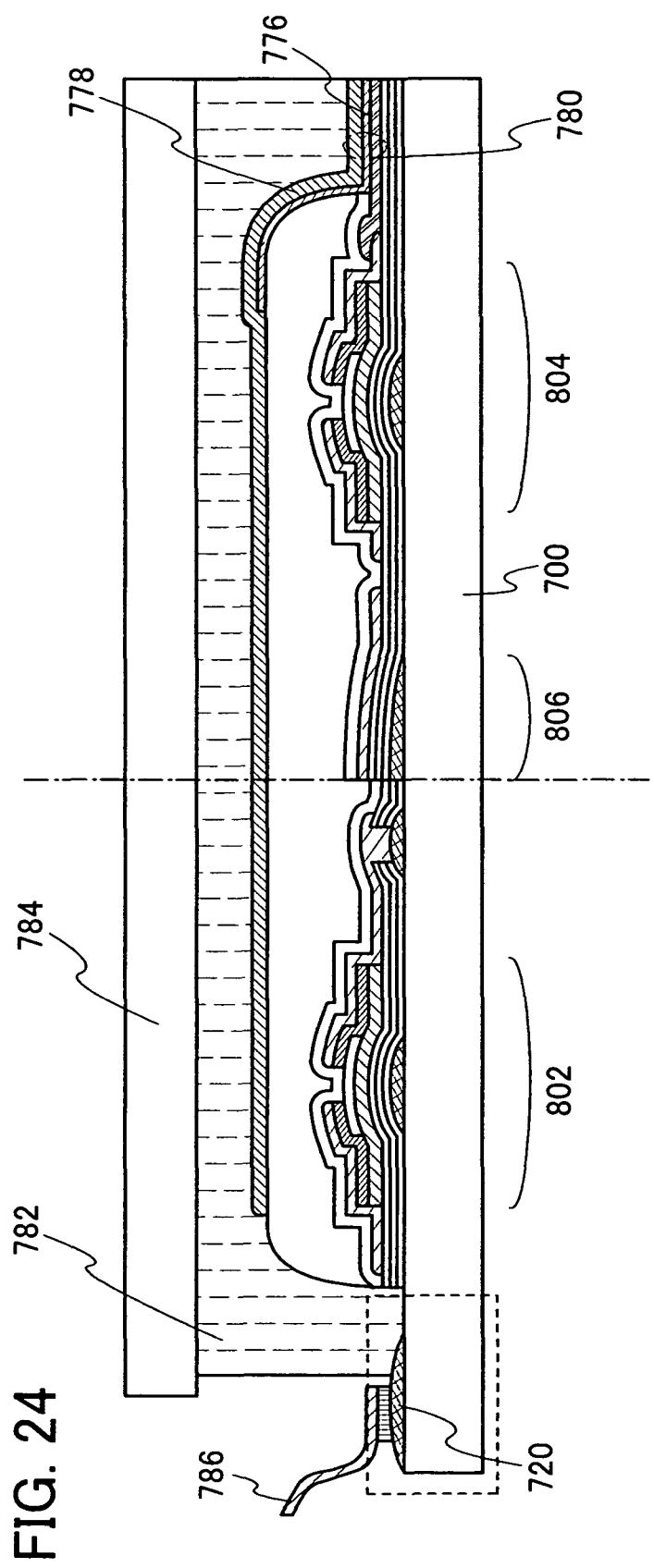

FIG. 24 shows a mode in which an EL layer 776 is formed over the element substrate 800 and a sealing substrate 784 is combined. Before forming the EL layer 776, heat treatment is performed at 100° C. or more in an atmospheric pressure to remove moisture in the insulator layer 770 or attached to a surface thereof. In addition, it is preferable that heat treatment be performed under a reduced pressure at 200 to 400° C., preferably 250 to 350° C. to form the EL layer 776 without being exposed to the atmospheric air. For example, the EL layer described in Embodiment Mode 7 can be applied to the detail of the EL layer 776. In this case, the EL layer can be formed by a deposition device having the structure shown in Embodiment Modes 1 to 6. For example, when the evaporation source shown in FIGS. 4 to 6 is used in deposition by evaporation, the EL layer 776 can be selectively formed without using a shadow mask or the like.

Subsequently, a sealing material 782 is formed and sealing is performed by using the sealing substrate 784. Thereafter, a flexible wiring board 786 may be connected to the gate wiring 720.

As described above, in this embodiment mode, a transistor can be manufactured without using a light exposure process using a photomask and a light emitting device in which an EL element is combined can be manufactured. In this embodiment mode, all or part of treatment such as resist application, exposure, or development that relate to a light exposure process can be omitted. In addition, by directly forming various patterns over a substrate by a droplet discharging method, an EL display panel can be easily manufactured even in a case of using a glass substrate of the fifth generation or later having a side that is longer than 1000 mm.

Embodiment Mode 11

In this embodiment mode, an example of a light emitting device that can be manufactured by the deposition device shown in Embodiment Modes 1 to 6 will be described with reference to drawings. In particular, in this embodiment mode, a light emitting device of which a manufacturing process of an element substrate including a channel etching type transistor includes a step of forming a predetermined pattern without using a photomask at least as part will be explained with reference to drawings.

In FIG. 25A, a composition containing a conductive material is formed by a printing method over a substrate 700 to form a gate wiring 720, a gate electrode 722, a capacitor electrode 724, and a gate electrode 726. Then, a gate insulating layer 728 is formed of a single layer or a stacked layer by using a plasma CVD method or a sputtering method. The gate insulating layer 728 may be formed using silicon nitride or silicon oxide similarly to Embodiment Mode 10. In addition, a semiconductor layer 736 serving as an active layer is formed.

Then, an n-type semiconductor layer 744 is formed over the semiconductor layer 736. A resist composition is selectively discharged over the n-type semiconductor layer 744 to form a mask 788. Subsequently, the semiconductor layer 736 and the n-type semiconductor layer 744 are etched by using the mask 788.

In FIG. 25B, a composition containing a conductive material is discharged in accordance with arrangement of the semiconductor layer that is patterned by etching to form wirings 754, 756, 758, and 760. The n-type semiconductor layer is etched by using theses wirings as masks. Each of n-type semiconductor layers 762 and 764 remaining in a portion overlapped with the wirings 754, 756, 758, and 760 become a layer including a region serving as a source or drain. A semiconductor layer 790 includes a region for forming a channel and is formed in contact with the n-type semiconductor layers 762 and 764. Further, before this etching process, a through hole 752 is formed in part of the gate insulating layer 728 to expose part of the gate electrode 726 that is placed on a lower layer side of the gate insulating layer 728 similarly to Embodiment Mode 10, whereby a connecting structure of the wiring 756 and the gate electrode 726 can be formed.

In FIG. 25C, a composition containing a conductive material is discharged to form a first electrode 766 so as to be electrically connected to the wiring 760.

Figure 26:
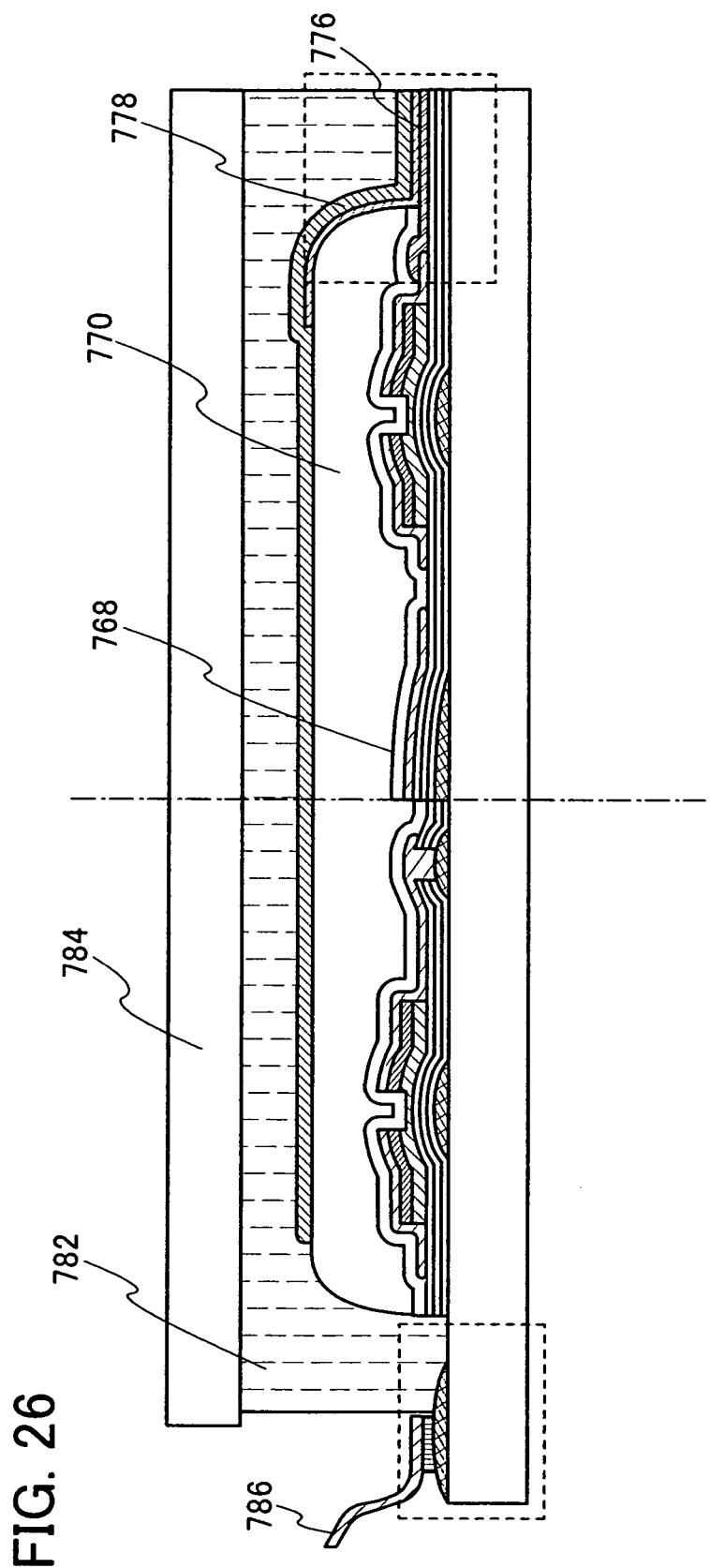

In FIG. 26, a protection layer 768, an insulator layer 770, an EL layer 776, and a second electrode 778 are formed similarly to Embodiment Mode 10. Furthermore, a sealing material 782 is formed, and then, sealing is performed by using a sealing substrate 784. Thereafter, a flexible wiring board 786 may be connected to the gate wiring 720. As described above, a light emitting device having a display function can be manufactured.

Embodiment Mode 12

Figure 27:
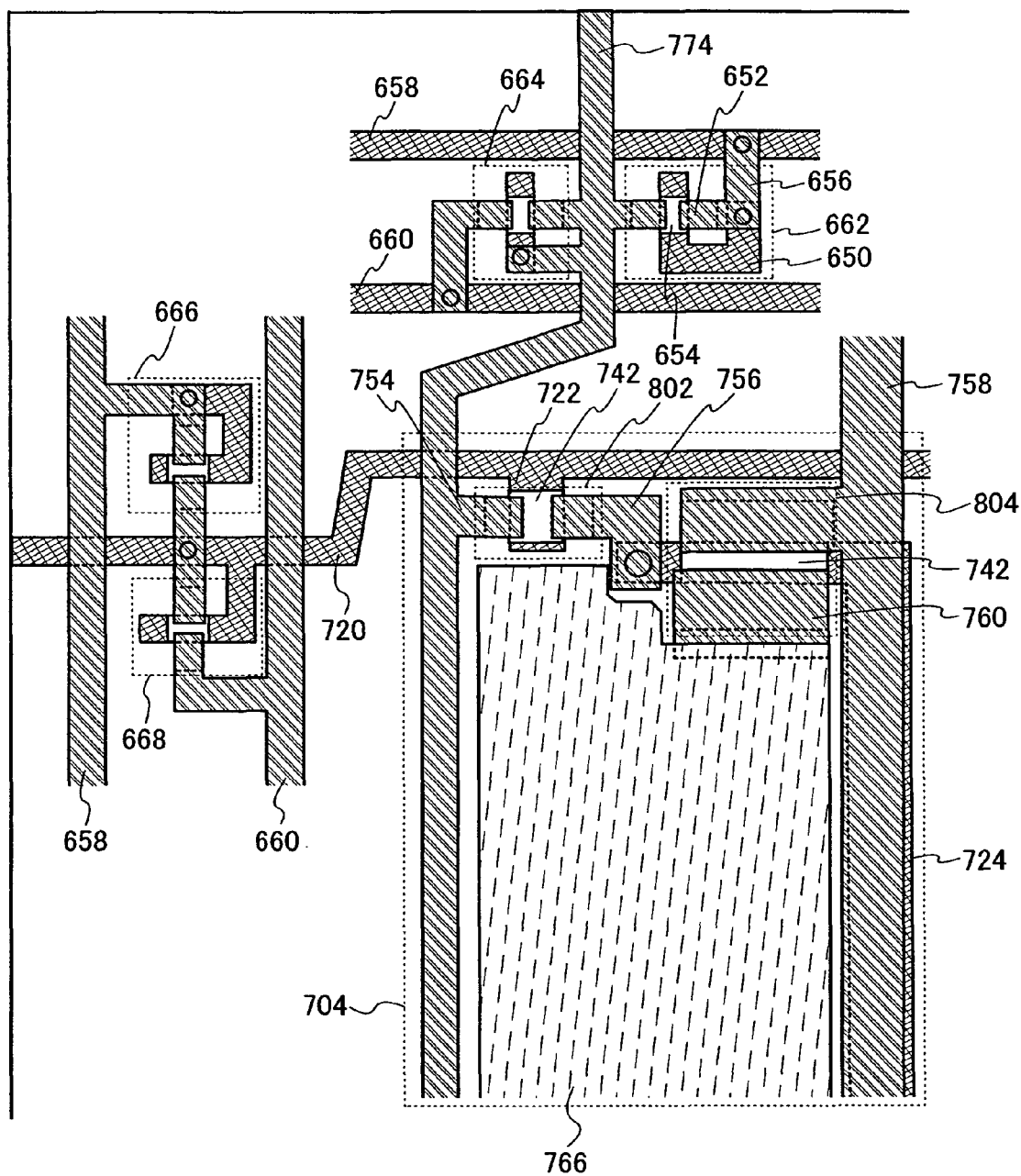
FIG. 27 shows a top view for explaining a manufacturing step of a light emitting device according to Embodiment Mode 12.

A mode of the display device shown in Embodiment Modes 10 and 11, in which a protection diode is provided in a scanning line input terminal portion and a signal line input terminal portion, will be explained with reference to FIG. 27. In FIG. 27, a switching transistor 802, a driving transistor 804, and a capacitor 806 are provided in a pixel 704.

Figure 28:
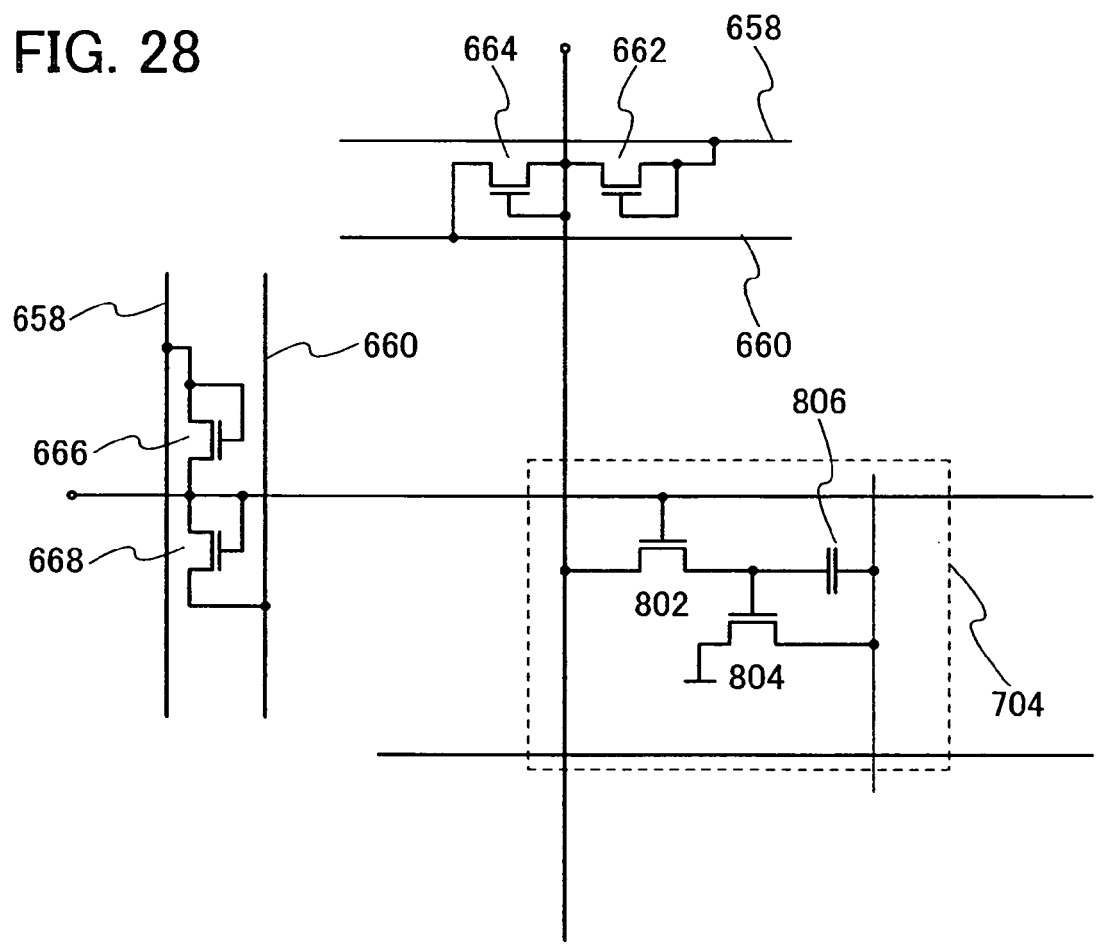
FIG. 28 shows an equivalent circuit diagram for explaining a manufacturing step of a light emitting device according to Embodiment Mode 12.

Protection diodes 662 and 664 are provided in the signal line input terminal potion. This protection diode is manufactured by the same step as that of the switching transistor 802 and the driving transistor 804. A gate of a transistor is connected to a drain or a source; accordingly, each of the protection diodes 662 and 664 operates as a diode. It is to be noted that FIG. 28 shows an equivalent circuit of a top view shown in FIG. 27.

The protection diode 662 includes a gate electrode 650, a semiconductor layer 652, an insulating layer 654 for channel protection, and a wiring 656. The protection diode 664 has the same structure as that of the protection diode 662. Common potential lines 658 and 660 that are connected to this protection diode 662 are formed of the same layer as the gate electrode. Accordingly, in order to be electrically connected to the wiring 656, a contact hole is needed to be formed in the gate insulating layer.

In order to form a contact hole in the gate insulating layer, a mask may be formed by a droplet discharging method and an etching process may be performed. In this case, when an etching process using atmospheric pressure discharge is applied, electric discharge machining can be locally performed, and a mask is not needed to be formed over an entire surface of a substrate. A signal wiring 774 is formed of the same layer as a wiring 754 in the switching transistor 802, and has a structure in which the signal wiring 774 connected to the wiring 754 is connected to a source or drain side.

Protection diodes 666 and 668 in an input terminal portion on the scanning signal line side have the same structure. In such a manner, the protection diodes provided for an input stage can be formed at the same time.

Embodiment Mode 13

In this embodiment mode, arrangement of a pixel in a display portion of the light emitting device shown in Embodiment Modes 8 to 12 and an evaporation method of an EL layer corresponding to the pixel will be explained with reference to FIG. 29 and FIG. 30.

Figure 29:
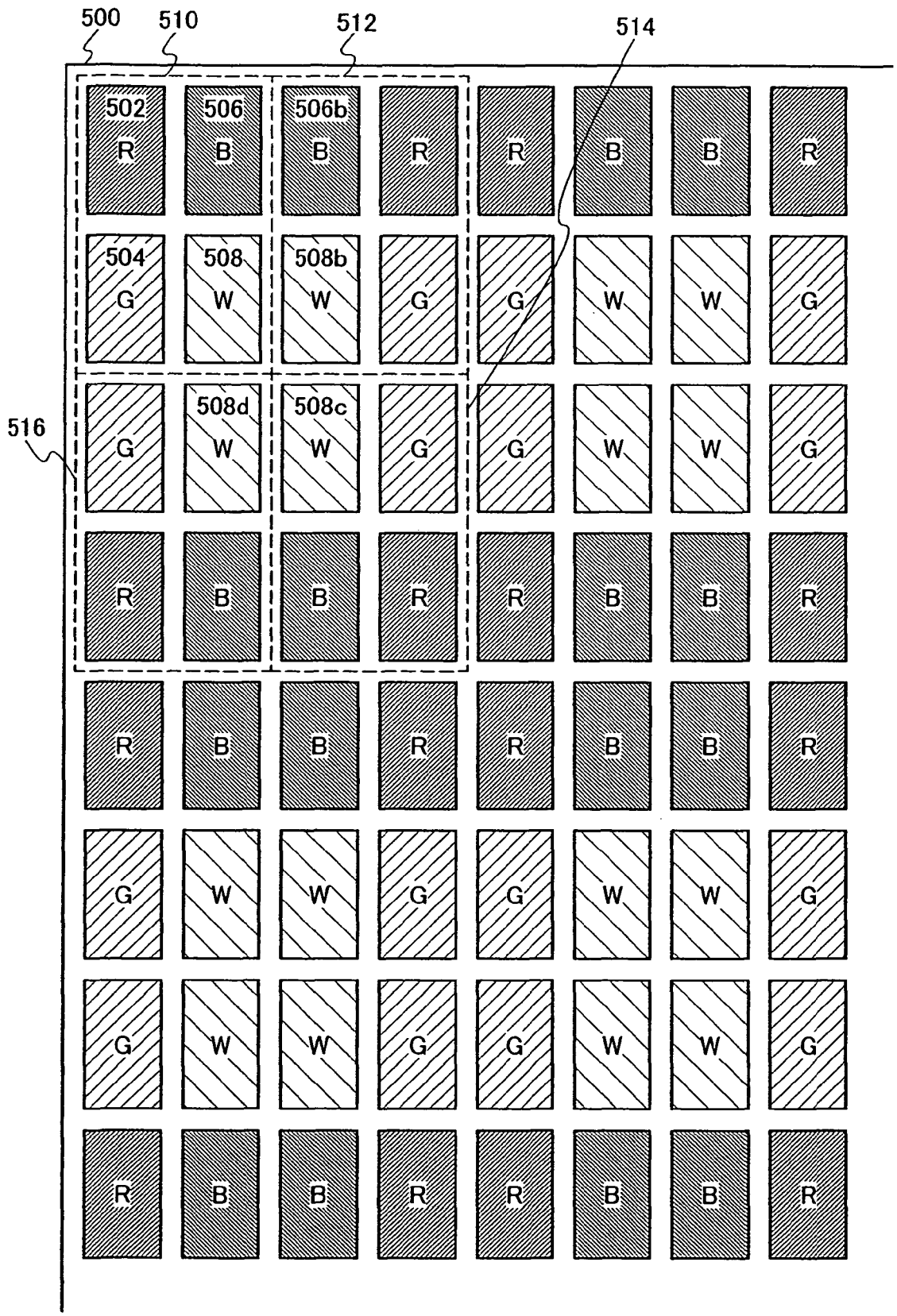
FIG. 29 shows a view for explaining a manufacturing step of a light emitting device according to Embodiment Mode 13.

In FIG. 29, a display portion 500 has a picture element 510 including a plurality of pixels with different light emission colors. In the picture element 510, a pixel (R) 502, a pixel (G) 504, a pixel (B) 506, and a pixel (W) 508 are included. The pixel (R) 502 is provided with an EL element emitting light with a red color, the pixel (G) 504 is provided with an EL element emitting light with a green color, the pixel (B) 506 is provided with an EL element emitting light with a blue color, and the pixel (W) 508 is provided with an EL element emitting light with a white color. It is to be noted that a combination of the pixels shown here is one example of possible combinations, and the picture element 510 can be formed by various combinations of the pixels such as a structure in which pixels that emit three colors corresponding to so-called RGB color display are provided or a structure in which a complementary color is added thereto.

A picture element 512 adjacent to the picture element 510 similarly includes a pixel (R), a pixel (G), a pixel (B), and a pixel (W); however, arrangement inside the picture element 512 is different from that of the picture element 510. In other words, the pixel (B) 506 of the picture element 510 is arranged so as to be adjacent to a pixel (B) 506b of the picture element 512, and the pixel (W) 508 of the picture element 510 is arranged so as to be adjacent to a pixel (W) 508b of the picture element 512. A picture element 514 adjacent to the picture element 512 has the similar arrangement of pixels. Further, a picture element 516 adjacent to the picture elements 510 and 514 has the similar arrangement.

By employing such arrangement, a plurality of pixels that emit light with the same color can be assembled to be arranged. For example, in FIG. 29, the pixel (W) 508, the pixel (W) 508b, a pixel (W) 508c, and a pixel (W) 508d each belonging to a different picture element are adjacent to each other to be arranged.

Each EL element included in the pixel (R) 502, the pixel (G) 504, the pixel (B) 506, and the pixel (W) 508 has a different EL layer structure so as to emit light with a different color. In this case, a hole injecting layer, a hole transporting layer, an electron injecting layer, an electron transporting layer, or the like is common in each EL layer, and a material of a light emitting layer is different in each EL layer.

When a display portion is formed by arranging a plurality of pixels emitting light with a different color, a shadow mask can be used for forming an EL layer as shown in Embodiment Mode 8. The shadow mask is provided with an opening in a region where a film is desired to be formed, and the opening is placed in accordance with arrangement of pixels.

Figure 30:
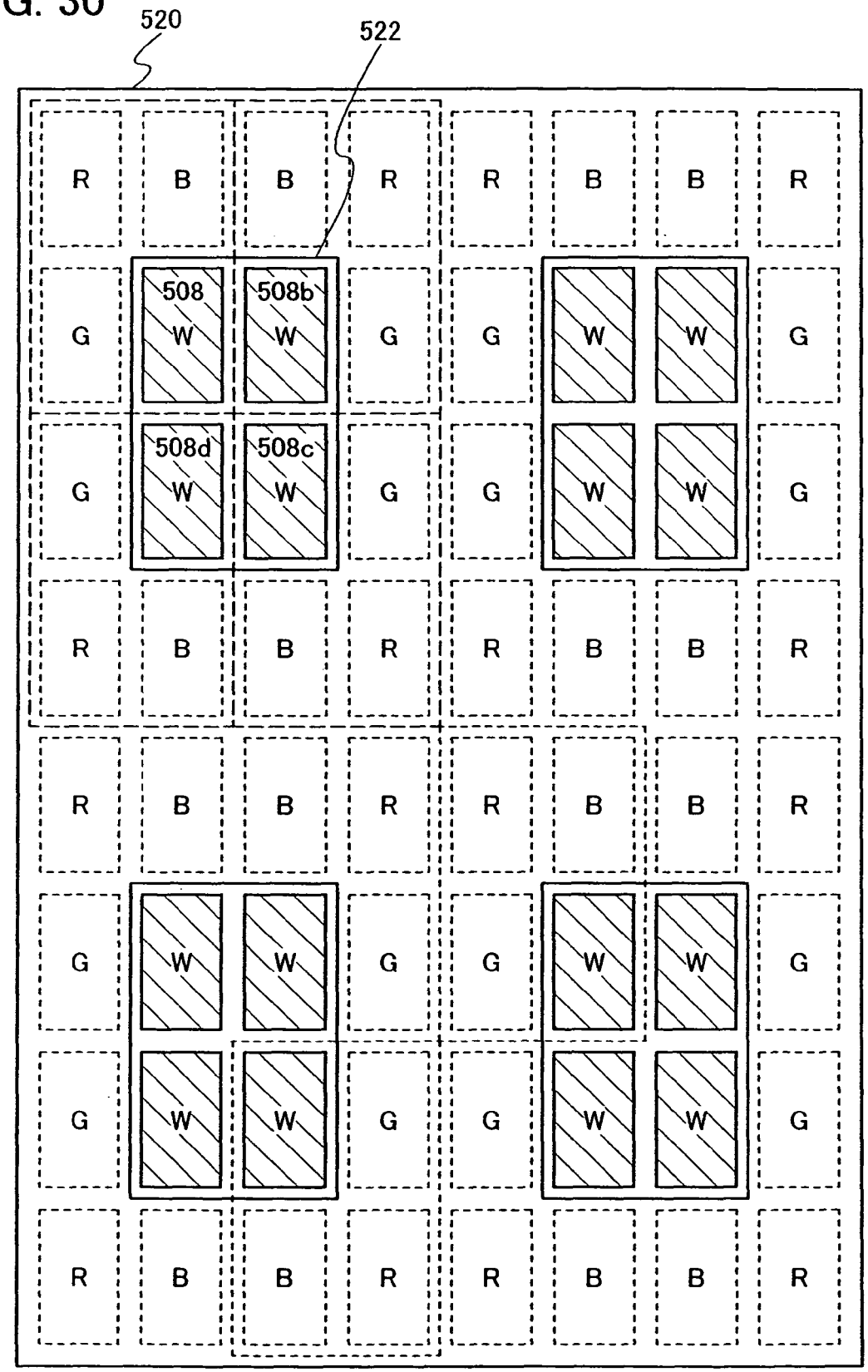
FIG. 30 shows a view for explaining a manufacturing step of a light emitting device according to Embodiment Mode 13.

FIG. 30 shows an example of such a shadow mask. In a shadow mask 520, an opening portion 522 is formed in accordance with arrangement of pixels. The opening portion 522 in the shadow mask 520 is arranged in accordance with the arrangement of the pixels in order to make a light emitting layer different in each pixel depending on an emission color, for example. In FIG. 30, the opening portion 522 is arranged so as to be placed in the pixel (W) 508b, the pixel (W) 508c, and the pixel (W) 508d. In this case, the pixels emitting light with the same color, which belong to different picture elements from each other, are arranged to be adjacent to each other, whereby the opening portion 522 can be made large. Consequently, the opening portions 522 are not needed to be densely formed; accordingly, processing accuracy of the shadow mask 520 can be not strict so that miniaturization of pixels can be flexibly dealt with.

Further, by arranging the pixels in such a manner, a distance between pixels can be decreased. This is because a plurality of pixels emitting light with the same color can be placed in one opening portion 522 of the shadow mask 520.

When light emitting layers emitting light with different colors are formed, a position of the shadow mask 520 is shifted, whereby the adjacent pixels can be arranged as the same as the above.

By applying such arrangement of the pixel and a shadow mask corresponding to the arrangement to the deposition device shown in Embodiment Modes 1 to 7, deposition can be continuously performed with in-plane uniformity of an evaporation film even in a case of using a large-sized glass substrate having a side that is longer than 1000 mm. Further, the evaporation material is not needed to be supplied to the evaporation source every time the evaporation material runs out; therefore, throughput can be improved.

Embodiment Mode 14

In this embodiment mode, an example of a deposition method for forming a film by the deposition device shown in Embodiment Modes 1 to 6 will be explained.

A size of a substrate over which a film such as an EL layer is formed is not limited. For example, glass substrates of the sixth generation having a size of 1500 mm×1800 mm, the seventh generation having a size of 1870 mm×2200 mm, and the eighth generation having a size of 2160 mm×2400 mm can be applied as a substrate for a television having a large-sized screen. As a matter of course, a glass substrate of the following generations, that is, a larger-sized glass substrate, can also be applied.

Figure 31:
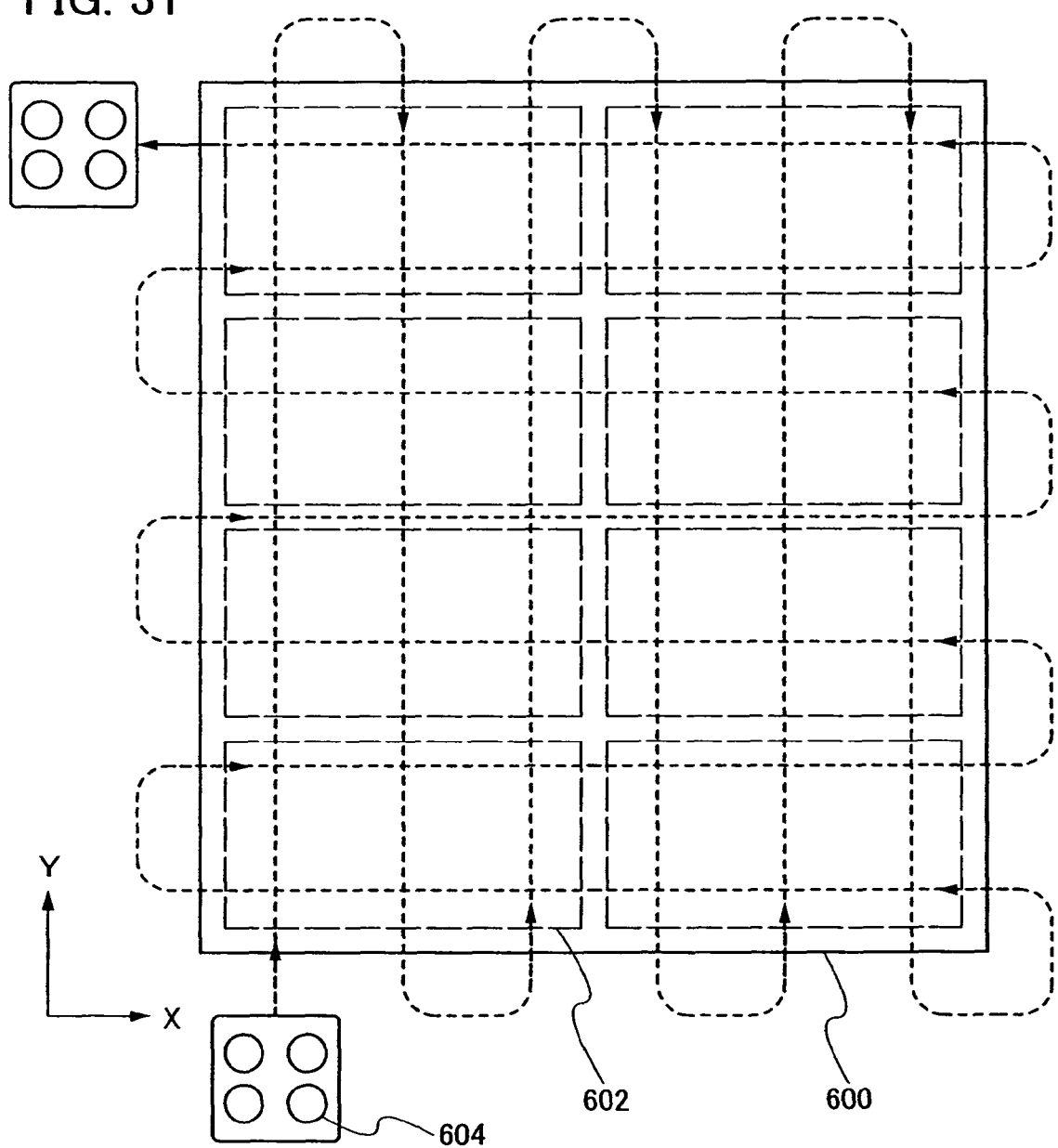
FIG. 31 shows a view for explaining a deposition method in Embodiment Mode 14.

FIG. 31 shows, as one example, a substrate 600 of the eighth generation having a size of 2160 mm×2400 mm where eight panels of 40-inches can be obtained. A plurality of element substrates 602 for each forming a screen of 40-inch-class is arranged over this substrate 600, for example.

With respect to such a substrate 600, an evaporation source 604 performs evaporation while moving so as to form a uniform evaporation film to at least a main surface over which the element substrate 602 is formed. The operation is shown by a dotted line in FIG. 31. Reciprocation in one direction (Y direction) is performed, by shifting a scanning axis, to a main surface of the substrate 600. After deposition treatment of the main surface of the substrate 600 by such operation of the evaporation source 604 is terminated, a similar scan may be further performed by changing a direction of reciprocation (X direction). As described above, by changing the scanning direction, uniformity of an evaporated film can be enhanced.

It is to be noted that the scan by the evaporation source to the substrate is explained in this embodiment mode; however, a method in which the substrate is moved by fixing the evaporation source (Embodiment Mode 2) may be employed, or a method in which both the substrate and the evaporation source are moved (Embodiment Mode 3) may be employed.

Embodiment Mode 15

Figure 32:
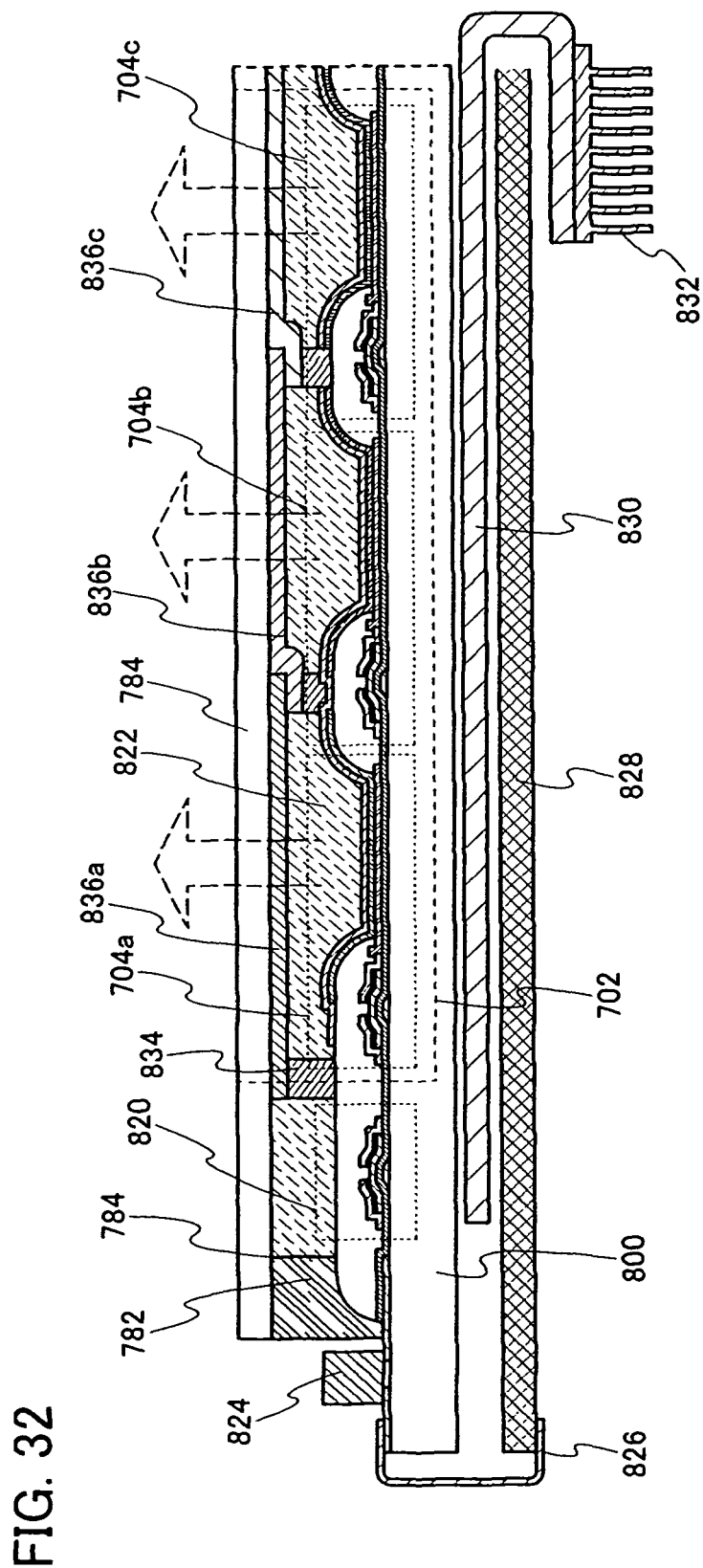
FIG. 32 shows a view for explaining a mode of a light emitting device according to Embodiment Mode 15.
Figure 33:
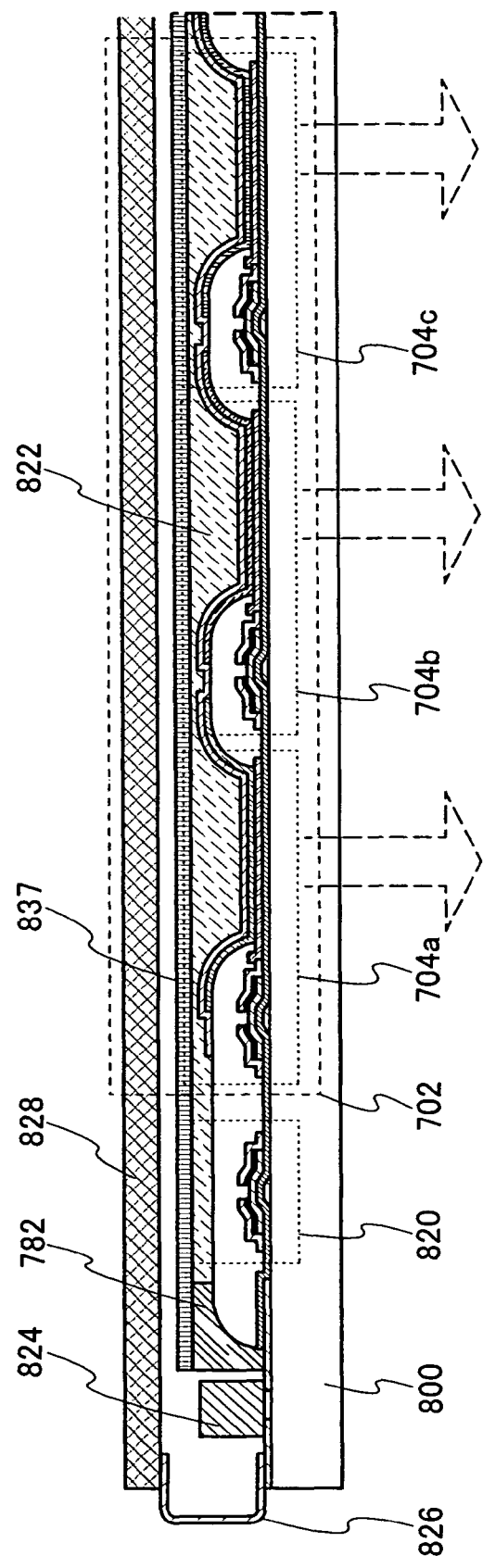
FIG. 33 shows a view for explaining a mode of a light emitting device according to Embodiment Mode 15.

FIG. 32 and FIG. 33 show an example of a module in which a driving circuit or the like is mounted over the element substrate 800 shown in Embodiment Modes 12, 13, and 14. In FIG. 32 and FIG. 33, a pixel portion 702 including pixels 704a, 704b, and 704c is formed over the element substrate 800.

In FIG. 32, a protection circuit 820 is formed by using a transistor as similar to one formed in the pixel or a diode connecting a gate and a source of the transistor, which is provided outside the pixel portion 702 and between a driving circuit 824 and the pixel 704. For the driver circuit 824, a driver IC formed of a single crystalline semiconductor, a stick driver IC formed of a polycrystalline semiconductor film over a glass substrate, or the like can be applied.

The element substrate 800 is firmly attached to a sealing substrate 784 with a spacer 834 interposed therebetween, which is formed by a droplet discharging method. The spacer is preferably provided in order to keep a distance between two substrates constantly even in a case where a thickness of the substrate is thin and an area of the pixel portion becomes large. A gap over an EL element 780 and between the element substrate 800 and the sealing substrate 784 may be filled with a resign material that has a light transmitting property to be solidified or may be filled with anhydrous nitrogen or an inert gas.

In FIG. 32, a case where an EL element has a top emission structure is shown, in which light is emitted in a direction shown by an arrow in the drawing. Multicolor display can be performed by making pixels 704a, 704b, and 704c emit light with different colors of red, green, and blue, respectively. In addition, by forming a coloring layer 836a, a coloring layer 836b, and a coloring layer 836c each of which corresponds to each color on a sealing substrate 784 side, color purity of light emitted to outside can be enhanced. Moreover, the coloring layers 836a, 836b, and 836c may be combined with the pixels 704a, 704b, and 704c that are white EL elements.

An external circuit 828 is connected to a scanning line or a signal line connecting terminal that is provided at one edge of the element substrate 800 with a wiring board 826. In addition, a heat pipe 830 and a heat sink 832 are provided so as to be in contact with or adjacent to the element substrate 800 to obtain a structure for enhancing a heat dissipation effect.

It is to be noted that a top emission EL module is shown in FIG. 32; however, a bottom emission structure may also be used by changing a structure of the EL element or a position of an external circuit board.

FIG. 33 shows an example in which a sealing structure is formed by attaching a resin film 837 on a side where a pixel portion is formed with the use of a sealing material 782 or an adhesive resin 822 over an element substrate 800. A gas barrier film for preventing transmission of moisture vapor is preferably provided over a surface of the resin film 837. Although a bottom emission structure in which light from the EL element is emitted through the substrate is shown in FIG. 33, a top emission structure can be employed by making the resin film 837 and the adhesive resin 822 have a light transmitting property. In any case, by employing a film sealing structure, a thinner and lightweight display device can be achieved.

Embodiment Mode 16

Figure 34:
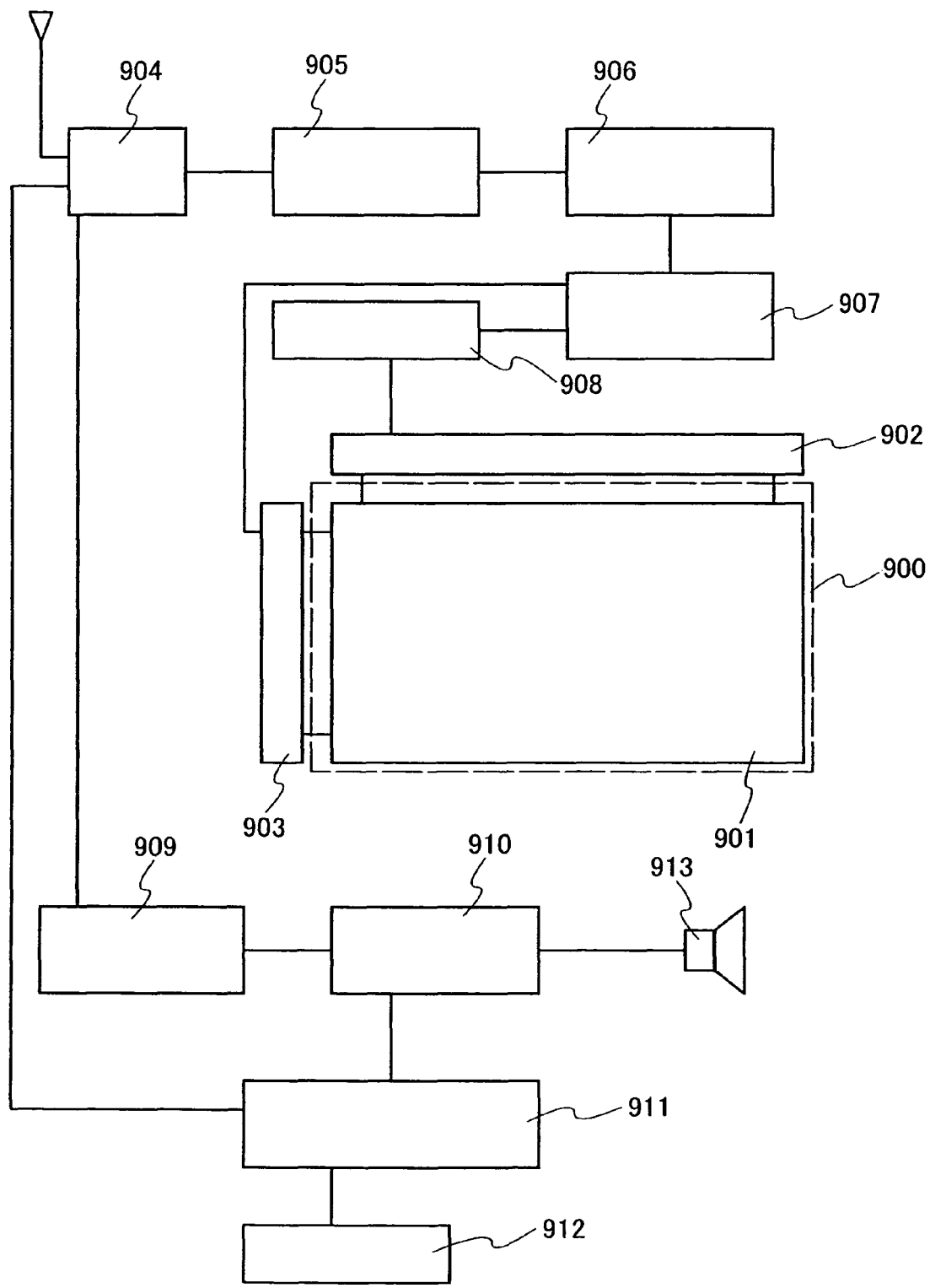
FIG. 34 shows a view for explaining a structure of a television device according to Embodiment Mode 16.

A television device can be completed by a module manufactured by Embodiment Mode 15. FIG. 34 shows a block diagram for showing a main structure of a television device. A pixel portion 901 is formed over an element substrate 900. A signal line driver circuit 902 and a scanning line driver circuit 903 may be mounted on the element substrate 900 by a COG method.

As a structure of another external circuit, a video signal amplifier circuit 905 that amplifies a video signal among signals received in a tuner 904, a video signal processing circuit 906 that converts the signal outputted from the video signal amplifier circuit 905 into a chrominance signal corresponding to each color of red, green, and blue, a control circuit 907 that converts the video signal into an input specification of a driver IC, and the like are provided on a video signal input side. The control circuit 907 outputs signals into both a scanning line side and a signal line side. In a case of a digital driving, a signal dividing circuit 908 may be provided on the signal line side and an input digital signal may be divided into m pieces to be supplied.

Among the signals received in the tuner 904, an audio signal is transmitted to an audio signal amplifier circuit 909, and the output is supplied to a speaker 913 through an audio signal processing circuit 910. A control circuit 911 receives control information on a receiving station (reception frequency) and sound volume from an input portion 912 and transmits a signal to the tuner 904 and the audio signal processing circuit 910.

Figure 35:
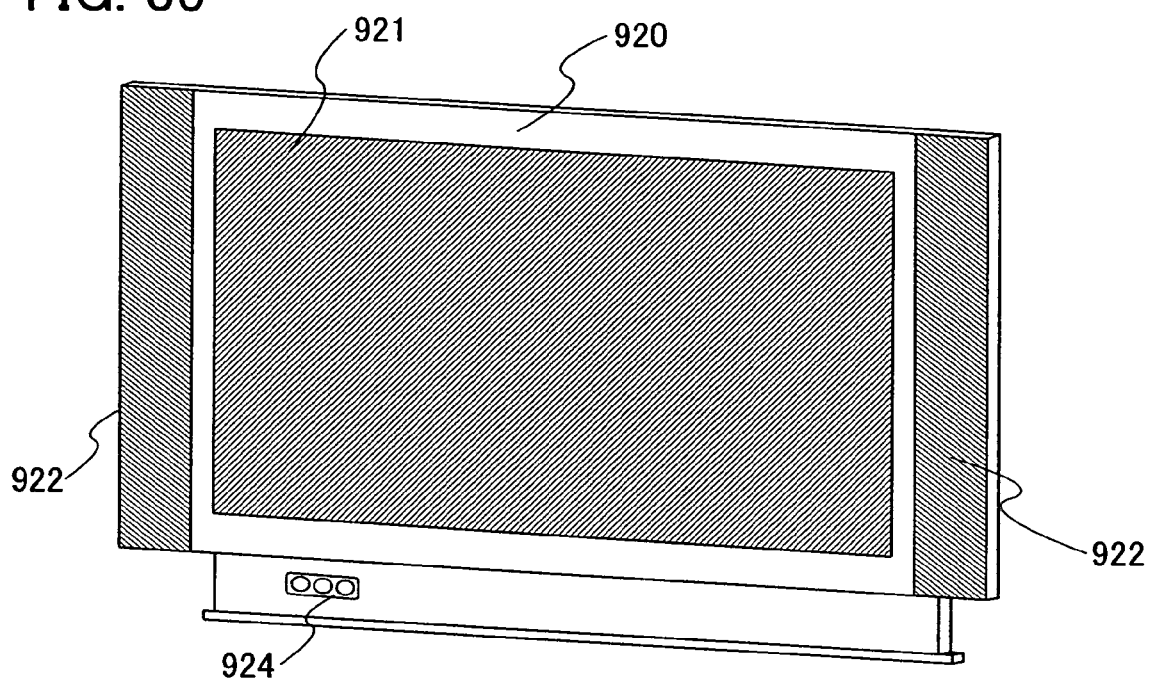
FIG. 35 shows a view for explaining a structure of a television device according to Embodiment Mode 16.

A module described in FIG. 32 and FIG. 33, on which such an external circuit is mounted, is incorporated in a chassis 920 as shown in FIG. 35, whereby a television device can be completed. A display screen 921 is formed by using the module, and in addition, a speaker 922, operation switches 924, and the like are provided as an attachment system. In such a manner, a television device can be completed by the present invention.

As a matter of course, the present invention is not limited to the television device, and the present invention can be applied to various use applications as a large-area display medium such as an information display board at a train station, an airport, or the like, or an advertisement display board on the street, as well as a monitor of a personal computer.

Embodiment Mode 17

In this embodiment mode, an example of a cellular phone in which any one of the display modules shown in Embodiment Mode 16 is used will be explained with reference to FIG. 36 and FIG. 37.

Figure 36:
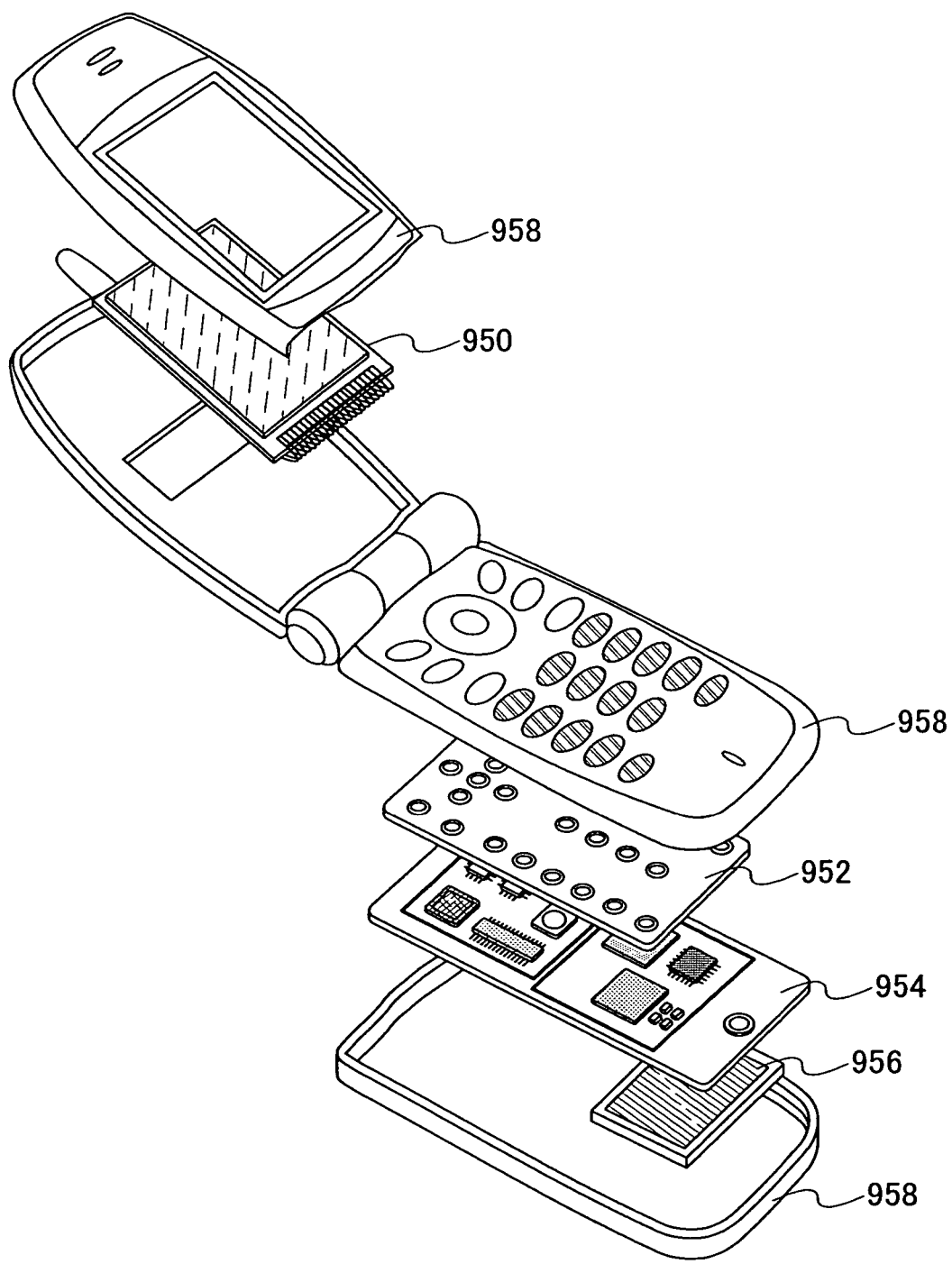
FIG. 36 shows a view for explaining a structure of a cellular phone according to Embodiment Mode 17.

FIG. 36 shows an assembly view of a cellular phone. In the cellular phone, a chassis 958 includes a module 950, a key input switch 952, a circuit board 954, a secondary battery 956, and the like. As shown in FIG. 36, cutting is performed to the chassis 958 corresponding to a position of a display portion in placing the module 950. In addition, an IC chip or a sensor chip is mounted on the module 950.

Figure 37:
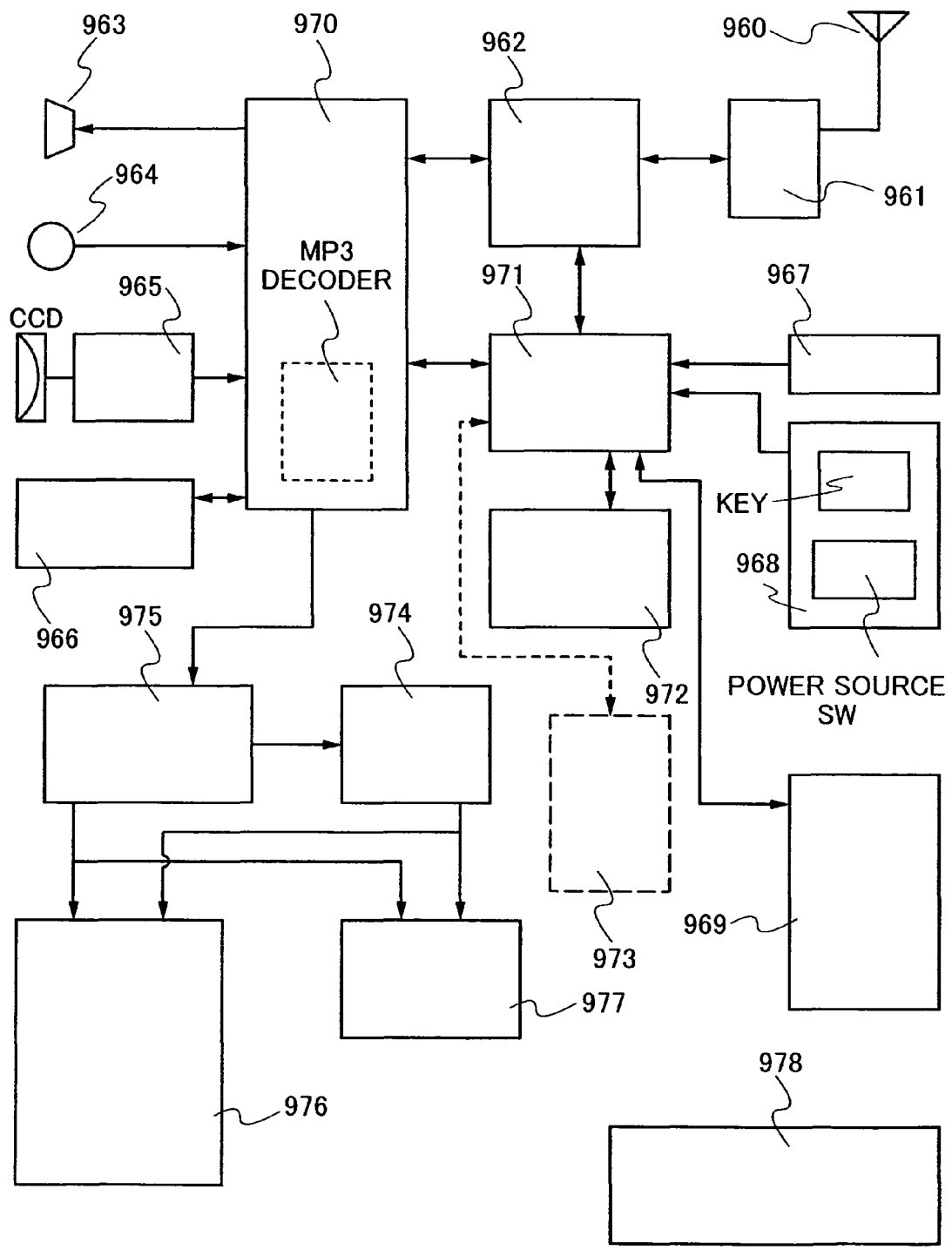
FIG. 37 shows a view for explaining a structure of a cellular phone according to Embodiment Mode 17.

FIG. 37 shows an example of a system configuration of such a cellular phone. An antenna 960, a high frequency circuit 961, a base band processor 962, and the like include a communication circuit, a modulation circuit, a demodulation circuit, or the like for performing wireless communication at 700 to 900 MHz band, and 1.7 to 2.5 GHz. An audio and image processor 970 communicates with a CPU 971 to transmit a video signal or the like to a controller 975, and in addition, controls a power supply circuit 974, outputs sound to a speaker 963, inputs sound from a microphone 964, processes image data transmitted from a CCD module 965, and the like. This image data may be stored in a memory card via an auxiliary memory input interface 966 (a memory card). The controller 975 transmits signals to a (main) display panel 976 and a (sub) display panel 977 and also switches a display.

The CPU 971 controls the audio and image processor 970 by receiving a signal from an optical sensor 967 that detects outside light intensity and a key input switch 968. In addition, the CPU 971 controls communication using a local area network via a communication interface 969 (input and output IF (LAN/IR communication/USB/Bluetooth)). A memory 972 is provided to store information such as a phone number or a sent/received e-mail. Moreover, a memory medium 973 such as a hard disc may be added in order to increase storage capacity. A power supply circuit 978 supplies electric power to these systems.

It is to be noted that FIG. 36 shows an external appearance shape of the cellular phone as an example, and a cellular phone relating to this embodiment mode can be modified in various modes in accordance with its function or use application.

As described above, a cellular phone is exemplified in this embodiment mode; however, the present invention is not limited thereto, and various electronic devices provided with a module such as a computer and a video camera can be realized. For example, an electronic book, a portable information terminal (such as PDA (personal digital assistant)), a portable video game machine, a home video game machine, a navigation system, or the like is given.

This application is based on Japanese Patent Application serial no. 2005-298879 filed in Japan Patent Office on Oct. 13, 2005, the entire contents of which are hereby incorporated by reference.

What is claimed is:

1. A method for manufacturing a light-emitting device comprising the steps of:
supplying an evaporation material in powder form and a carrier gas simultaneously from a material supply source to a cell provided in an evaporation source through a material supply portion; and
evaporating the supplied evaporation material under a reduced pressure in an evaporation chamber by heating the supplied evaporation material with a heating unit provided inside the cell,
wherein the material supply source is provided in the evaporation chamber,
wherein the heating unit comprises a first heater and a hot plate which surrounds the first heater, and
wherein the evaporation is performed by rotating the hot plate.

2. The method according to claim 1,
wherein the reduced pressure is maintained in the evaporation chamber when the evaporation material is supplied.

3. The method according to claim 1,
wherein the evaporation source comprises a second heater which is provided outside the cell and inside the evaporation chamber, and
wherein the second heater is capable of heating the cell.

4. The method according to claim 1,
wherein, during the supply of the evaporation material, the material supply portion is heated with a third heater provided to the material supply portion.

5. A method for manufacturing a light-emitting device comprising the steps of:
supplying an evaporation material to a cell provided in an evaporation source by diffusing the evaporation material in powder form from a material supply source through a material supply portion by using a carrier gas; and
evaporating the supplied evaporation material under a reduced pressure in an evaporation chamber by heating the supplied evaporation material with a heating unit provided inside the cell,
wherein the material supply source is provided in the evaporation chamber,
wherein the heating unit comprises a first heater and a hot plate which surrounds the first heater, and
wherein the evaporation is performed by rotating the hot plate.

6. The method according to claim 5,
wherein the reduced pressure is maintained in the evaporation chamber when the evaporation material is supplied.

7. The method according to claim 5,
wherein the evaporation source comprises a second heater which is provided outside the cell and inside the evaporation chamber, and
wherein the second heater is capable of heating the cell.

8. The method according to claim 5,
wherein, during the supply of the evaporation material, the material supply portion is heated with a third heater provided to the material supply portion.

* * * * *